United States Patent
Reedy et al.

(10) Patent No.: US 9,806,694 B2
(45) Date of Patent: *Oct. 31, 2017

(54) METHODS AND APPARATUSES FOR USE IN TUNING REACTANCE IN A CIRCUIT DEVICE

(71) Applicant: Peregrine Semiconductor Corporation, San Diego, CA (US)

(72) Inventors: Ronald Eugene Reedy, San Diego, CA (US); Dan William Nobbe, Crystal Lake, IL (US); Tero Tapio Ranta, San Diego, CA (US); Cheryl V. Liss, Merrimack, NH (US); David Kovac, Arlington Heights, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/883,512

(22) Filed: Oct. 14, 2015

(65) Prior Publication Data
US 2016/0191019 A1    Jun. 30, 2016

Related U.S. Application Data

(63) Continuation of application No. 13/595,893, filed on Aug. 27, 2012, now Pat. No. 9,197,194, which is a
(Continued)

(51) Int. Cl.
*H03H 11/28* (2006.01)
*H03M 1/10* (2006.01)
(Continued)

(52) U.S. Cl.
CPC ............ *H03H 11/28* (2013.01); *H01F 21/12* (2013.01); *H01G 7/00* (2013.01); *H01L 23/5223* (2013.01);
(Continued)

(58) Field of Classification Search
CPC . H03H 11/28; H03H 11/30; H03J 3/20; H01F 21/12
(Continued)

(56) References Cited

U.S. PATENT DOCUMENTS 4,564,843 A * 1/1986 Cooper .................. H03J 5/246
334/56
4,701,732 A * 10/1987 Nestlerode .............. H03J 5/244
327/434
(Continued)

FOREIGN PATENT DOCUMENTS

EP   2140494    6/2017
JP   5860857    12/2015

OTHER PUBLICATIONS

Patel, Reema, Office Action received from the USPTO dated Mar. 14, 2017 for U.S. Appl. No. 15/061,909, 7 pgs.
(Continued)

*Primary Examiner* — Rexford Barnie
*Assistant Examiner* — Terrence Willoughby
(74) *Attorney, Agent, or Firm* — Jaquez Land Greenhaus LLP; Martin J. Jaquez, Esq.; Alessandro Steinfl, Esq.

(57) ABSTRACT

Methods and apparatuses for use in tuning reactance are described. Open loop and closed loop control for tuning of reactances are also described. Tunable inductors and/or tunable capacitors may be used in filters, resonant circuits, matching networks, and phase shifters. Ability to control inductance and/or capacitance in a circuit leads to flexibility in operation of the circuit, since the circuit may be tuned to operate under a range of different operating frequencies.

46 Claims, 30 Drawing Sheets

Related U.S. Application Data continuation-in-part of application No. 12/735,954, filed as application No. PCT/US2009/001358 on Mar. 2, 2009, now Pat. No. 9,024,700.

(60) Provisional application No. 61/067,634, filed on Feb. 28, 2008.

(51) Int. Cl.

| | |
|---|---|
| *H03K 17/16* | (2006.01) |
| *H03K 17/687* | (2006.01) |
| *H01G 7/00* | (2006.01) |
| *H03H 7/38* | (2006.01) |
| *H01F 21/12* | (2006.01) |
| *H03H 7/01* | (2006.01) |
| *H01L 23/522* | (2006.01) |
| *H01L 27/06* | (2006.01) |
| *H01L 27/12* | (2006.01) |
| *H01L 49/02* | (2006.01) |
| *H03J 3/20* | (2006.01) |
| *H03M 1/80* | (2006.01) |

(52) U.S. Cl.
CPC ...... *H01L 27/0629* (2013.01); *H01L 27/1203* (2013.01); *H01L 28/60* (2013.01); *H03H 7/0153* (2013.01); *H03H 7/38* (2013.01); *H03J 3/20* (2013.01); *H03K 17/162* (2013.01); *H03K 17/687* (2013.01); *H03M 1/1061* (2013.01); *H03J 2200/10* (2013.01); *H03M 1/804* (2013.01)

(58) Field of Classification Search
USPC .......................................................... 307/98
See application file for complete search history.

(56) References Cited

U.S. PATENT DOCUMENTS

| | | | | |
|---|---|---|---|---|
| 5,812,066 | A * | 9/1998 | Terk | H01Q 9/145 340/12.17 |
| 6,013,958 | A | 1/2000 | Aytur | |
| 6,163,238 | A * | 12/2000 | Nestlerode | H01F 17/06 333/32 |
| 6,804,502 | B2 | 10/2004 | Burgener et al. | |
| 6,992,543 | B2 * | 1/2006 | Luetzelschwab | H03F 1/56 330/195 |
| 7,190,933 | B2 | 3/2007 | De Ruijter et al. | |
| 7,310,215 | B2 | 12/2007 | Pasternak | |
| 7,714,676 | B2 | 5/2010 | McKinzie, III | |
| 7,847,642 | B2 | 12/2010 | Pretl | |
| 7,960,772 | B2 | 6/2011 | Englekirk | |
| 8,638,159 | B2 | 1/2014 | Ranta et al. | |
| 8,803,631 | B2 | 8/2014 | Manssen et al. | |
| 8,847,666 | B2 | 9/2014 | Chih-Sheng | |
| 9,177,737 | B2 | 11/2015 | Englekirk | |
| 9,197,194 | B2 | 11/2015 | Reedy et al. | |
| 9,293,262 | B2 | 3/2016 | Bawell et al. | |
| 9,496,849 | B2 | 11/2016 | Ranta et al. | |
| 9,595,956 | B2 | 3/2017 | Englekirk | |
| 9,667,227 | B2 | 5/2017 | Ranta | |
| 2006/0009164 | A1 | 1/2006 | Kataoka | |
| 2006/0255852 | A1 | 11/2006 | O'Donnell et al. | |
| 2008/0106349 | A1 | 5/2008 | McKinzie | |
| 2008/0265978 | A1 * | 10/2008 | Englekirk | H03K 17/102 327/427 |
| 2013/0222075 | A1 | 8/2013 | Reedy et al. | |
| 2016/0191039 | A1 | 6/2016 | Ranta et al. | |
| 2016/0191050 | A1 | 6/2016 | Englekirk | |
| 2017/0026035 | A1 | 1/2017 | Englekirk | |

OTHER PUBLICATIONS

Englekirk, Robert Mark, Response filed in the USPTO dated Mar. 24, 2017 for U.S. Appl. No. 15/061,909, 3 pgs.
Dang, Hung Q., Office Action received from the USPTO dated Oct. 14, 2016 for U.S. Appl. No. 14/638,917, 19 pgs.
Patel, Reema, Notice of Allowance received from the USPTO dated Nov. 2, 2016 for U.S. Appl. No. 14/883,122, 14 pgs.
Ranta, et al., Response filed in the USPTO dated Nov. 7, 2016 for U.S. Appl. No. 14/814,404, 8 pgs.
Ranta, et al., Response filed in the USPTO dated Feb. 24, 2017 for U.S. Appl. No. 14/814,404, 4 pgs.
Dang, Hung, Notice of Allowance received from the USPTO dated Feb. 13, 2016 for U.S. Appl. No. 14/638,917, 13 pgs.
Ranta, Tero Tapia, Response filed in the USPTO dated Jan. 16, 2017 for U.S. Appl. No. 14/638,917, 12 pgs.
Puentes, Daniel Clarissian, Office Action received from the USPTO dated Feb. 1, 2017 for U.S. Appl. No. 14/814,404, 13 pgs.
Brosa, Anna-Maria, Communication pursuant to Article 94(3) EPC received from the EPO dated Mar. 20, 2017 for appln. No. 14165804.7, 6 pgs.
Meulemans, et al., Communication under Rule 71(3) EPC received from the EPO dated Dec. 13, 2016 for appln. No. 07794407.2, 33 pgs.
Meulemans, et al., Communication under Rule 71(3) EPC received from the EPO dated Dec. 13, 2016 for appln. No. 09174085.2, 30 pgs.
Tadashige, Itoh, et al, Office Action and English translation received from the JPO dated Feb. 7, 2017 for appln. No. 2015-225020, 10 pgs.
Ranta, et al., Response filed in the USPTO dated Nov. 6, 2015 for U.S. Appl. No. 14/165,422, 2 pgs.
Ranta, et al., Response filed in the USPTO dated Apr. 11, 2016 for U.S. Appl. No. 14/165,422, 5 pgs.
Le, Dinh Thanh, Office Action received from the USPTO dated Jan. 11, 2016 for U.S. Appl. No. 14/165,422, 47 pgs.
Wong, Alan, Notice of Allowance received from the USPTO dated Dec. 18, 2015 for U.S. Appl. No. 13/586,738, 21 pgs.
Puentes, Daniel Calrissian, Office Action received from the USPTO dated May 10, 2016 for U.S. Appl. No. 14/814,404, 8 pgs.
Patel, Reema, Office Action received from the USPTO dated Jun. 22, 2016 for U.S. Appl. No. 14/883,122, 8 pgs.
Le, Dinh Thanh, Notice of Allowance received from the USPTO dated Jun. 29, 2016 for U.S. Appl. No. 14/165,422, 24 pgs.
Wong, Alan, Office Action received from the USPTO dated Sep. 12, 2015 for U.S. Appl. No. 13/595,893, 11 pgs.
Wong, Alan, Final Office Action received from the USPTO dated Mar. 4, 2015 for U.S. Appl. No. 13/595,893, 33 pgs.
Wong, Alan, Advisory Action received from the USPTO dated Apr. 23, 2015 for U.S. Appl. No. 13/595,893, 4 pgs.
Wong, Alan, Applicant-Initiated Interview Summary received from the USPTO dated May 7, 2015 for U.S. Appl. No. 13/595,893, 4 pgs.
Wong, Alan, Notice of Allowance received from the USPTO dated Aug. 17, 2015 for U.S. Appl. No. 13/595,893, 12 pgs.
Reedy, et al., Comments on Examiner's Statement of Reasons for Allowance filed in the USPTO dated Oct. 6, 2015 for U.S. Appl. No. 13/595,893, 4 pgs.
Reedy, et al., Response filed in the USPTO dated Dec. 12, 2014 for U.S. Appl. No. 13/595,893, 24 pgs.
Reedy, et al., Submission with RCE Under 37 CFR 1.114 filed in the USPTO dated Jul. 6, 2015 for U.S. Appl. No. 13/595,893, 34 pgs.
Puentes, Daniel Calrissian, Notice of Allowance received from the USPTO dated May 3, 2017 for U.S. Appl. No. 14/814,404, 29 pgs.
Patel, Reema, Office Action received from the USPTO dated Jul. 3, 2017 for U.S. Appl. No. 15/061,909, 39 pgs.
Peregrine Semiconductor Corporation, Response filed in the EPO dated Jul. 28, 2017 for U.S. Appl. No. EP14165804.7, 15 pgs.
Englekirk, Robert Mark, Response filed in the USPTO dated Aug. 7, 2017 for U.S. Appl. No. 15/061,909, 11 pgs.

* cited by examiner

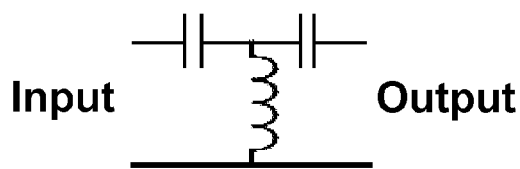
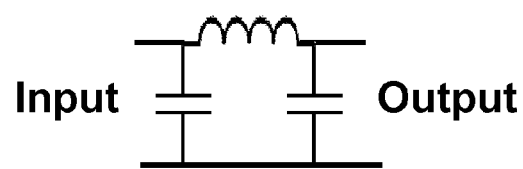
FIG. 1A
FIG. 1B
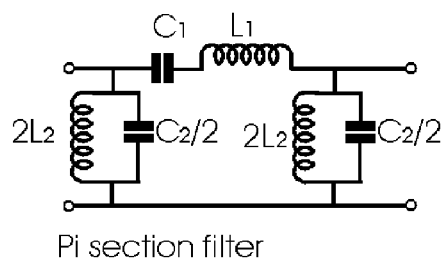
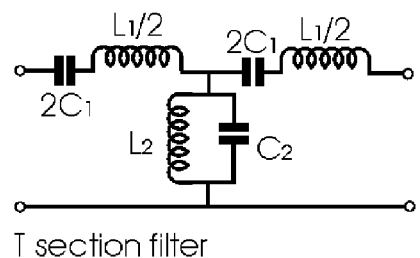
Pi section filter
T section filter
FIG. 1C
FIG. 1D
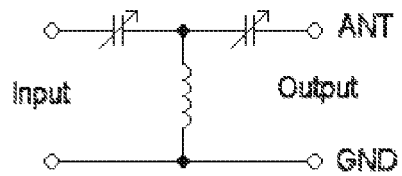
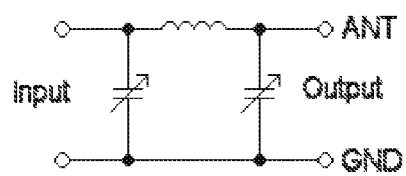
FIG. 2A
FIG. 2B
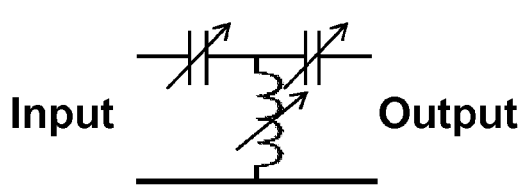
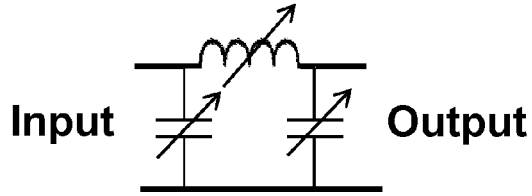
FIG. 3A
FIG. 3B
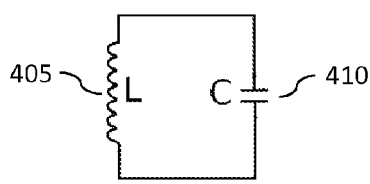
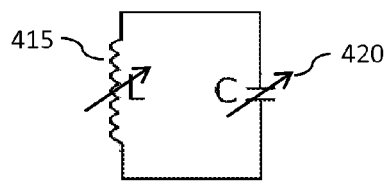
FIG. 4A
FIG. 4B

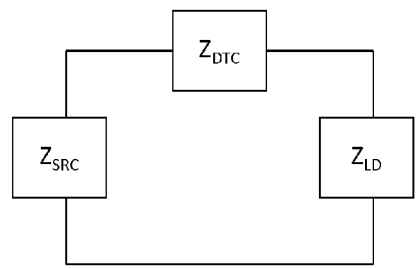 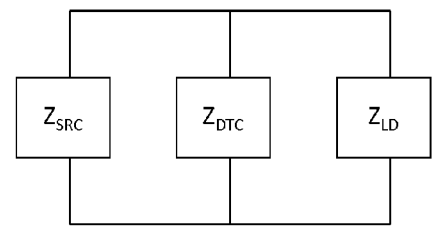
FIG. 9A FIG. 9B
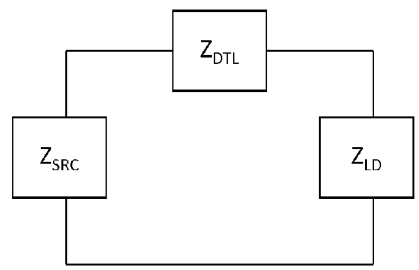 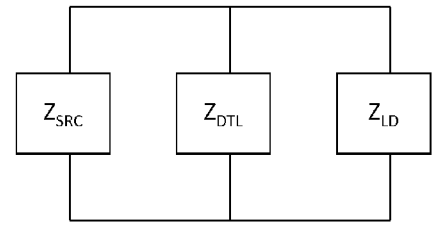
FIG. 10A FIG. 10B

METHODS AND APPARATUSES FOR USE IN TUNING REACTANCE IN A CIRCUIT DEVICE

CROSS REFERENCE TO RELATED APPLICATIONS-CLAIMS OF PRIORITY

The present application is a continuation of co-pending U.S. patent Ser. No. 13/595,893 filed on Aug. 27, 2012 and claims priority thereto; application Ser. No. 13/595,893 is a continuation-in-part of U.S. patent application Ser. No. 12/735,954 filed on Aug. 27, 2010 (now U.S. Pat. No. 9,024,700, issued May 5, 2015), and the present continuation application claims priority thereto; Both application Ser. Nos. 13/595,893 and 12/735,954 are incorporated herein by reference in their entirety; application Ser. No. 12/735,954 is a 371 National Stage Entry of PCT Patent International Application No. PCT/US09/01358 filed on Mar. 2, 2009, entitled "Method and Apparatus for use in Digitally Tuning a Capacitor in an Integrated Circuit Device", and the present continuation application claims priority thereto, which PCT Application No. PCT/US09/01358 claims the benefit under 35 U.S.C. section 119(e) of provisional Application No. 61/067,634 filed Feb. 28, 2008, and the present continuation application claims priority to 61/067,634.

FIELD

The disclosure relates generally to electronic circuits. More specifically, it relates to methods and apparatuses for use in tuning reactance in a circuit device.

BACKGROUND

Resistors, capacitors, and inductors are passive elements commonly used in implementing electronic circuits. Resistors absorb electrical energy while capacitors and inductors store electrical energy. Inductors store their energy with current while capacitors store their energy with voltage. Energy storage is found in many electrical systems, including power transformers and antennas.

In addition to energy storage, both inductors and capacitors may shift phase angle of an RF signal. Ability to control phase angles allows for impressing of information onto radio waves. For instance, many RF modulation schemes and antenna designs are based on controlling phase shifts.

Combining energy storage and phase angle control characteristics enable functionality of such devices as filters, resonant tank circuits for oscillators, matching networks, and phase shifters.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 1A-1D show a high pass filter, a low pass filter, and two band pass filters, respectively.

FIG. 2A shows an implementation of a high pass filter using tunable capacitors. FIG. 2B shows an implementation of a low pass filter using tunable capacitors.

FIG. 3A shows an implementation of a high pass filter using tunable capacitors and tunable inductors. FIG. 3B shows an implementation of a low pass filter using tunable capacitors and tunable inductors.

FIG. 4A shows a tank circuit. FIG. 4B shows a tank circuit implemented with a tunable capacitor and tunable inductor.

FIG. 8A shows a tunable inductor comprising a single inductor split into portions via switches whereas FIG. 8B shows a tunable inductor comprising a spiral inductor split into portions via switches.

FIG. 9A shows a block diagram of a circuital arrangement with a tunable capacitor connected in series with a source on one side and a load on another side. FIG. 9B shows a circuital arrangement with a tunable capacitor connected in parallel with a source and a load.

FIG. 10A shows a block diagram of a circuital arrangement with a tunable inductor connected in series with a source on one side and a load on another side. FIG. 10B shows a circuital arrangement with a tunable inductor connected in parallel with a source and a load.

SUMMARY

Figure 5A:
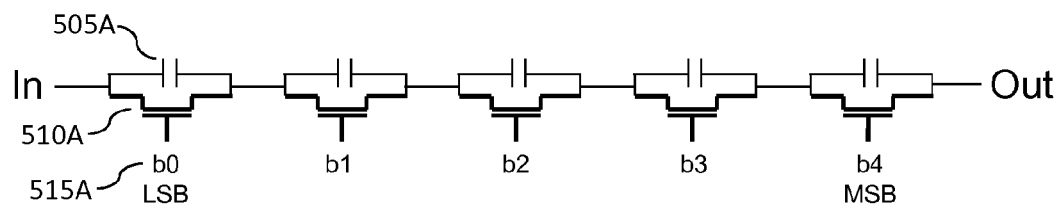
FIGS. 5A through 5D show implementations of a tunable capacitor.

According to a first aspect of the disclosure, a tunable inductor is provided, comprising: a first RF terminal; a second RF terminal; one or more inductive elements connected therebetween, wherein each inductive element is an inductor or a portion thereof; and a plurality of switches connected with the one or more inductive elements, wherein each switch in the plurality of switches is configured, during operation, to receive a control signal, the control signal controlling inductance applied between the first RF terminal and the second RF terminal by turning on or off switches in the plurality of switches, wherein at least one inductive element in the one or more inductive elements is connected with at least two switches from among the plurality of switches, the at least two switches being serially connected therebetween.

According to a second aspect of the disclosure, a circuital arrangement with a tunable impedance is provided, the circuital arrangement comprising: a first RF terminal; a second RF terminal; a fixed reactance, wherein the fixed reactance comprises a fixed inductor or a portion thereof and/or a fixed capacitor; a plurality of switches connected in parallel or series with the fixed reactance, wherein each switch in the plurality of switches is configured, during operation, to receive a control signal; and one or more individual reactances connected with the plurality of switches, wherein at least one individual reactance is connected with at least two switches from among the plurality of switches, the at least two switches being serially connected therebetween, wherein: whether impedance of a particular individual reactance among the one or more individual reactances contributes to impedance of the circuital arrangement is based on a control signal received, during operation, by a particular switch in the plurality of switches that is connected with the particular individual reactance, and the control signal associated with the particular switch turns on or off the particular switch.

According to a third aspect of the disclosure, a method for tuning inductance of a device is provided, the method comprising: providing one or more inductive elements connected therebetween, wherein each inductive element is an inductor or a portion thereof; providing a plurality of switches connected with the one or more inductive elements; and applying a plurality of control signals to the plurality of switches, wherein each control signal turns on or off one or more switches in the plurality of switches, thus tuning the inductance of the device, wherein: whether a particular inductive element in the one or more inductive elements contributes to inductance of the device is based on a control signal received by a particular switch in the plurality of switches that is connected with the particular inductive element, and at least one inductive element in the one or more inductive elements is connected with at least two switches from among the plurality of switches, the at least two switches being serially connected therebetween.

According to a fourth aspect of the disclosure, a method for tuning impedance of a device is provided, the method comprising: providing a fixed reactance, wherein the fixed reactance comprises a fixed inductor or a portion thereof and/or a fixed capacitor; providing a plurality of switches connected in parallel or series with the fixed reactance; providing one or more individual reactances connected with the plurality of switches; and applying a plurality of control signals to the plurality of switches, wherein each control signal turns on or off one or more switches in the plurality of switches, thus tuning the impedance of the device, wherein: whether impedance of a particular individual reactance among the one or more individual reactances contributes to impedance of the device is based on a control signal received by a particular switch in the plurality of switches that is connected with the particular individual reactance, and at least one individual reactance is connected with at least two switches from among the plurality of switches, the at least two switches being serially connected therebetween.

According to a fifth aspect of the disclosure, a system for tuning impedance to generate a target signal is provided, the system comprising: a tunable element configured, during operation, to receive a first signal and generate a second signal; and a controller configured, during operation, to provide a plurality of control signals to the tunable element, wherein impedance of the tunable element is a function of the plurality of control signals and the plurality of control signals is a function of the second signal and the target signal.

According to a sixth aspect of the disclosure, a method for tuning impedance to generate a target signal is provided, the method comprising: providing a tunable element; applying a first signal and a plurality of control signals to the tunable element, wherein impedance of the tunable element is a function of the plurality of control signals; generating a second signal based on the applying; and adjusting the plurality of control signals based on the second signal and the target signal.

Further embodiments are provided in the specification, drawings, and claims of the present application.

DETAILED DESCRIPTION

As used herein, the term "tunable" can be used interchangeably with the terms "adjustable", "variable", and "programmable". The term "digitally tuned/tunable" used in "digitally tuned/tunable reactance" (DTX) refers to tuning (varying) of capacitor and/or inductor values in discrete increments. For example, a digitally tuned/tunable inductor (DTL) can be implemented such that its possible inductance values are L through nL in steps of L (i.e., the digitally tuned inductor can have inductance values of L, 2L, 3L, . . . , (n−1)L, and nL). In another example, such as a multi-band radio comprising a DTL, inductance values are not necessarily equally spaced and/or do not bear a binary relationship to each other, but are chosen to meet any given system requirements.

Consequently, as used herein, the terms "digitally tunable capacitor" (DTC), "tunable capacitor", and "tunable capacitance" can be used interchangeably while the terms "digitally tunable inductor", "tunable inductor", and "tunable inductance" can be used interchangeably. Similarly, the terms "digitally tunable reactance" and "tunable reactance" can be used interchangeably.

According to many embodiments of the present disclosure, a tunable reactance can be implemented on a single, monolithic substrate such as silicon on insulator (SOI) or silicon on sapphire (SOS). With an SOI or SOS structure, high quality factor (Q) passive devices such as inductors and capacitors can be implemented monolithically with one or more high power and voltage handling switches. These devices can operate in combination with control logic/circuitry to form a tunable reactance. Furthermore, for system control, whether open or closed loop, control sensors (such as directional couplers), feedback, and signal processing can be implemented on a single chip. In an SOS structure, underlying substrate generally has low loss to RF signals while in an SOI structure, use of high resistivity substrates (e.g., near or above 1 kΩ-cm) can provide higher Q and improved performance when operated at frequencies at which higher RF losses would have been encountered in lower resistivity substrates.

According to many embodiments of the present disclosure, a tunable reactance can be implemented through connections between passive elements (capacitors and/or inductors) and switching devices. Depending on state (i.e., on or off) of each switching device in the tunable reactance, reactance of the tunable reactance can be tuned. The on or off nature of such control of the reactance can lead to better performance, notably in terms of Q value and signal linearity. Control of the states of the switching devices can be performed via signals applied to the switching devices by a controller. The controller is generally a digital device, such as a microprocessor or a digital signal processor. For the purposes of discussion, the switching devices will be assumed to be field effect transistors (FETs) such as metal-oxide-semiconductor field effect transistors (MOSFETs). However, the present disclosure can also utilize other switching devices such as an accumulated charge control field effect transistor, microelectromechanical system (MEMS) switches, diodes, diode connected bipolar junction transistors (BJTs), and other switching devices identifiable by a person skilled in the art.

Exemplary references pertaining to accumulated charge control field effect transistors are U.S. Pat. No. 7,910,993, issued Mar. 22, 2011, and U.S. Pat. No. 8,129,787, issued on Mar. 6, 2012, both of which are entitled "Method and Apparatus for use in Improving Linearity of MOSFETs Using an Accumulated Charge Sink", and pending U.S. patent application Ser. No. 13/277,108, filed on Oct. 19, 2011, and Ser. No. 13/412,529, filed on Mar. 5, 2012. Disclosures in each of U.S. Pat. Nos. 7,910,993 and 8,129,787 as well as pending U.S. patent application Ser. Nos. 13/277,108 and 13/412,529 are incorporated herein by reference in its entirety.

One way of implementing tunable capacitors is by adjusting alignment of plates (e.g., sliding one plate past another) that form the tunable capacitors. One way of implementing tunable inductors is by sliding magnetic material in and out of a wire wound inductor. Although such an implementation of tunable inductors may be physically heavy, expensive, and mechanically unreliable, such tunable inductors may be utilized, for instance, in worldwide military communications.

It should be noted that although lumped elements (e.g., discrete resistors, capacitors, and inductors) are depicted throughout the present disclosure, the embodiments of the present disclosure to be described below can also utilize distributed elements. Specifically, resistances, capacitances, and inductances can be distributed throughout a circuital arrangement and thus can be generally measured per unit length or area (e.g., Ω/length, F/area, and H/length). For example, transmission line elements such as half-wavelength, quarter-wavelength, series and parallel stubs (open circuit or short circuit stubs), and resonant stubs can also be utilized to provide resistances and reactances to the circuital arrangement. It should be noted that the various elements (either lumped or distributed) can be on-chip or off-chip.

FIGS. 1A through 1D show implementations of basic filters. In particular, FIG. 1A shows a high pass filter, FIG. 1B shows a low pass filter, and FIGS. 1C and 1D show band pass filters. As is well known in electronics, filters may be used to pass signals that are lower (e.g., low pass filter), higher (e.g., high pass filter), or centered on a target frequency (e.g., band pass filter), while attenuating signals at other frequencies. Each of the filters shown in FIGS. 1A-1D operates by exchange of stored electrical energy between capacitors and inductors. Passband of any particular filter is a function of capacitance and inductance values.

FIGS. 2A and 2B show implementations of high pass and low pass filters, respectively, using tunable capacitors. Tunable inductors may be used instead of tunable capacitors in both implementations. FIGS. 3A and 3B show implementations of high pass and low pass filters, respectively, using both tunable capacitors and tunable inductors.

Tunable filters, such as those shown in FIGS. 2A, 2B, 3A, and 3B, may be used, for instance, in car and home radios. For example, one implementation of tunable filters is realized by moving opposing plates of capacitors contained in the tunable filters across each other, thereby changing capacitance of the capacitors. Changes to the capacitance values lead to changes in the passband of the filter, where the changes allow for passing of signals of frequencies within a desired and adjustable frequency band.

Tunable filters can comprise tunable capacitors and/or tunable inductors. For high power and high performance systems, both inductors and capacitors may be adjusted to gain optimal performance based on specified criteria. Inductors and capacitors are generally characterized by their inductance and capacitance values, respectively, size, cost, and quality (Q) factor. Some exemplary performance metrics for characterizing such systems include bandwidth, insertion loss, rejection ratio, adjacent channel rejection, rejection rate, and in band flatness or ripple. Many of these metrics are measured in dB or dB/octave.

Performance metrics used to characterize a system comprising inductors and/or capacitors are dependent on particular application of the system. For example, for a resonator, the resonator is generally characterized at least by its center frequency and Q-factor. A filter, on the other hand, can be characterized by its insertion loss, attenuation, bandwidth, and amplitude/phase distortion.

By way of background, ideal filters pass certain frequencies and stop other frequencies while, in contrast, realizable filters are defined by a bandwidth, which is generally defined as a frequency (or frequencies in the case of band pass filters) where only half of a maximum signal amplitude is transferred to a load. Transition from passband to stopband is referred to as sharpness of the filter. The sharpness of the filter is determined by poles of a particular circuit, where a pole describes impact of an independent energy storage device on frequency response of the particular circuit. Number of poles is generally equal to the number of independent energy storage elements (e.g., capacitors and inductors).

As used in this disclosure, independent energy storage elements refer to capacitors and inductors whose current and voltage values are independent from one another in a given circuit. Specifically, the various capacitors and inductors do not couple with one another. In contrast, one example of dependent energy storage elements are capacitors and/or inductors connected in series or in parallel with each other. Another example of dependent energy storages elements is a transformer, where inductors can couple to each other and current in one inductor can induce a proportional current in another inductor.

In the case of independent energy storage elements, each pole is generally set to its own resonant frequency and decoupled/isolated at some level from the other poles. Each pole reduces signal power by half for every doubling in operating frequency (in other words, attenuation increases at a rate of 6 dB/octave). FIGS. 1A, 1B, 2A, 2B, 3A, and 3B show filters with three poles, one for each of the independent energy storage elements. Therefore, signal power decreases at a rate of 18 dB/octave in each of these filters.

Quality factor of a filter can be given as center frequency of the filter divided by bandwidth of the filter. High Q filters have a narrow bandwidth (relative to value of the center frequency) and can be utilized in narrow band applications whereas low Q filters have a broad bandwidth suitable for broadband applications. For example, a Q-factor of 3 is generally considered low and a filter with a low Q-factor can be utilized in broadband applications. Surface acoustic wave (SAW) filters, on the other hand, can have Q-factors between 100 and 1000 and thus can be utilized as very narrow band filters.

Quality factors of inductors, given by $Q=\omega L/R$, increase with increasing frequency while those of capacitors, given by $Q=1/(\omega RC)$, decrease with increasing frequency. At higher frequencies, therefore, more inductors than capacitors are generally used for filters and matching networks due to the higher Q at higher frequencies. As an example, for frequency dependent systems in general (such as filters and matching networks), systems operating at frequencies above 6 GHz (such as the C band) often employ more inductors than capacitors.

It should be noted that both capacitors and inductors can be utilized at all frequencies (in all bands), and systems generally involve use of both capacitances and inductors. For instance, both capacitors and inductors are utilized in building bandpass filters with a passband or stopband within a specified frequency range or ranges. However, more capacitors are generally employed in a system up to around 6-8 GHz due to issues such as size of capacitors (relative to inductors). By around 10 GHz, more inductors are generally employed in a system, such as in monolithic microwave integrated circuits (MMICs).

Ability to control capacitance and inductance values provides flexibility in defining performance and operation of the circuit. In addition to controlling attenuation caused by each energy storage element, phase shift due to each energy storage element may generally be controlled as well. FIGS. 3A and 3B show a tunable three-pole filter, where each energy storage element may be tuned to control filter function.

FIG. 4A shows a resonant circuit, also known as a tank circuit. The tank circuit is a band pass filter, which may find use, for instance, in various oscillator circuits that generate radio frequencies (RF) and in narrow band filtering systems to exclude frequencies both above and below a particular frequency of interest (known as an oscillation frequency or center frequency). Frequency of oscillation of the tank circuit is set by $1/(2\pi\sqrt{LC})$, where L and C are values of an inductor (405) and a capacitor (410).

In order to change the oscillation frequency, values of L and C may be changed. In general, either a tunable capacitor or a tunable inductor, or both, may be utilized in the tank circuit to improve flexibility and performance. FIG. 4B shows a resonant circuit that utilizes a tunable inductor (415) and a tunable capacitor (420). At higher frequencies, tunable inductors may be utilized due to a generally higher Q value than for tunable capacitors.

For tunable reactances, design tradeoffs exist between each of:
- frequency of operation f (or radian frequency $\omega=2\pi f$)
- reactance value C and/or L
- switch resistance in on state $R_{on}$
- switch capacitance in off state $C_{off}$
- Q-factor
- self resonant frequency SRF As will be shown later in the disclosure, according to several embodiments of the present disclosure, tunable reactances comprise an array of fixed reactances (e.g., capacitors and/or inductors) that can be switched into and out of the overall array through switching devices (e.g., transistors). In determining parameters such as impedance and Q-factor associated with the tunable reactances, parasitic loading effects of the switching devices as well as any parasitic inductances and capacitances can be taken into consideration. Switches generally are also associated with a small leakage current that can affect performance of devices (e.g., tunable reactances) that utilize the switches. In general, devices (e.g., tunable reactances) are designed such that impact of any parasitics, such as those from switches or interconnections, is taken into account.

When a switch is off, the switch can be denoted as a capacitor with capacitance $C_{off}$, which is thus referred to as an off state capacitance. When the switch is on, the switch can be denoted as a resistor with resistance $R_{on}$, which is thus referred to as an on state resistance.

As used in this disclosure, for transistors, the on state resistance $R_{on}$ of a switch is given by resistivity of the transistors (generally given in units of Ω-mm) divided by total width of the transistors that form the switch. Consequently, the on state resistance $R_{on}$ of the switch is generally measured in units of Ω. Similarly, the off state capacitance $C_{off}$ of the switch is given by multiplying capacitance of the transistors as measured generally in fF/mm by total width of the transistors that form the switch. Consequently, wider switches are associated with lower $R_{on}$ and higher $C_{off}$. Both values ($R_{on}$ and $C_{off}$) are generally considered in the design of a switch. Since higher $C_{off}$ is associated with more capacitive feedthrough, wider switches are generally associated with lower switch isolation. Wider switches are also generally associated with lower $R_{on}$ and lower insertion loss.

Values of $R_{on}$ and $C_{off}$ are generally specified based on application of a switch. Factors to be considered are frequency and/or bandwidth for which the switch is to be targeted, number of poles and throws of the switch (e.g., single-pole-eight-throw (SP8T), double-pole-twelve-throw (DP12T)), linearity specifications, area targets (e.g., based on cost targets), and so forth.

In general, design consideration is given by the product $R_{on}C_{off}$, where the product is generally minimized. Lower $R_{on}$ and $C_{off}$ are generally desired. On resistance $R_{on}$ is generally more easily controlled or taken into consideration than off capacitance $C_{off}$. An exemplary range for $R_{on}$ is to be less than 1 Ω-mm while an exemplary range for $R_{on}C_{off}$ is to be less than 280 femtoseconds. In many applications, reduction of $R_{on}C_{off}$ may be desired.

Consider tunable capacitors where FETs are used to switch in or out each capacitor element. It is noted that each capacitor element can be modeled as a capacitor in series with an equivalent series resistance (ESR) whose resistance is generally frequency dependent. As is known by one skilled in the art, the ESR can comprise resistance from one or more of dielectric, plate material, electrolytic solution, and terminal leads. Basic relationships of these tunable capacitors are given as follows:

As frequency increases, capacitor reactance/impedance and Q-factor decrease. Since impedance of a capacitor is given by $1/(\omega C)$, maintaining a constant impedance with increasing frequency involves employing smaller capacitances (generally associated with smaller capacitors). For a given Q, a frequency increase allows use of smaller capacitance values.

A sum of on resistance $R_{on}$ of the switch and ESR of the capacitor is generally lower than reactive impedance $1/(\omega C)$ of the capacitor. The sum is generally lower to keep Q, which is a ratio of reactive impedance to $R_{on}$, at a reasonable level. In general, many circuits and filters involve Q-factors of greater than 10.

Reactive impedance of the switch $1/(\omega C_{off})$ of the switch is generally lower than the reactive impedance $1/(\omega C)$ of the capacitor. The off capacitance is a parasitic capacitance, and circuits are generally designed such that parasitics (including parasitic capacitance associated with a switch) do not dominate the circuits.

Self resonant frequency (SRF) $1/(2\pi\sqrt{LC_{off}})$ of each element, where L refers to parasitic inductances, is generally higher than frequency of operation. Circuits are generally designed such that parasitics do not dominate the circuits. In general, this relationship is generally satisfied in the case that reactive impedance of the switch is lower than the reactive impedance of the capacitor.

Consider tunable inductors where FETs are used to switch in or out each inductor element. Similar to capacitor elements in tunable capacitors, each inductor element can be modeled as an inductor in series with an ESR whose resistance is generally frequency dependent. As is known by one skilled in the art, the ESR of an inductor element can comprise resistance of metal conductor used to form the inductor element. Relationships for tunable inductors are given as follows:

As frequency increases, inductor reactance/impedance and Q-factor increase. Since impedance of an inductor is given by $\omega L$, maintaining a constant impedance with increasing frequency involves employing smaller inductance (generally associated with smaller inductors). For a given Q, a frequency increase allows use of smaller inductance values.

A sum of on resistance $R_{on}$ of the switch and ESR of the inductor is generally lower than reactive impedance $\omega L$ of the inductor. The sum is generally lower to keep Q, which is a ratio of reactive impedance to $R_{on}$, at a reasonable level. In general, many circuits and filters involve Q-factors of greater than 10.

Reactive impedance of the switch $1/(\omega C_{off})$ of the switch is generally larger than the reactive impedance $\omega L$ of the inductor. The off capacitance is a parasitic capacitance, and circuits are generally designed such that parasitics do not dominate the circuits.

Self resonant frequency (SRF) $1/(2\pi\sqrt{LC_{off}})$ of each element, where L refers to parasitic inductances, is generally higher than frequency of operation. Circuits are generally designed such that parasitics do not dominate the circuits. In general, this relationship is generally satisfied in the case that reactive impedance of the switch is larger than the reactive impedance of the inductor.

FIGS. 5A-5D show implementations of a tunable capacitor. The tunable capacitor shown in each of FIGS. 5A-5D comprises an array of fixed capacitors that can be switched into or out of the overall array in order to obtain adjustment of capacitance value of the tunable capacitor.

FIG. 5A shows an example of a five bit tunable capacitor created by opening or closing switches, where each switch (510A) is connected in parallel with a capacitor (505A). In this embodiment, five capacitor and switch arrangements are connected in series, and each switch in the arrangement is configured to receive a control voltage (515A). Each capacitor and switch arrangement in FIG. 5A operates in one of two states. When the switch (510A) is closed, the capacitor (505A) corresponding to the switch (510A) will be shorted out due to a low resistance shunt path of the switch (510A) and thus the capacitor will not contribute to capacitance of the tunable capacitor. When the switch (510A) is open, current will pass through the capacitor (505A) corresponding to the open switch (510A) and thus the capacitor (505A) will contribute to capacitance of the tunable capacitor.

Figure 5B:
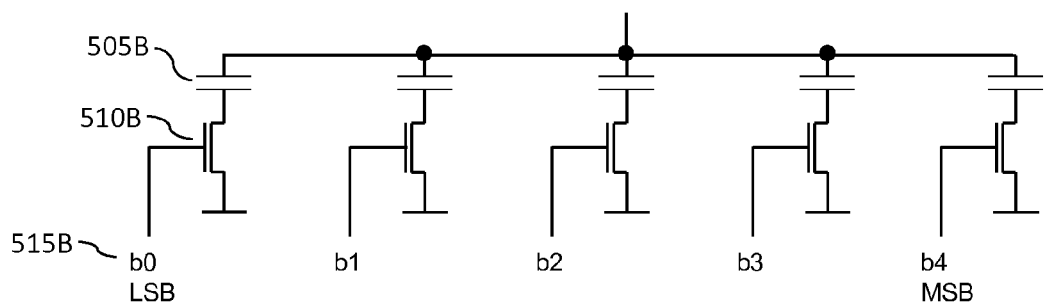

FIG. 5B shows an example of a five bit tunable capacitor created by opening or closing switches, where each switch (510B) is serially connected to a capacitor (505B). In this embodiment, five capacitor and switch arrangements are connected in parallel, and each switch in the arrangement is configured to receive a control voltage (515B). Each capacitor and switch arrangement in FIG. 5B operates in one of two states. When the switch (510B) is closed, current will pass through the capacitor (505B) and thus the capacitor (505B) will contribute to the capacitance of the tunable capacitor. When the switch (510B) is open, no current will pass through the capacitor (505) corresponding to the open switch (510B) and thus the capacitor (505B) will not contribute to capacitance of the tunable capacitor.

An exemplary tunable capacitor can be developed to provide a capacitance between minimum and maximum of 1-5 pF or 1-10 pF with 31 steps at a frequency of about 1-2 GHz. Although each capacitor element in the tunable capacitor has a Q-factor of around 200, series resistance of switches in the tunable capacitor can yield an overall Q-factor of around 50 for the tunable capacitor. Other capacitance ranges and Q-factors can be developed depending on application (e.g., frequency response required in a particular application). For instance, while a cellular phone may have a tunable capacitance range of 1-5 pF, the tunable range may be adjusted to take into consideration impedance of an antenna, a fixed matching network, power amplifier, and various other components. An exemplary reference that discloses tunable capacitors is U.S. patent application Ser. No. 12/735,954 filed on Aug. 27, 2010, which is incorporated herein by reference in its entirety.

As used herein, a "unit Q-factor" is the Q-factor associated with an individual element (e.g., capacitor or inductor) whereas a "bank Q-factor" is the Q-factor associated with a circuital arrangement of elements (e.g., tunable capacitor or tunable inductor).

Figure 5C:
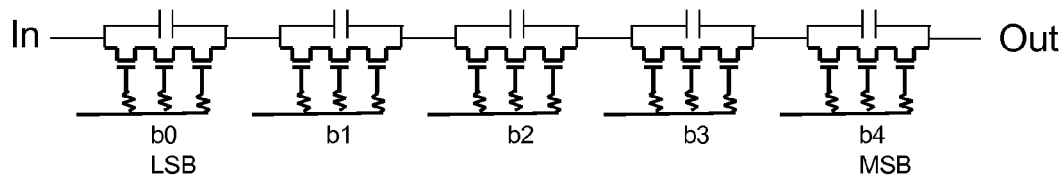
Figure 5D:
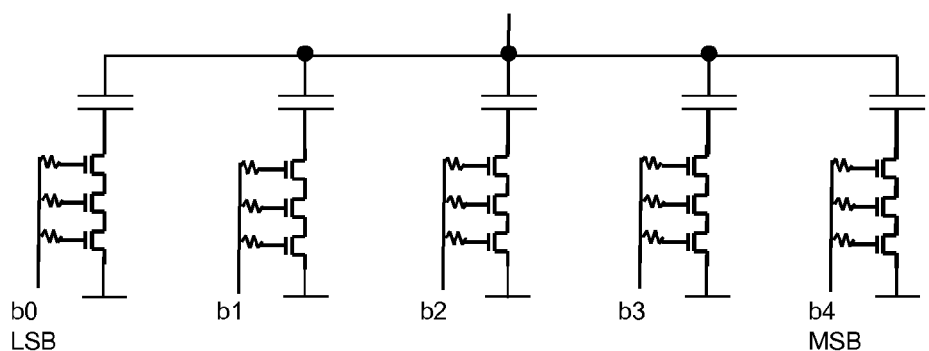

It should be noted that although FIGS. 5A and 5B show one switching arrangement (e.g., 510A) connected with each capacitor (e.g., 505A), each bit of the tunable capacitor can comprise a plurality of capacitors and/or a plurality of switches. The plurality of switches can be serially connected, and the control signal (e.g., 515A) can be applied to each switch in the plurality of switches. The plurality of switches can be referred to as a stack of switches and can be, for instance, a plurality of transistors connected drain to source. Such stacking can be utilized to increase maximum amount of voltage that can be applied to and handled by the tunable capacitor. FIGS. 5C and 5D show examples of five bit tunable capacitors, where each capacitor is connected with a plurality of serially connected switches.

Consider a stack of transistors. Reliability considerations of transistors affect maximum amount of voltage, also referred to as a breakdown voltage or withstand voltage, that can be placed from drain to source of any particular transistor. Specifically, above the withstand voltage, the transistors used in implementing a system can break down, leaving the system unable to accomplish an intended purpose. A transistor stack, where two or more transistors are serially connected, can be utilized to allow the serially connected transistors to share a voltage applied to the transistor stack. For example, if each transistor has a withstand voltage of around 3 V, then a stack of five transistors would ideally be expected to have a withstand voltage of around 15 V. Consequently, a higher number of stacked transistors can be used in systems that involve higher voltages in order to withstand these higher voltages. Losses in the transistors due to various parasitics, such as parasitic capacitances that conduct current in various (e.g., including undesirable) directions, would generally lead to a withstand voltage lower than the expected 15 V. In a field effect transistor, for instance, the withstand voltage of an individual FET can be increased by increasing gate length, although this leads to occupation of more area on a chip for the individual FET and also to a generally slower switching FET. Consequently, with a stack of switches, peak voltage of an applied signal, such as a radio frequency (RF) signal, can be higher since voltage of the applied signal can be shared across each switch in the stack.

Integrated inductors are generally long wires, often shaped into concentric rings to increase amount of inductance per unit area. While inductors are typically larger than capacitors, inductors may be utilized in much the same way as capacitors. Design of circuits that utilize inductors involves controlling mutual inductance and providing isolation between devices. In general, coupling between devices can be reduced through separation between devices and/or providing ground layers between devices. In particular, the controlling of mutual inductance and the providing of isolation can be accomplished through, for instance, spatial separation between the inductors and use of ground between the inductors. In a case of non-enclosed inductors, the non-enclosed inductors can be laid out orthogonal to each other. An exemplary tunable inductor can be developed to provide an inductance between a minimum and maximum of 1-10 nH at a frequency of about 1-2 GHz. Other inductance ranges and Q-factors can be developed depending on application (e.g., frequency response required in a particular application).

Figure 6A:
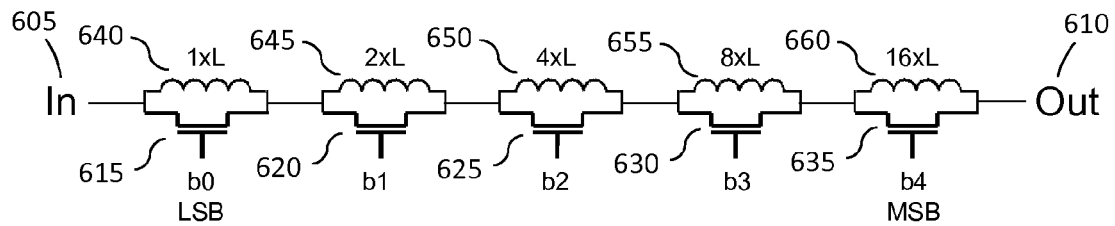
FIG. 6A shows an embodiment of a tunable inductor with serially connected inductors.

FIG. 6A shows an embodiment of a tunable inductor. The tunable inductor shown in FIG. 6A comprises an array of fixed inductors that can be switched into or out of the overall array in order to obtain adjustment of inductance value of the tunable inductor. Specifically, FIG. 6A shows a five bit tunable inductor created by opening or closing switches, where each switch (615) is parallel to a corresponding inductor (640). A signal can be applied to a first terminal (605) of the tunable inductor to generate a signal at a second terminal (610), or vice versa. As one example, one of the terminals (605, 610) can be coupled to a ground terminal. As another example, one of the terminals (605, 610) can be coupled to a load. More generally, an ungrounded terminal may be coupled, for instance, to a load, a radio frequency (RF) terminal, or to any other terminal. An example load can be, for instance, a mobile handset antenna.

In the embodiment shown in FIG. 6A, a series arrangement of inductors, each with an inductance value of twice a preceding inductor, creates a total inductance of the tunable inductor from 0×L to 31×L, in steps of L. Each inductor and switch arrangement in FIG. 6A operates in one of two states. When the switch (615) is closed, the inductor (640) corresponding to the switch (615) will be shorted out due to a low resistance shunt path of the switch (615). When the switch (615) is open, current will pass through the inductor (640).

Operation of the tunable inductor may be given by way of an example. Consider an input control word of $b_0=1$, $b_1=0$, $b_2=0$, $b_3=1$, and $b_4=0$, where each of $b_n$ can be referred to as a bit stage. A bit '0' may correspond to a voltage level of −2.5 V while a bit '1' may correspond to a voltage level of 2.5 V. Other voltages for each of the voltage levels can be utilized (e.g., a bit '0' may instead correspond to a voltage level of 0 V and/or a bit '1' may instead correspond to 3 V, and so forth). In the case of a '0' input, a switch is open and thus current passes through a corresponding inductor. In the case of a '1' input, a switch is closed and thus current does not pass through a corresponding inductor (current is shorted by the switch). Therefore, the input control word of $b_0=1$, $b_1=0$, $b_2=0$, $b_3=1$, and $b_4=0$ would yield an inductance of $L_{eq}=2L+4L+16L=22L$. Values selected for voltage levels of the bit '0' and the bit '1' as well as difference between voltages levels of the '0' and '1' bit are generally based on power handling and linearity specifications that vary depending on application in which the switches are utilized.

It should be noted that although FIG. 6A shows five inductors (640, 645, 650, 655, 660), each with a switch (615, 620, 625, 630, 635) connected in parallel, an actual implementation could be, for instance, one single large inductor essentially split into five separate inductors (640, 645, 650, 655, 660) by way of the switches (615, 620, 625, 630, 635). Each switch (615, 620, 625, 630, 635) can be placed inside or outside of the single large inductor and can control only a segment of the single large inductor. An example of such a configuration of inductors and switches will be shown later with reference to FIGS. 8A and 8B. Other implementations of the inductor are possible. Similarly, although one switch is shown for each inductor (640, 645, 650, 655, 660), a stack of switches can be tied to each inductor (640, 645, 650, 655, 660) as shown in FIG. 6C.

Figure 6B:
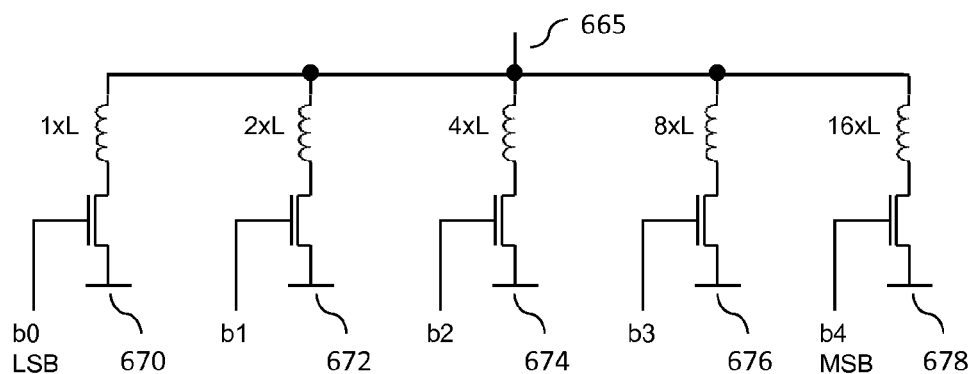
FIG. 6B shows an embodiment of a tunable inductor with inductors connected in parallel.
Figure 6C:
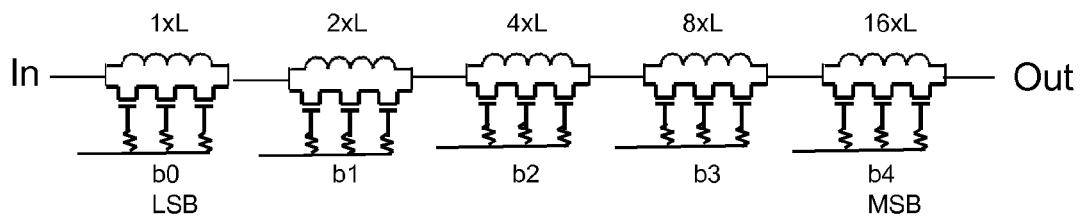
FIGS. 6C and 6D show embodiments of a tunable inductor where each inductor is connected with a plurality of switches.

FIG. 6B shows another embodiment of the tunable inductor. Specifically, FIG. 6B shows a five bit tunable inductor created by opening or closing switches, where each switch is serially connected to an inductor. A signal can be applied to a first terminal (665) of the tunable inductor to generate a signal at another terminal or terminals (670, 672, 674, 676, 678), or a signal can be applied to one or more of terminals (670, 672, 674, 676, 678) to generate a signal at the first terminal (665). In a tunable inductor, the terminals (670, 672, 674, 676, 678) are generally coupled to a common node, which can be referred to collectively as a second terminal. As one example, one of the first or second terminals can be coupled to a ground terminal. As another example, one of the first or second terminals can be coupled to a load. More generally, an ungrounded terminal may be coupled, for instance, to a load, a radio frequency (RF) terminal, or to any other terminal.

In the embodiment shown in FIG. 6B, five inductor and switch arrangements are connected in parallel, and each switch in the arrangement is adapted to receive a control voltage. Each inductor and switch arrangement in FIG. 6B operates in one of two states. When the switch is closed, current will pass through the inductor and thus the inductor will contribute to the inductance of the tunable inductor. When the switch is open, no current will pass through the inductor and thus the inductor will not contribute to inductance of the tunable inductor.

By placing inductors in parallel, as in FIG. 6B, inductance values and associated Q values are generally different than those achieved by the tunable inductor shown in FIG. 6A. One embodiment may be selected over another based on application. As with FIG. 6A, although one switch is shown for each inductor in FIG. 6B, a stack of switches can be tied to each inductor as shown in FIG. 6D.

Figure 6D:
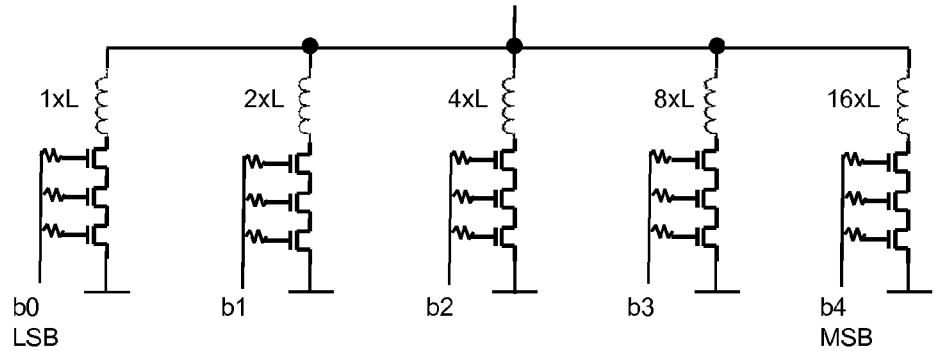

FIGS. 6C and 6D depict a stack of three switches that are in parallel with reactive elements and in series with the reactive elements, respectively. Although the reactive elements are shown as inductors, capacitors can also be utilized. Furthermore, number of switches connected with the reactive elements can vary based on application, and each transistor shown in FIGS. 6C and 6D can be a stack of transistors or any number of devices. Resistors can be tied to a control terminal of each switch (e.g., gate terminal of a FET) and aid in biasing the switch to which the resistors are tied. Utilizing the FET as a switch, the gate resistor can aid in isolating an applied signal (e.g., RF signal) on source and drain of each FET from a DC on/off control signal applied to the gate terminal, which in turn may aid in turning on/off all FETs in a stack and in realizing a desired voltage splitting between the FETs. For any particular FET, switching time of the FET is a function of product of gate resistance (of the gate resistor) and gate capacitance.

Figure 7A:
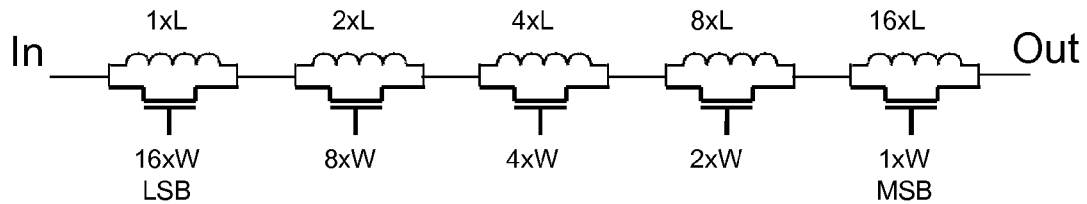
FIGS. 7A and 7B show the embodiments of FIGS. 6A and 6B, respectively, with relative switch widths and relative inductance values.
Figure 7B:
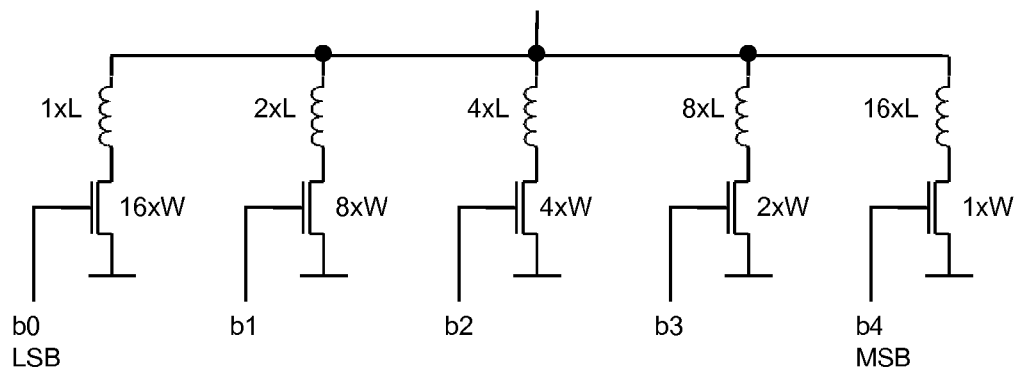

FIGS. 7A and 7B show relative FET width for each inductor for the embodiments of the tunable inductor shown in FIGS. 6A and 6B, respectively. The FET width, as used in this disclosure, refers to width of the gate of the FET. Since $Q=\omega L/R$, a decrease in inductance L requires a corresponding decrease in resistance R in order to maintain a particular Q value. Resistance of a FET switch is inversely proportional to FET width.

Figure 7C:
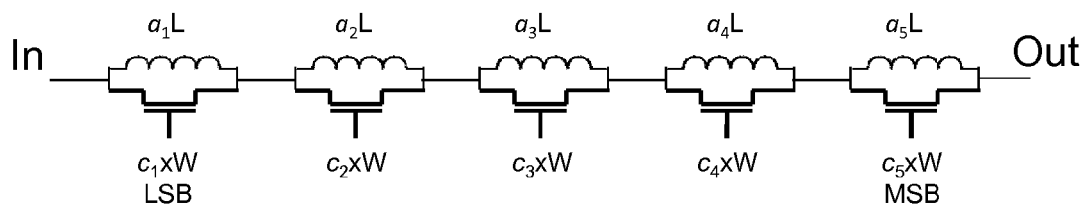
FIGS. 7C through 7I show additional examples of tunable inductors.
Figure 7D:
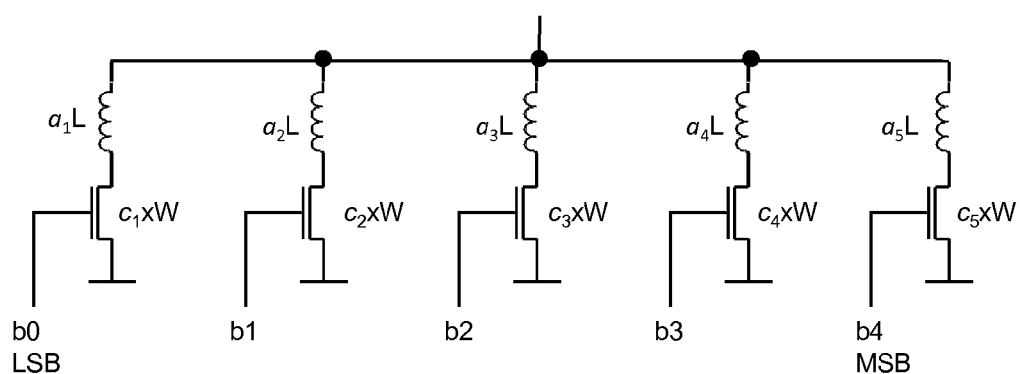
Figure 7E:
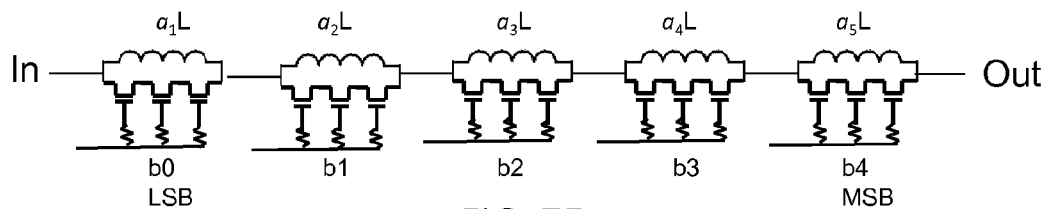
Figure 7F:
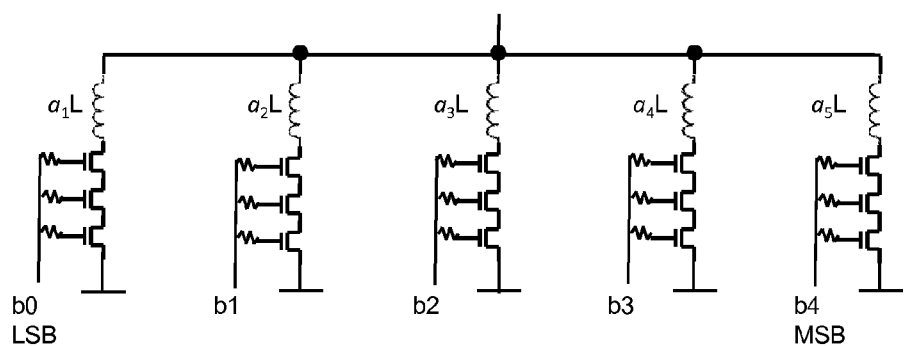

FIGS. 7C through 7F show additional examples of tunable inductors. In FIGS. 7C and 7D, each arrangement (inductor and associated switch) is associated with an inductance $\alpha_i \times L$ and switch width of $c_i \times w$, where i is an index assigned to each arrangement, L is relative inductance between the arrangements, and w is relative width between the arrangements. Each $\alpha_i$ and $c_i$ can be selected arbitrarily to obtain a tunable inductor with inductances that can be defined based on application. Similarly, FIGS. 7E and 7F show tunable inductors where each stage comprises an inductor coupled in parallel or in series with a plurality of switches, where $a_i$ is an arbitrary weight applied to inductance values.

In some embodiments, ratios are maintained between resistance value and reactance value so that Q remains approximately constant between bit stages. For inductors, $Q=\omega L/R$ and thus lower L values (smaller inductors) are associated with lower R values to keep constant Q. For capacitors, $Q=1/\omega RC$ and thus lower R is associated with higher C (larger capacitors). Tunable capacitors with larger switch widths (R is inversely proportional to switch width) generally have larger capacitors. In other embodiments, Q may not need to remain constant between bit stages.

In the case where Q remains constant between states, inductance value and switch width can be scaled by factors that are inverses of each other. With reference to FIGS. 7A and 7B, inductance values, from left to right, are L, 2L, 4L, 8L, and 16L while width of corresponding switches are 16w, 8w, 4w, 2w, and w, respectively. In the case of multiple switches being tied to each inductor, width of each of the switches can be adjusted. For example, to increase an effective width of the multiple switches by a factor of 2, the width of each of the multiple switches is adjusted such that an equivalent width of the multiple switches is twice the original effective width. One way of adjusting the widths of the multiple switches would be to double the width of each switch. Widest switches (corresponding with lowest on resistance $R_{on}$) are applied with smallest inductors. This scaling, in which each switch doubles in width relative to each preceding switch and halves in size for a corresponding doubling in inductance value, generally allows constant Q-factor over tuning range of the tunable inductor.

Although a common factor of 2 between adjacent inductor and switch pairs is utilized in the exemplary tunable inductor shown in FIGS. 7A and 7B, other factors can be used as well. For instance, to maintain constant Q-factor, inductance values can be, from left to right, 7L, 5L, 13L, L, and 2L while relative width of corresponding switches are w/7, w15, w/13, w, and w/2, respectively. The scaling of inductance value and width can be arbitrary so long as a scaling of inductance value by A is associated with a scaling of width by 1/A.

The embodiments in FIGS. 6A, 6B, 7A, and 7B show digital weighting of L (and corresponding scaling of switch width). However, other embodiments may have more or fewer serially connected inductors, where each inductor may have an inductance value of arbitrary weight relative to L and arbitrary step size of inductance values. For instance, an exponential ratio may exist between inductance values of adjacent inductors. Let a lowest inductance in the series inductance be denoted by L. Each inductor in the series inductors would have inductances L, 10L, 100L, 1000L, and so forth. Corresponding switch widths may be 1000w, 100w, 10w, and w, respectively, to allow constant Q over the tuning range of the tunable inductor.

In each of FIGS. 6A-6B and 7A-7D, each switch (e.g., 615) is associated with each inductor (e.g., 640). According to many embodiments of the present disclosure, a stack of switches may be utilized instead of the individual switch (e.g., 615) in each bit. With stacked switches, a signal (e.g., 605) that is applied to the tunable inductors can be shared among each of the switches in the stack of switches, as shown in FIGS. 6C-6D and 7E-7F. It is noted that FIGS. 6C-6D and 7E-7F depict tunable inductors where each bit comprises same number of switches in a stack. However, according to many embodiments of the present disclosure, number of switches in one stack can be different from number of switches in another stack.

Figure 7G:
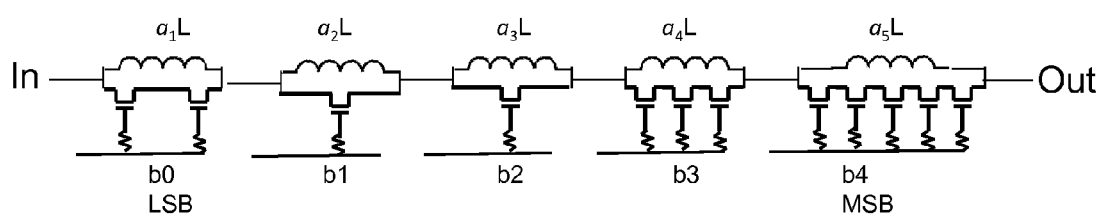
Figure 7H:
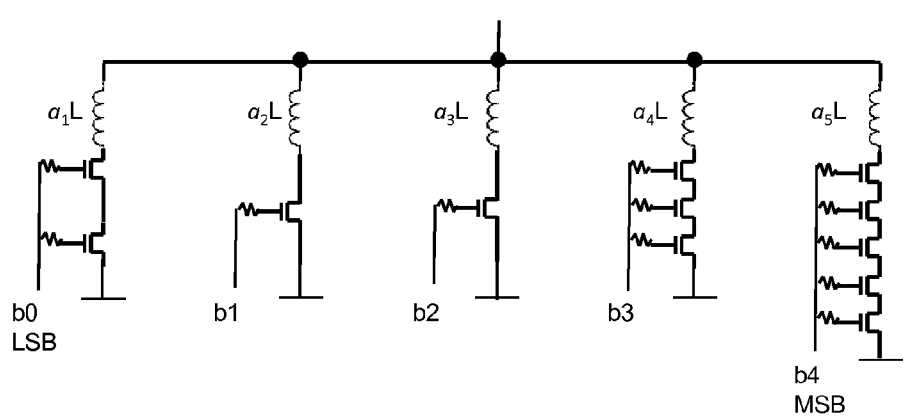

For example, with reference to configurations shown in FIGS. 7G and 7H, a zeroth bit associated with a bit stage $b_0$ can comprise two switches, a first and second bit associated with a bit stage $b_1$ and $b_2$, respectively, can each comprise a single switch, a third bit associated with a bit stage $b_3$ can comprise three switches, and a fourth bit associated with a bit stage $b_4$ can comprise five switches. More generally, number of switches associated with any particular bit can be selected based on a particular design specification and need not be a constant across the bits.

Tunable inductors can employ finer adjustments in inductance values through use of smaller factors applied to the inductance values and the widths. The inductance values can be chosen to be, by way of example and not of limitation, exponentially weighted (e.g., binary weighted can be referred to as base two exponential), linearly weighted, or arbitrarily weighted. Exponential ratio can also refer to inductances L, L×e, L×$e^2$, L×$e^e$, and so forth as well as base two exponential systems previously described and shown in FIGS. 6A-6B and 7A-7B.

The exponential ratios may be used in broadband applications involving antennas (e.g., Yagi antennas). Tunable inductors may be used in broadband matching networks, which are difficult to realize with MOSFETs since MOSFETs comprise parasitic capacitances that need to be matched with inductances, in order to allow efficient power transfer.

An exponential system with a base 2 numbering system can be utilized to realize a uniform, monotonic set of values. FIGS. 6A-6B and 7A-7B show that all integer numbers between 1 and 31 can be provided, which can be utilized to provide control of five states from a digital control system. Other logarithm systems, such as log-e and log-10 systems, can cover much larger variations in the same number of steps relative to the log-2 system. For instance, whereas five steps in a binary log-2 system cover numbers between 1 through 31, five steps in a log-e system covers 1 through $e^5$ (about 148).

Other exponential ratios or arbitrary ratios can be utilized in different applications. For example, frequency of an oscillator, given by $1/(2\pi\sqrt{LC})$, which is neither linear nor binary, can be changed in uniform steps. In such a case, a combination of different capacitance and/or inductance values may be utilized to provide an optimum solution for a particular application.

Additionally, other embodiments may have inductors arranged in parallel to each other or inductors arranged in a two-dimensional array. Further, switches may be added that bypass multiple inductors, thereby allowing higher overall Q performance but adding complexity, area, and cost. Specifically, instead of routing a signal through a series of switches, which adds to total resistance of the system and thus decreases overall Q, the signal can be provided to an output terminal via just one switch.

Figure 7I:
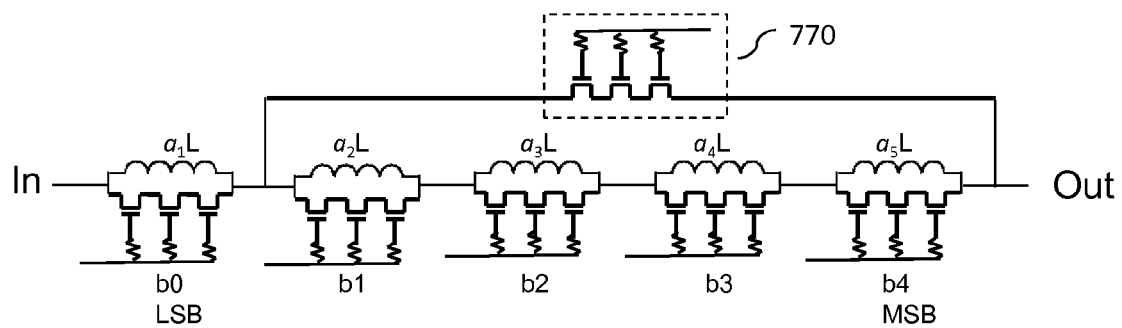

For instance, with reference to FIG. 6A, to obtain any single inductance value (e.g., say 1L (640)), the applied signal (605) also has to go through the other four switches (645, 650, 655, 660). This adds to total resistance associated with the tunable inductor and therefore drops overall Q of the tunable inductor. If it were known that the 1L state (640) should be associated with high Q, then a parallel switch can be utilized to connect the 1L state (640) directly to the output terminal (610) and bypass the other four switches (645, 650, 655, 660) in applications where the high Q associated with the 1L state (640) is desirable. An example is shown in FIG. 7I, where a bypass switching arrangement (770) can be utilized to connect the $\alpha_1$L state directly to an output terminal. Although only one bypass switching arrangement is shown in FIG. 7I, additional bypass switching arrangements can be employed.

Figure 8A:
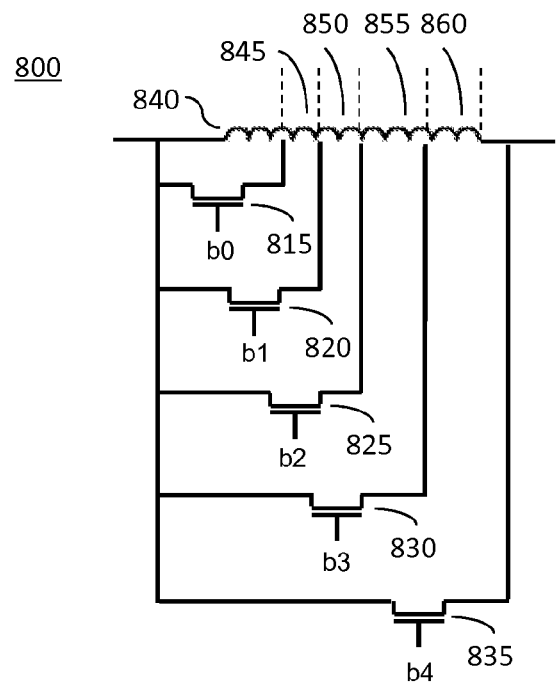
FIGS. 8A and 8B show additional embodiments of a tunable inductor. More specifically.

As previously mentioned, an actual implementation of a tunable inductor can be, for instance, one large inductor split into multiple smaller inductors. One or more of the bits, with each bit comprising an inductor connected to one or more switches, can be implemented using one or more large inductors. FIG. 8A shows another embodiment of a tunable inductor (800). Each bit comprises a switch (815, 820, 825, 830, 835) connected with a single inductor. Specifically, a switch in an on state can short out a component of the single inductor, and thus the switches (815, 820, 825, 830, 835) essentially split the single inductor into inductance portions (840, 845, 850, 855, 860). As previously discussed, one or more of the switches (815, 820, 825, 830, 835) can be replaced instead with a stack of switches (e.g., for purposes of power handling). As an example, if a zeroth switch (815) is on (thus shorting portion (840)) while the remaining switches (820, 825, 830, 835) are off, inductance portions (845, 850, 855, 860) contribute to inductance of the tunable inductor (800). As another example, if switches (815, 820, 825, 830) are off whereas a fourth switch (835) is on, the single inductor does not contribute to inductance of the tunable inductor since all inductance portions (840, 845, 850, 855, 860) of the tunable inductor (800) have been bypassed.

Figure 8B:
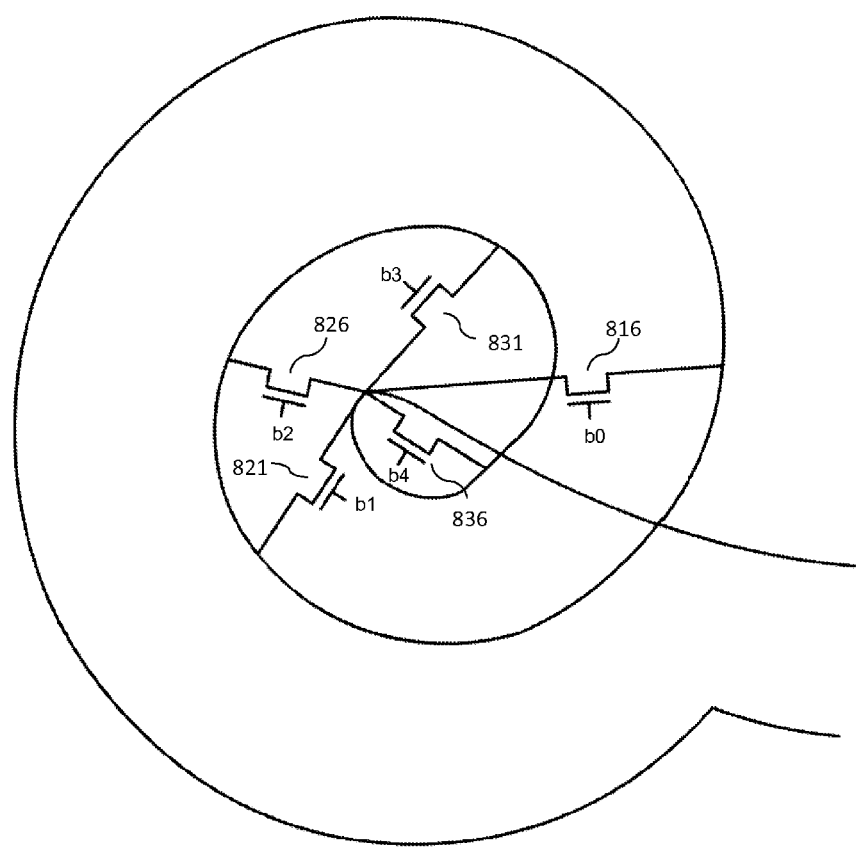
Figure 8C:
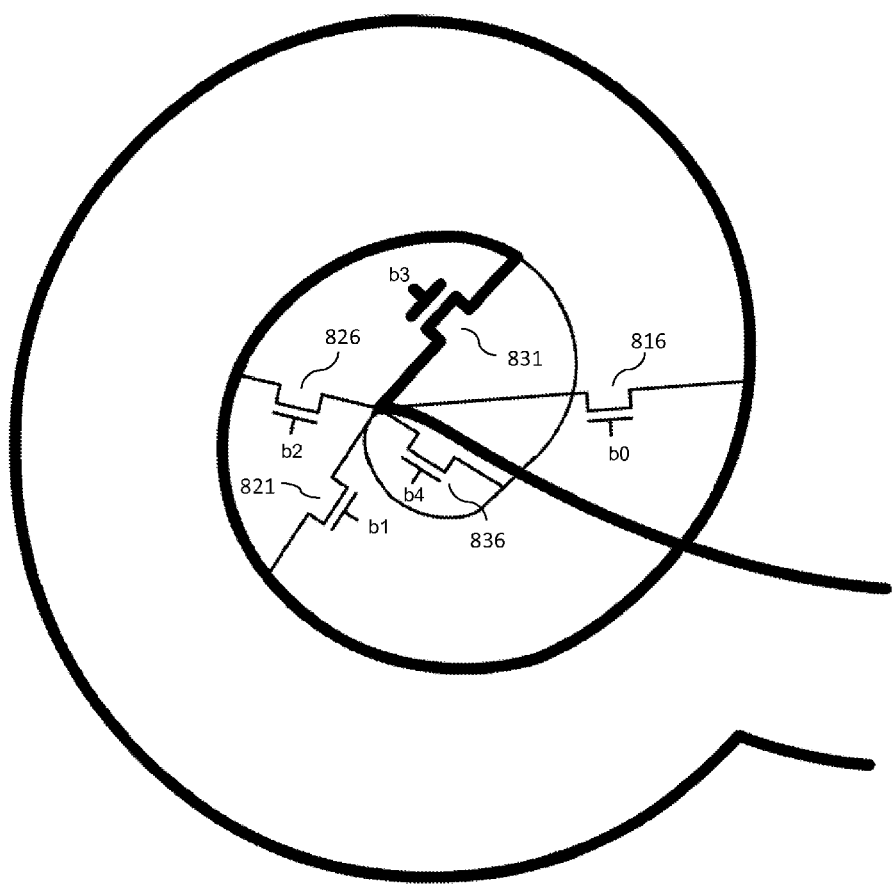
FIGS. 8C and 8D show examples of splitting of the spiral inductor of FIG. 8B based on state of the switches.
Figure 8D:
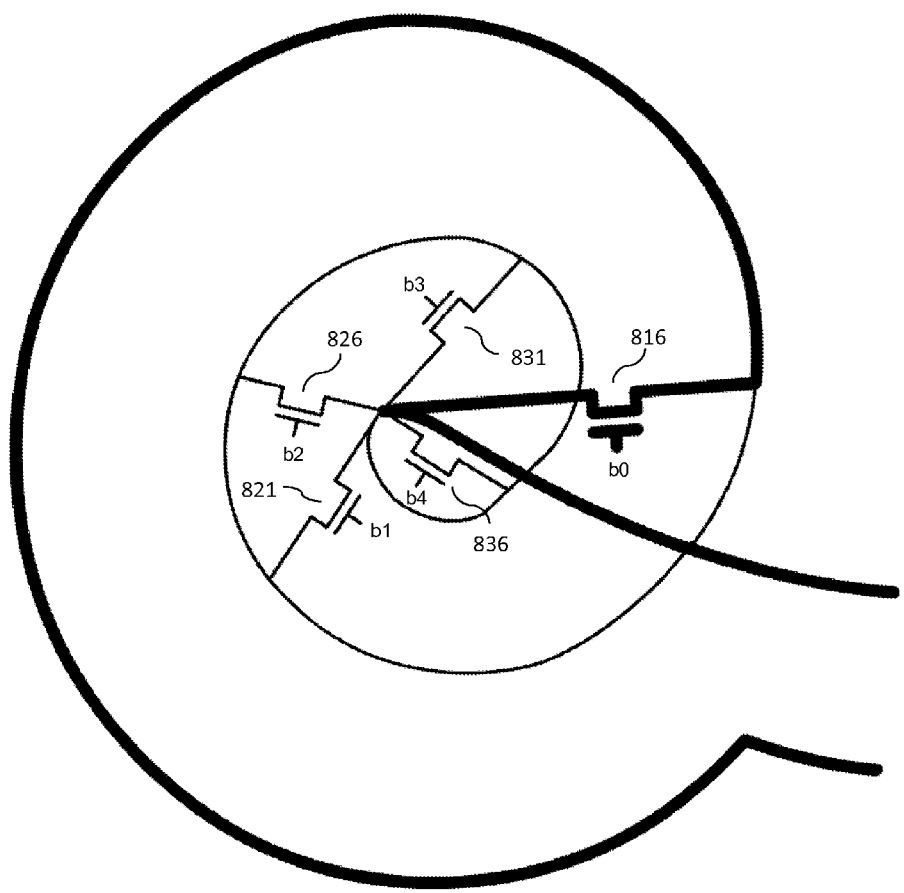

FIG. 8B shows a spiral inductor utilized as a tunable inductor. Similar to FIG. 8A, switches (816, 821, 826, 831, 836) can be utilized to split the spiral inductor into multiple inductance portions. Specifically, a switch in an on state can short out a component of the spiral inductor. FIG. 8C shows a case where a third switch (831) is in an on state whereas the remaining switches (816, 821, 826, 836) are in an off state. FIG. 8D shows a case where a zeroth switch (816) is in an on state whereas the remaining switches (821, 826, 831, 836) are in an off state. A bolded path is shown in each of FIGS. 8C and 8D that represent portions of the spiral inductor that are contributing to inductance of the tunable inductor.

In a case where multiple switches are in an on state, for example switches (831) and (836) are in an on state, portions of the spiral inductor that are contributing to inductance of the tunable inductor are essentially a shortest path (lowest inductance) defined based on switch (831) being in an on state. With finite on-resistances, small changes in inductance and Q factor can be effected due to switches (831) and (836) being on as opposed to only switch (831) being on. In a case where all switches (816, 821, 826, 831, 836) are in an off state, inductance from an entirety of the spiral inductor can contribute to inductance of the tunable inductor.

It should be noted that the various embodiments and examples of the tunable inductors shown in FIGS. 6A-6D, 7A-7I, and 8A-8D can be used in combination with one another. For example, bypass switches, such as bypass switch (770) shown in FIG. 7I, can be added to any of the tunable inductors presented in FIGS. 6A-6D, 7A-7H, and 8A-8D. As another example, although FIG. 6A shows each bit as comprising a switch and a corresponding inductor, one or more of the bits shown in FIG. 6A can instead share a single inductor that is split into inductance portions via switches, such as shown in FIGS. 8A-8D. Although a circular spiral inductor is shown in FIGS. 8B-8D, spiral inductors of other shapes such as square-shaped and rectangular-shaped spiral inductors can also be utilized.

The ratios between capacitances or inductances for each stage of a tunable reactance are generally arbitrary and depend on specifications of any particular system or application. In some embodiments of the present disclosure, the capacitances or inductances are scaled inversely to scaling of $R_{on}$ such that Q is kept constant between stages. Switch widths would be scaled in relation to capacitance or inductance values if constant Q across all stages were desired. In other embodiments, a system may have different Q-factors between stages. For instance, a system may be designed to have a relatively high (or relatively low) Q state for a specific channel or band and, in that case, the on resistance $R_{on}$ of the switch may be set differently just for that state (relative to the other states).

In a multiband radio case, such as one used in public safety, many different frequencies, powers, and modulation schemes can be used. To get desired tuning or filtering over many bands, specific values of the reactances and switch resistances may be needed as part of a multi-faceted tradeoff between possible combinations. In such an example, to realize desired overall system performance, the ratio of reactances and the ratio of resistances between stages in the tunable reactance are generally not a constant.

In another case, a system can have two widely separated groups of tightly spaced bands, such as in a cellular system. In such a case, a tunable capacitor can be utilized. A large capacitor value may be employed in the tunable capacitor such that, when the switch associated with the large capacitor is turned on, the system can make a jump between the two widely separated frequency groups. A group of finely spaced capacitor values can then be utilized to handle the tightly spaced bands within each of the two frequency groups. A system can similarly employ a tunable inductor that comprises a large inductor value and a group of finely spaced inductor values instead of or in conjunction with the tunable capacitor.

In general, more complex overall frequency plans, where a frequency plan is created by taking into consideration all desired frequencies as well as interfering frequencies in a given application, are generally associated with more complex capacitance, inductance, and quality factor combinations.

As previously mentioned, in several embodiments of the present disclosure, tunable inductors can be realized by building the tunable inductors as part of CMOS SOS processes. In such cases, high-Q integrated inductors may be realized. Switches associated with the tunable inductors are generally designed such that $R_{on}$ is low.

According to some embodiments of the present disclosure, a tunable inductor can be designed such that its Q-factor remains approximately constant over all tuning states. As used in this disclosure, in relation to tunable inductors, tuning states refer to inductance values capable of being exhibited by the tunable inductor. For instance, in a five bit case, the tuning states can be 0L through 31L in steps of L, thus having a total of thirty-two tuning states. Since inductors are generally larger than capacitors and have lower unloaded Q-factors (typically 10-20) relative to capacitors (typically 50-200), proper design of inductors and switches is important. Unloaded Q-factor refers to quality factor when energy of the reactance is not dissipated by other components.

Differences in Q-factors are generally a result of materials used to make the inductors and capacitors. Differences between Q-factors of inductors and capacitors are also based, in part, on Ohm's Law. Specifically, current flowing through wires (e.g., coiled wires in an inductor) is associated with a resistive V=IR voltage drop (ohmic potential drop), which leads to inductors generally having lower Q-factors than capacitors.

Each switch shown in FIGS. 6A-6D, 7A-7I, and 8A-8D comprises parasitic characteristics $R_{on}$ and $C_{off}$, which is resistance value of the switch when the switch is on (closed) and capacitance value of the switch when the switch is off (open), respectively. These parasitic characteristics are not explicitly shown in FIGS. 6A-6D, 7A-7I, and 8A-8D.

In tunable capacitors, for a given Q, at higher frequencies, size of each switch increases. In contrast, in tunable inductors, for a given Q, size of each switch decreases at increasing frequencies. Consequently, high operating frequencies rely more on inductors than capacitors for filters and matching networks since higher Q components are possible with inductors at these frequencies.

It should be noted that although a capacitor and inductor are similar in theory, their applications in practice may be different. For cellular phones, which operate at lower gigahertz ranges (e.g., less than 3 GHz), size of inductors are large relative to capacitors. Similarly, at still lower frequencies, capacitors can be primarily utilized in building tunable circuits, although such circuits may also employ some inductors. However, at higher frequencies (e.g., 10 GHz and above), inductors are generally preferred as an energy storage element due to increasing Q and/or decreasing size/inductance associated with a frequency increase for a set impedance.

Although cellular phones that operate at lower gigahertz ranges may not utilize many inductors or tunable inductors, applications such as bandpass filtering may need to exhibit frequency responses obtained through a particular combination of fixed and tunable inductors and/or capacitors. As an example, Ka band, which is between about 26.5 to 40 GHz, can be utilized for high bandwidth satellite communications. An example device is a 38 GHz Ka band power amplifier, and such an amplifier would generally utilize more inductors and/or tunable inductors than for devices that operate at lower frequencies. As another example, Q band, which is between about 33 to 50 GHz, may be utilized for short range, high bandwidth, intra-building communications. At these higher frequency bands, tunable inductors will generally be more prevalent than at lower frequency bands.

FET switches generally have higher insertion loss IL at higher frequencies, which generally sets an upper limit on operation frequency of FET switches. It should be noted that insertion loss is a design parameter that can be controlled. For instance, switches can be operated with less than 1 dB insertion loss at frequencies of higher than 20 GHz. In some cases, insertion loss can be minimized in a narrow frequency band if a broad band solution is not required, such as in a radar, satellite, or microwave radio system. If $R_{on}$ and $C_{off}$ of a switch are too high, design consideration is generally applied to either the switch or the inductor (or both).

Tunable circuits can be utilized to tune over a range of bandwidths, which can range from very narrow band (e.g., less than 1% bandwidth) up to very broad bandwidth (e.g., greater than 10% and up to 100% bandwidth) and anywhere in between. For example, consider a narrow band system such as a filter or a narrow band antenna. Such narrow band systems cover a smaller frequency band. Now, consider a case where it is desirable to realize efficiency inherent to narrow band systems but covering a wider bandwidth. The narrow band system can be built to have higher efficiency within an even narrower band, but tunable reactances can be utilized in the narrow band system such that efficiency can be improved for frequency bands outside of the narrower band.

As another example, consider a broadband system such as a cellular antenna. Such a cellular antenna is generally inherently inefficient due to its being broad band, such as covering LTE frequency bands from 700 MHz up to 2.5 GHz. The cellular antenna is generally considered inefficient since the cellular antenna is not optimized for any frequencies within its bandwidth. The cellular antenna may have 3-10 dB of losses, and thus some of the power transferred to the antenna does not get radiated. With tunable reactances, the cellular antenna can be designed to be more efficient at certain bands (e.g., high bands) whereas the tunable reactances can tune the cellular antenna to improve efficiency at other bands (e.g., low bands).

Combining tunable inductors with tunable capacitors yields different circuits used in electronics, including RF circuits. Generally, use of tunable inductors and/or tunable capacitors can yield frequency agility, lower interference, and higher system flexibility. Frequency agility refers to ability to change frequency of operation with control signals, and thus can be associated with both narrow and wide bandwidths. As previously mentioned, a tunable circuit can be implemented with primarily capacitors at lower frequencies (e.g., cellular phone applications) while primarily inductors can be utilized at higher frequencies. In other applications such as band pass filters, capacitors are generally combined with inductors. In such applications, adjusting only capacitors will generally be impractical and/or impossible to obtain a desired outcome.

Tunable capacitors and/or tunable inductors may be placed in series or in parallel with a load circuit. Design of such tunable capacitors and inductors typically involves tradeoffs between physical dimensions of components used in building the tunable capacitors and inductors and performance of the tunable capacitors and inductors.

In general, design of tunable capacitors exhibit tradeoffs among capacitor length and width, metal layers, capacitance values, and unloaded Q-factors. As is known by one skilled in the art, capacitance of a parallel plate capacitor can be given by $C=\in A/d$, where $\in$ is the dielectric strength, A (length×width) is the area of the parallel plates, and d is the distance between the two plates. Quality factor is generally determined by material properties of the capacitor, such as resistance of the plates and absorption properties of the dielectric material.

Similarly, design of tunable inductors exhibits tradeoffs among inductor size, linewidth of metal layers, inter-line coupling, inductance values, and unloaded Q-factors. For instance, when an inductor is made out of a wide trace of metal (relative to a narrower trace), resistance of the inductor is lower and Q-factor improves. However, area of the inductor, which is associated with cost and size of the inductor, increases. Inter-line coupling can include coupling between adjacent inductors, where parameters of an inductor can be adjusted (e.g., inductance value increased or decreased) based on coupling with another inductor.

Selection of parameters for each reactive element varies based on application, with many of the factors provided above being frequency dependent. For example, in integrated circuits or as discrete components, planar capacitors are generally much smaller than planar inductors. Tunable inductors become large if multiple, large inductances need to be switched. Consequently, in some embodiments of the tunable inductor, physical size of the tunable inductor is reduced by utilizing FETs that switch out segments of one or more inductors (as opposed to each FET corresponding with one discrete inductor).

According to many embodiments of the present disclosure, a tunable matching network may be implemented utilizing tunable capacitors, tunable inductors, tunable capacitors in conjunction with fixed inductors, tunable inductors in conjunction with fixed capacitors, and tunable inductors in conjunction with tunable capacitors. Each of these reactive components can be utilized with fixed and/or tunable resistances. The tunable matching network may be used to enable impedance matching of an arbitrary load impedance to an arbitrary source impedance. The use of the term "arbitrary" is such that function of a matching network is to match source impedance to load impedance regardless of value of such impedances. As is well known in the art, impedances can have both resistive and reactive components, and source impedance can range from a small fraction to more than twice load impedance.

FIGS. 9A and 9B show a block diagram of a circuital arrangement comprising a tunable capacitor in series and in parallel with a load circuit, respectively. FIGS. 10A and 10B show a block diagram of a circuital arrangement comprising a tunable inductor in series and in parallel with a load circuit, respectively. Each of FIGS. 9A, 9B, 10A, and 10B shows tunable networks, where frequency response of the tunable network depends on components and configuration of each of a source impedance $Z_{SRC}$, DTX impedance $Z_{DTL}$ and/or $Z_{DTC}$, and load impedance $Z_{LD}$. As is commonly known, matched condition for FIGS. 9A and 10A is given by $Z_{LD}=Z_{SRC}+Z_{DTX}$ whereas matched condition for FIGS. 9B and 10B is given by $Z_{LD}=Z_{SRC}||Z_{DTX}=Z_{SRC}Z_{DTX}/(Z_{SRC}+Z_{DTX})$.

Each of FIGS. 9A, 9B, 10A, and 10B shows a block diagram with a tunable capacitor or tunable inductor between a source and a load. As an example, the load can be a 50Ω resistor or have an equivalent impedance of 50Ω. In such a case, FIGS. 9A and 10B are high pass filters while FIGS. 9B and 10A are low pass filters. The tunable capacitor or tunable inductor themselves can include either serial or shunt connections between one or more devices.

Figure 11:
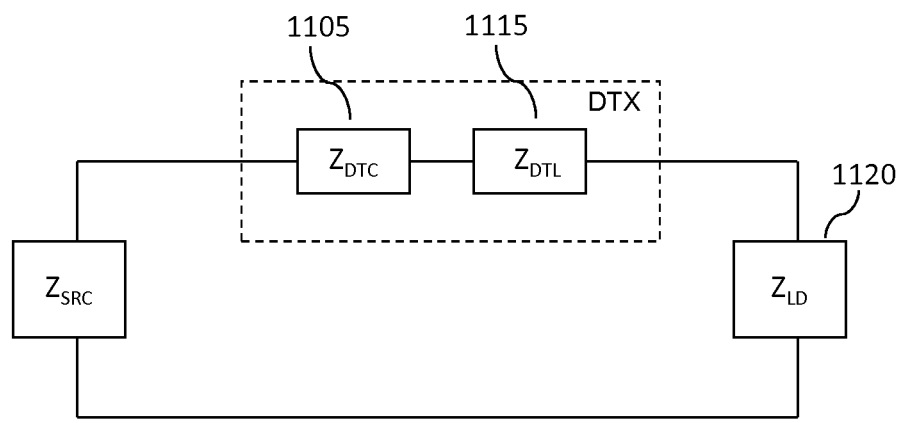
FIG. 11 shows a block diagram of a circuital arrangement with a tunable reactance connected in series with a source on one side and a load on another side, where the tunable reactance comprises a tunable capacitor serially connected with a tunable inductor.

FIG. 11 shows a block diagram of a circuital arrangement comprising a tunable reactance, where the tunable reactance includes a tunable capacitor (1105) in series with a tunable inductor (1115) and where the tunable capacitor (1105) and the tunable inductor (1115) are connected in series with a load (1120). Reactance of the DTX can be given by $X_{DTX}=X_{DTL}+X_{DTC}$. In this embodiment, equivalent reactance is minimal at resonance due to cancellation of inductive and capacitive reactance, thus yielding a transmission peak at a resonant frequency. The tunable capacitor performs DC blocking, and the capacitance dominates at frequencies below resonance. Either of the shown tunable reactances can also be a fixed reactance, and the resulting circuital arrangement will perform as a tunable circuit, as discussed below and shown with reference to FIGS. 16-19. Use of either DTC or DTL, or use of both in the same circuit, is a design option that can be decided by specific requirements of the circuit. As is well known by one skilled in the art, capacitors exhibit decreasing quality factor with increasing frequency while inductors exhibit the opposite relationship. Tradeoffs such as these present between Q-factor and frequency of operation are factors generally taken into consideration when determining whether to implement a tunable circuit with a DTC, DTL, or both.

With further reference to FIG. 11, according to an embodiment of the present disclosure, FIG. 11 shows implementation of a tunable reactance based on use of both a tunable capacitor (1105) and a tunable inductor (1115). The tunable reactance can be changed by changing the state of either the tunable capacitor (1105) or the tunable inductor (1115) and the tunable reactance will exhibit a tunable resonance when $X_{DTL}=X_{DTC}$.

Figure 12:
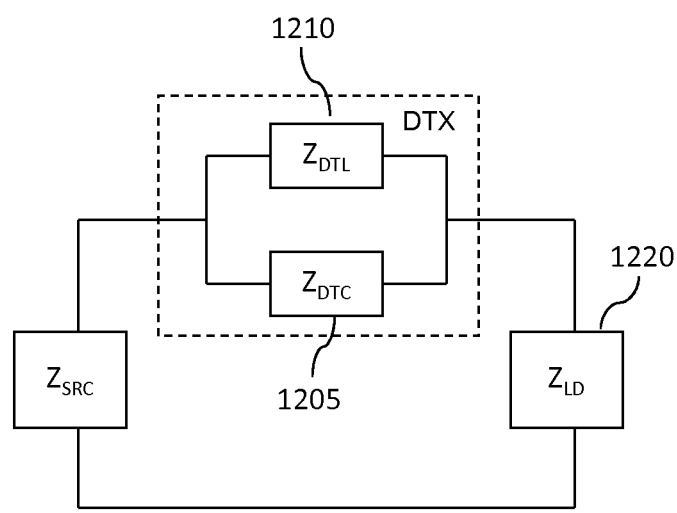
FIG. 12 shows a block diagram of a circuital arrangement with a tunable reactance connected in series with a source on one side and a load on another side, where the tunable reactance comprises a tunable capacitor connected in parallel with a tunable inductor.

FIG. 12 shows a block diagram of a circuital arrangement comprising a tunable reactance, where the tunable reactance includes a tunable capacitor (1205) in parallel with a tunable inductor (1210) and where the tunable capacitor (1205) and the tunable inductor (1210) are connected in series with a load (1220). Reactance of the DTX can be given by $X_{DTX}=[1/X_{DTL}+1/X_{DTL}]^{-1}$. In this embodiment, equivalent reactance is infinite at resonance, thus yielding a transmission notch. The tunable capacitor (1205) exhibits high pass characteristics and dominates above resonance while the tunable inductor (1210) exhibits low pass characteristics and dominates below resonance. The tunable capacitor (1205) and the tunable inductor (1210) can be utilized as a tunable parallel resonant circuit.

Figure 13:
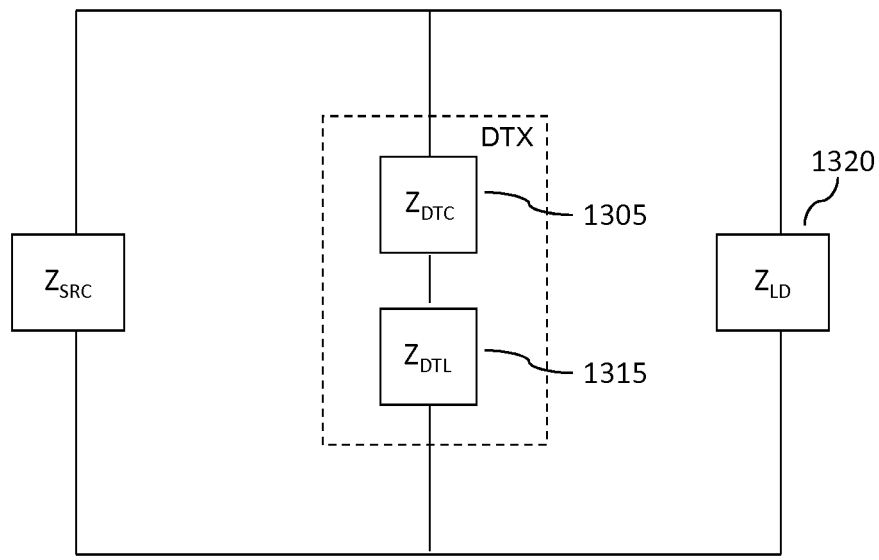
FIG. 13 shows a block diagram of a circuital arrangement with a tunable reactance connected in parallel with a source and a load, where the tunable reactance comprises a tunable capacitor serially connected with a tunable inductor.

FIG. 13 shows a block diagram of a circuital arrangement comprising a tunable reactance, where the tunable reactance includes a tunable capacitor (1305) in series with a tunable inductor (1315) and where the tunable capacitor (1305) and the tunable inductor (1315) are connected in parallel with a load (1320). Reactance of the DTX can be given by $X_{DTX}=X_{DTL}+X_{DTC}$. In this embodiment, equivalent reactance is minimal at resonance due to cancellation of inductive and capacitive reactance, thus creating a parallel short and producing a transmission notch. Capacitance from the tunable capacitor (1305) dominates below resonance and performs DC blocking while inductance from the tunable inductor (1315) dominates above resonance and performs high frequency blocking.

Figure 14:
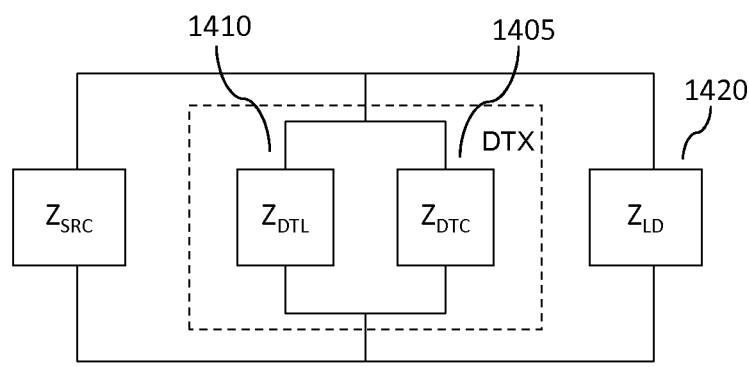
FIG. 14 shows a block diagram of a circuital arrangement with a tunable reactance connected in parallel with a source and a load, where the tunable reactance comprises a tunable capacitor connected in parallel with a tunable inductor.

FIG. 14 shows a block diagram of a circuital arrangement comprising a tunable reactance, where the tunable reactance includes a tunable capacitor (1405) in parallel with a tunable inductor (1410) and where the tunable capacitor (1405) and the tunable inductor (1410) are connected in parallel with a load (1420). In this embodiment, equivalent reactance is infinite at resonance, thus creating a parallel open and producing a transmission peak. Capacitance from the tunable capacitor (1405) dominates above resonance and performs low pass filtering while inductance from the tunable inductor (1410) dominates below resonance and performs high pass filtering.

It should be noted that FIGS. 12 and 14 both show parallel resonant circuits. However, whereas the parallel resonant circuit of FIG. 12 is in series with the load, the parallel resonant circuit of FIG. 14 is in parallel with the load. Consequently, at resonance, the load of FIG. 12 would see a notch whereas the load of FIG. 14 would see a peak. As is well known by a person skilled in the art, the same components (e.g., the same parallel resonant circuit) can exhibit different results based on arrangement in an overall circuital arrangement.

Furthermore, FIGS. 11 and 13 show series resonant circuits. As is well known by a person skilled in the art, electrical resonance of resonant networks occurs when reactances forming the resonant networks are equal and opposite in value. At resonance, resonant networks can generate voltages and/or currents higher than input/output voltages and/or currents (i.e., resonant networks can produce voltage or current multiplication). In FIGS. 11-14, electrical resonance of the tunable reactance occurs when $X_{DTL}=X_{DTC}$. With particular reference to FIG. 11 for instance, even if the input and output voltage applied to the DTC or the DTL can be within a withstand voltage of a single switch in the DTC or DTL, voltage generated at resonance may be higher than the withstand voltage of a single switch in the DTC and thus cause breakdown of the switch. Consequently, to better handle voltages and currents generated at resonance, tunable reactances such as tunable inductors and tunable capacitors may comprise one or more stacks of switches in series and shunt configurations with reactances, as shown for instance in FIGS. 6C and 6D.

Figure 15:
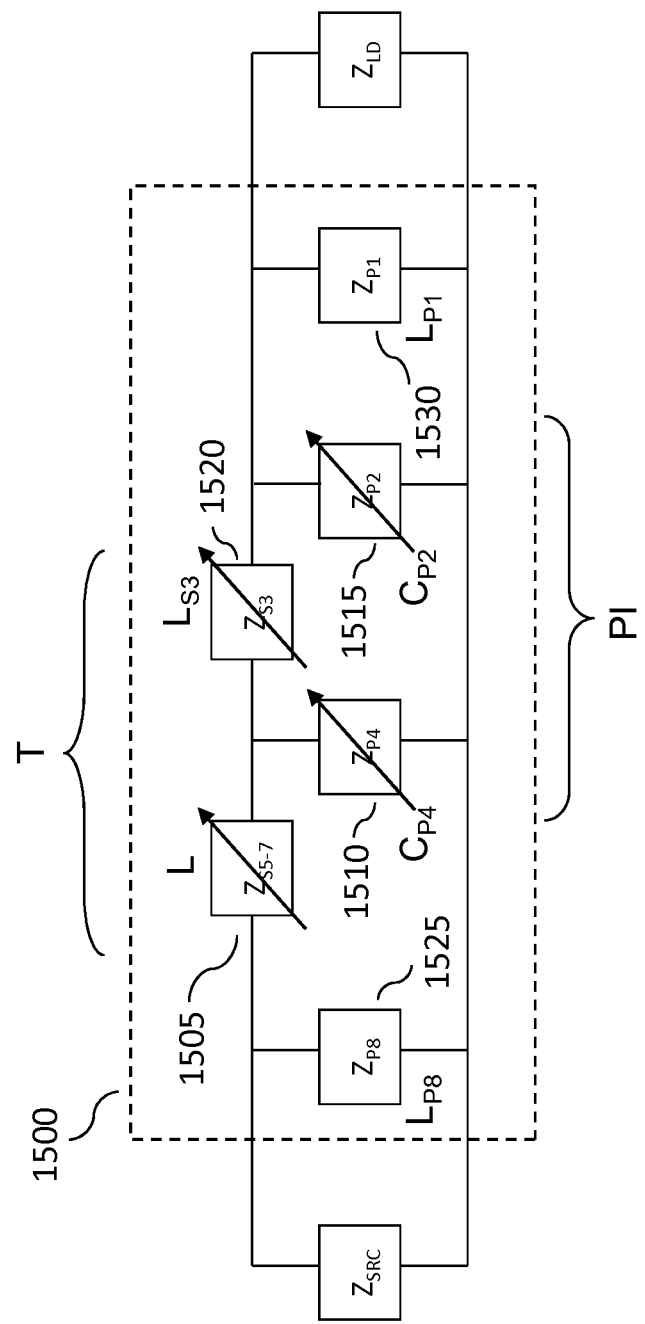
FIG. 15 shows a block diagram of a circuital arrangement with a matching network, where the matching network comprises tunable reactances and/or fixed reactances.

FIG. 15 shows a block diagram of an exemplary circuit arrangement comprising a matching network (1500), where the matching network comprises a plurality of tunable elements. Specifically, the circuit arrangement comprises a first tunable inductor (1505), a first tunable capacitor (1510), a second tunable capacitor (1515), and a second tunable inductor (1520). A T network comprises the first tunable inductor (1505), the first tunable capacitor (1510), and the second tunable inductor (1520). A Pi network comprises the first and second tunable capacitors (1510, 1515) and the second tunable inductor (1520). The combination of T and Pi networks transforms impedances and creates phase shifts. As is well known by a person skilled in the art, T and Pi networks can be utilized in design of matching networks, and each capacitor and inductor provides a degree of freedom in the design of matching networks. Fixed inductors (1525, 1530) can be utilized to, for instance, downward transform impedance of the source (i.e., make impedance of the source look lower). By using tunable capacitors and inductors, as is well known by one skilled in the art, poles and zeroes of the circuit arrangement can be independently set and therefore create a flexible, tunable matching network.

It should be noted that each component (e.g., capacitor, inductor, and resistor) provides a degree of freedom in design of a device (e.g., the matching network of FIG. 15). Use of tunable inductors (1115, 1505, and 1520) shown in FIGS. 11 and 15 as the tunable reactance, as opposed to a single equivalent inductor, may aid in setting of the Q-factor in addition to performing impedance transformation and matching.

Figure 16:
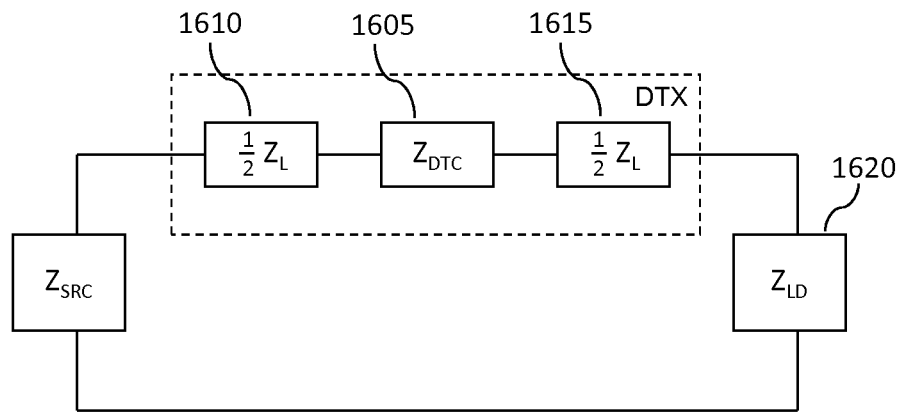
FIG. 16 shows a block diagram of a circuital arrangement with a tunable reactance connected in series with a source on one side and a load on another side, where the tunable reactance comprises a tunable capacitor serially connected with fixed inductors.

FIG. 16 shows a block diagram of a circuital arrangement comprising a tunable reactance, where the tunable reactance includes a tunable capacitor (1605) in series with a first and second inductor (1610, 1615) and where the tunable capacitor (1605) and the inductors (1610, 1615) are connected in series with a load (1620). Reactance of the DTX can be given by $X_{DTX}=X_L+X_{DTC}$. In this embodiment, equivalent reactance is minimal at resonance due to cancellation of inductive and capacitive reactance, thus yielding a transmission peak at a resonant frequency. The tunable capacitor (1605) performs DC blocking, and the capacitance dominates at frequencies below resonance.

With further reference to FIG. 16, according to an embodiment of the present disclosure, FIG. 16 shows an implementation of a tunable inductor based on two fixed inductors (1610, 1615) and a tunable capacitor (1605). The tunable capacitor (1605) acts to reduce effective inductance of the fixed inductors (1610, 1615). Specifically, the tunable capacitor (1605) has an impedance $Z_{DTC}=1/(j\omega C)$, which counteracts impedance $Z_L=j\omega L$ of the fixed inductors (1610, 1615). The tunable capacitor (1605) can be implemented such that its range of capacitances covers one or more of the regime $|1/(j\omega C)|>|j\omega L|$, where the tunable reactance network looks more like a capacitor; the regime of $|1/(j\omega C)|<|j\omega L|$, where the tunable reactance network looks more like an inductor; and a point $|1/(j\omega C)|=|j\omega L|$, where the capacitance and inductance balance each other and the tunable reactance network is purely resistive. The fixed inductors (1610, 1615) and the tunable capacitor (1605) can be utilized as a tunable series resonant circuit.

Figure 20:
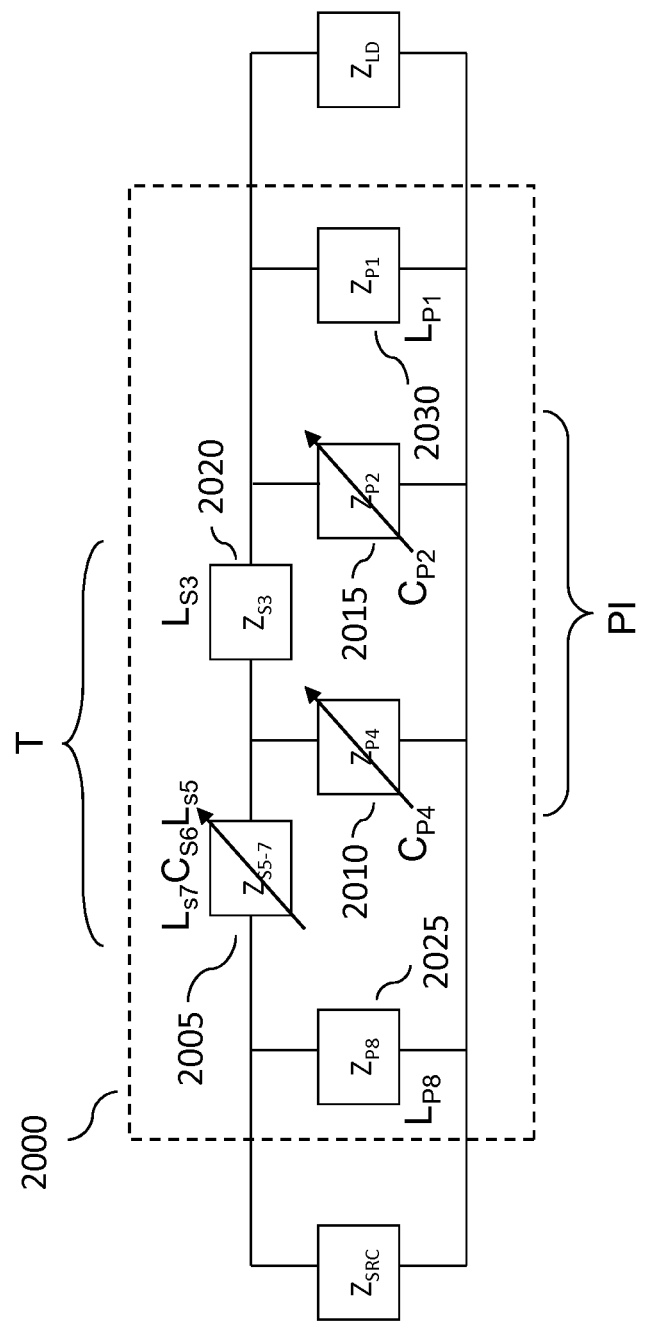
FIG. 20 shows a block diagram of a circuital arrangement with a matching network, where the matching network comprises tunable reactances and/or fixed reactances.

It should be noted that although FIG. 16 shows the first and second inductors (1610, 1615) as two separate inductors symmetrically oriented with the tunable capacitor (1605), the first and second inductors (1610, 1615) can be implemented as one inductor of impedance $Z_L$ or as multiple inductors whose equivalent impedance is $Z_L$. However, the separate symmetrically oriented inductors may be utilized in more complex circuit arrangements where additional components are connected to one or both of the inductors (1610, 1615) (such as shown in FIG. 20).

Figure 17:
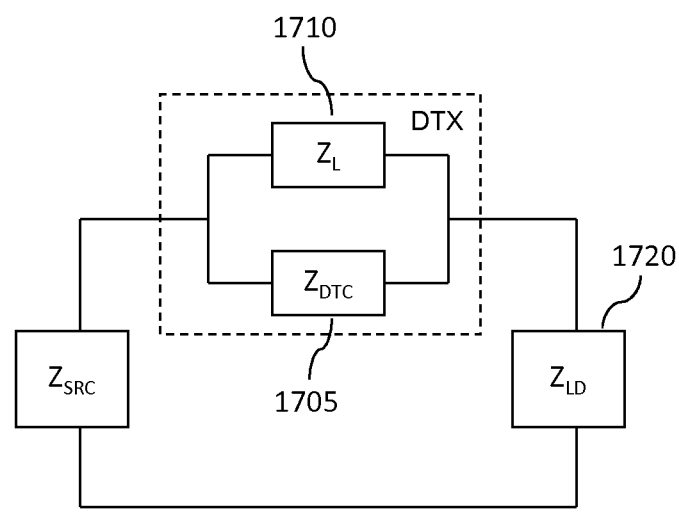
FIG. 17 shows a block diagram of a circuital arrangement with a tunable reactance connected in series with a source on one side and a load on another side, where the tunable reactance comprises a tunable capacitor connected in parallel with a fixed inductor.

FIG. 17 shows a block diagram of a circuital arrangement comprising a tunable reactance, where the tunable reactance includes a tunable capacitor (1705) in parallel with an inductor (1710) and where the tunable capacitor (1705) and the inductor (1710) are connected in series with a load (1720). Reactance of the DTX can be given by $X_{DTX}=[1/X_L+1/X_{DTC}]^{-1}$. In this embodiment, equivalent reactance is infinite at resonance, thus yielding a transmission notch. The tunable capacitor (1705) exhibits high pass characteristics and dominates above resonance. The tunable capacitor (1705) and the inductor (1710) can be utilized as a tunable parallel resonant circuit.

Figure 18:
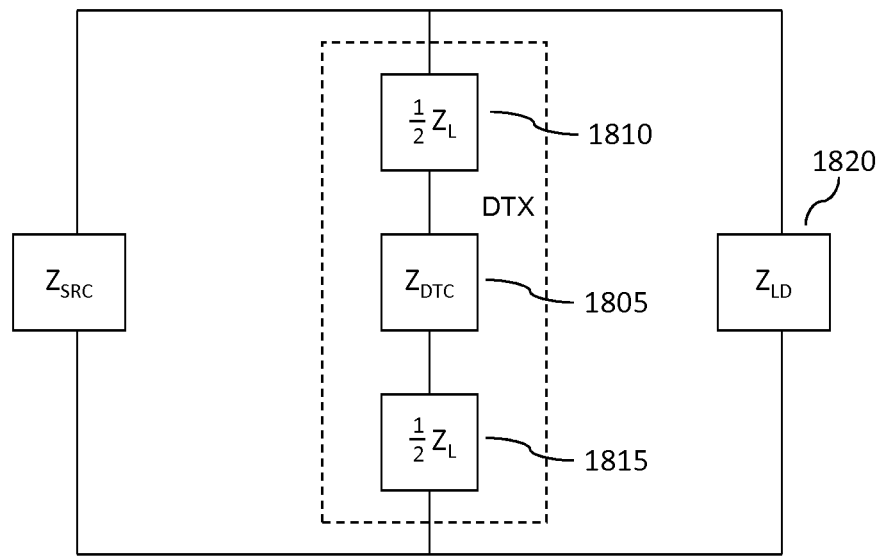
FIG. 18 shows a block diagram of a circuital arrangement with a tunable reactance connected in parallel with a source and a load, where the tunable reactance comprises a tunable capacitor serially connected with fixed inductors.

FIG. 18 shows a block diagram of a circuital arrangement comprising a tunable reactance, where the tunable reactance includes a tunable capacitor (1805) in series with a first and second inductor (1810, 1815) and where the tunable capacitor (1805) and the inductors (1810, 1815) are connected in parallel with a load (1820). Reactance of the DTX can be given by $X_{DTX}=X_L+X_{DTC}$. In this embodiment, equivalent reactance is minimal at resonance due to cancellation of inductive and capacitive reactance, thus creating a parallel short and producing a transmission notch. The tunable capacitor (1805) acts to lower inductive reactance of the inductors (1810, 1815). Capacitance from the tunable capacitor (1805) dominates below resonance and performs DC blocking.

Figure 19:
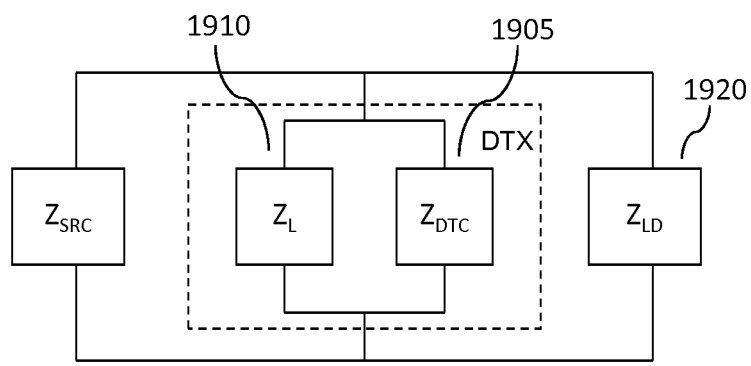
FIG. 19 shows a block diagram of a circuital arrangement with a tunable reactance connected in parallel with a source and a load, where the tunable reactance comprises a tunable capacitor connected in parallel with a fixed inductor.

FIG. 19 shows a block diagram of a circuital arrangement comprising a tunable reactance, where the tunable reactance includes a tunable capacitor (1905) in parallel with an inductor (1910) and where the tunable capacitor (1905) and the inductor (1910) are connected in parallel with a load (1920). In this embodiment, equivalent reactance is infinite at resonance, thus creating a parallel open and producing a transmission peak. Capacitance from the tunable capacitor (1905) dominates above resonance and performs low pass filtering.

It should be noted that FIGS. 17 and 19 both show parallel resonant circuits. However, whereas the parallel resonant circuit of FIG. 17 is in series with the load, the parallel resonant circuit of FIG. 19 is in parallel with the load. Consequently, the load of FIG. 17 would see a notch whereas the load of FIG. 19 would see a peak. As is well known by a person skilled in the art, the same components (e.g., the same parallel resonant circuit) can exhibit different results based on arrangement in an overall circuital arrangement.

Each of FIGS. 16-19 show implementations of a tunable inductor based on a tunable capacitor and fixed inductors in a matching network. Specifically, adjustment of the capacitance leads to adjustment of the impedance of the tunable capacitor. This, in turn, adjusts effective inductance of the matching network. As previously mentioned, the combination of tunable capacitors with fixed inductors is only one example. The matching networks can comprise various combinations of tunable capacitors, tunable inductors, fixed capacitors, fixed inductors, tunable resistors, and fixed resistors.

Furthermore, FIGS. 11, 13, 16, and 18 show series resonant circuits. As is well known by a person skilled in the art, electrical resonance of resonant networks occurs when reactances forming the resonant networks are equal and opposite in value. At resonance, resonant networks can generate voltages and/or currents higher than input/output voltages and/or currents (i.e., resonant networks can produce voltage or current multiplication). In FIGS. 11-14 and 16-19, electrical resonance of the tunable reactance occurs when $X_{DTL}=X_{DTC}$ or $X_L=X_{DTC}$. With particular reference to FIG. 16 for instance, even if the input and output voltage applied to the DTC can be within a withstand voltage of a single switch in the DTC, voltage generated at resonance may be higher than the withstand voltage of a single switch in the DTC and thus cause breakdown of the switch. Consequently, to better handle voltages and currents generated at resonance, tunable reactances such as tunable inductors and tunable capacitors may comprise one or more stacks of switches in series and shunt configurations with reactances, as shown for instance in FIGS. 6C, 6D, 7E and 7F. Similarly, with particular reference to FIG. 11 for instance, stacks in both the DTC and DTL may comprise a sufficient number of switches to better handle voltages and currents generated at resonance.

FIG. 20 shows a block diagram of an exemplary circuit arrangement comprising a matching network (2000), where the matching network comprises a plurality of tunable elements. Specifically, the circuit arrangement comprises a tunable reactance (2005) as provided in FIG. 16, a first tunable capacitor (2010), a second tunable capacitor (2015), and an inductor (2020). A T network comprises the tunable reactance (2005), the first tunable capacitor (2010), and the inductor (2020). A Pi network comprises the first and second tunable capacitors (2010, 2015) and the inductor (2020). The combination of T and Pi networks transforms impedances and creates phase shifts. As is well known by a person skilled in the art, T and Pi networks can be utilized in design of matching networks, and each capacitor and inductor provides a degree of freedom in the design of matching networks. Fixed inductors (2025, 2030) can be utilized to, for instance, downward transform impedance of the source (i.e., make impedance of the source look lower).

It should be noted that each component (e.g., capacitor, inductor, and resistor) provides a degree of freedom in design of a device (e.g., the matching network of FIG. 20). Use of symmetric inductors (2010, 2015) shown in FIG. 16 and in FIG. 18 as the tunable reactance (2005), as opposed to a single equivalent inductor, may aid in setting of the Q-factor in addition to performing impedance transformation and matching.

Figure 21:
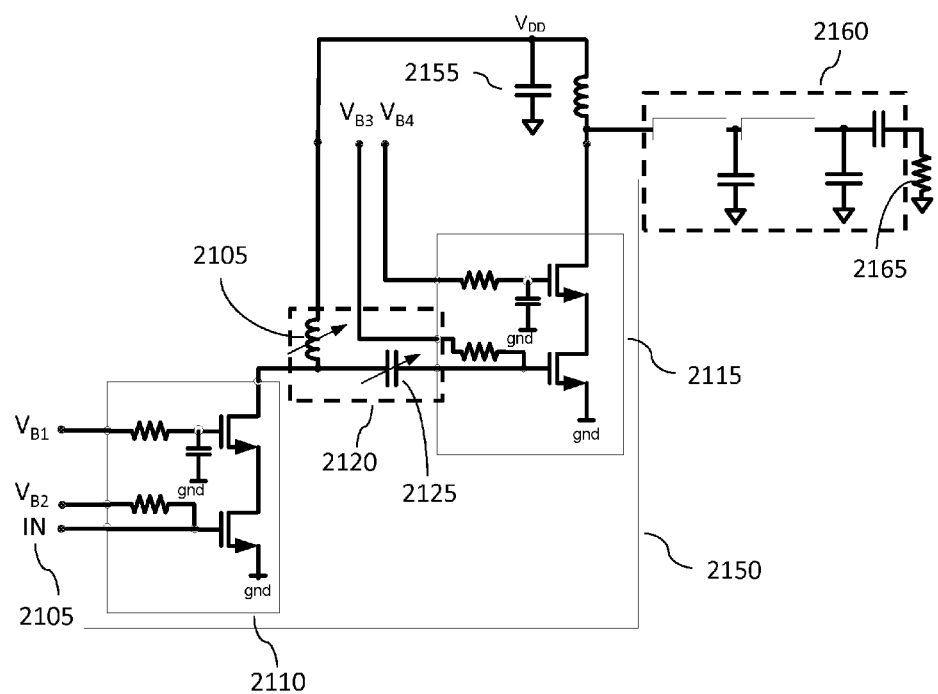
FIG. 21 shows a tunable interstage matching network, where the matching network comprises tunable capacitors and tunable inductors.

FIG. 21 shows a schematic of an exemplary system comprising a tunable interstage matching network (2120) between two stages (2110, 2115) of an amplifier. The tunable interstage matching network (2120) is shown comprising a tunable inductor (2105) and a tunable capacitor (2125). Specifically, FIG. 21 shows a two-stage wideband code division multiple access (WCDMA) lineup (2150), which is a linear power amplifier adapted for use in a WCDMA standard radio that comprises a first stage (2110), known as a driver stage, to pre-amplify an applied signal (2105) and a second stage (2115) to amplify a signal that is output from the first stage (2110) to a specified output power adapted to be applied to a load (2165), which is shown as a resistor (e.g., radiation resistance of an antenna). The applied signal (2105) and amplified signal may be radio frequency (RF) signals. This circuit is used by way of example and as one skilled in the art will know, such circuit topologies may be used for numerous applications and at a wide choice of frequencies.

A bypass capacitor (2155) can be utilized to short out noise from a power supply $V_{DD}$, and essentially decouples the entire circuit shown in the remainder of FIG. 21 from the noise from the power supply $V_{DD}$. Various components (2160) provide an external matching network, which can be a tunable matching network as shown in FIGS. 15 and 20, between the second stage (2115) (e.g., power amplifier output) and the load (2165). The first stage (2110) and the second stage (2115) are matched by a tunable interstage matching network (2120) comprising a tunable capacitor (2120) and a tunable inductor (2105). Bias voltages $V_{B1}$ and $V_{B2}$ are provided to the first stage (2110) and bias voltages $V_{B3}$ and $V_{B4}$ are provided to the second stage (2115).

Use of a tunable interstage (with on-chip inductors and capacitors) can degrade output power $P_{out}$ of a driver stage. An example degradation is 1.5 dB. However, such degradation in loss is generally acceptable since utilization of the tunable capacitor and tunable inductor allows for higher output power due to better impedance matching over a wider range of frequencies. Without impedance matching, especially at higher frequencies, a large proportion of power supplied to a load may be reflected.

In a linear radio, like WCDMA, a radio frequency (RF) signal is generated by a transceiver, which can output, for instance 0-3 dBm (1-2 mW) of power. To get a desired power of, for instance, 1 W, amplification is utilized, where amplifiers can reliably provide around 15 dB of gain. The desired power of 1 W (+30 dBm) would utilize two such amplification stages. Although FIG. 21 shows two stages (2110, 2115), only one stage or more than two stages can be implemented depending on desired amplification associated with a particular application. Additionally, signals with frequencies above and below the RF regime can be utilized.

Figure 22:
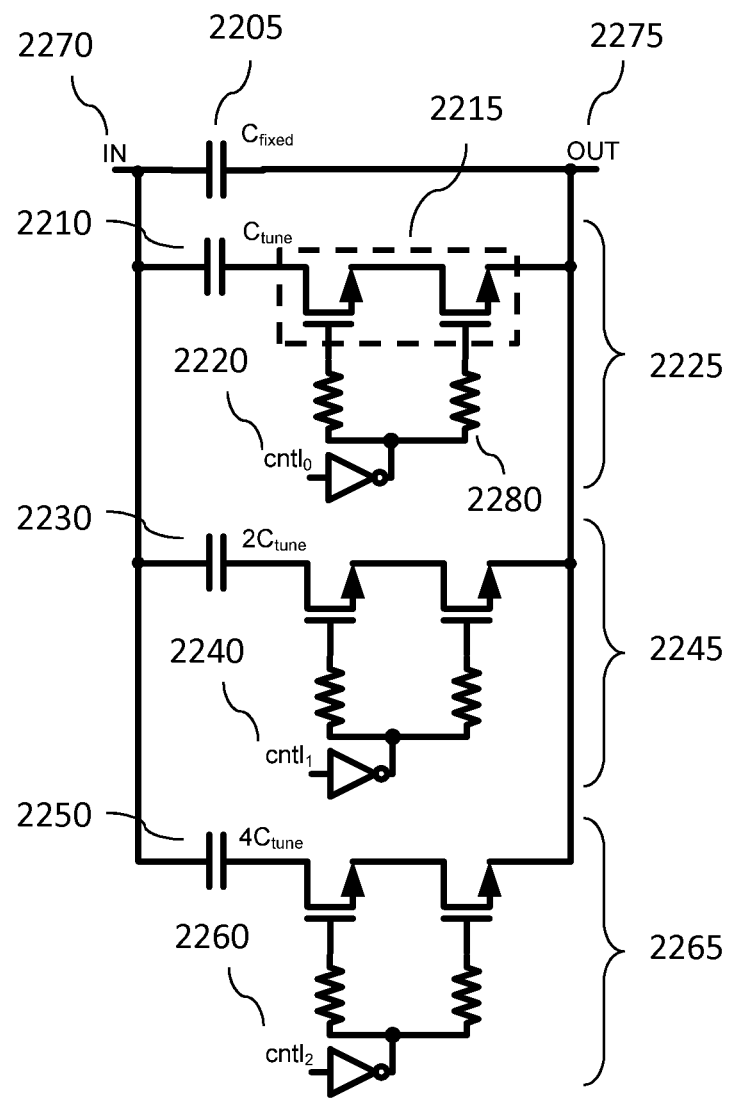
FIG. 22 shows an embodiment of a tunable capacitor.

FIG. 22 shows a tunable capacitor. In this implementation, the tunable capacitor comprises a fixed capacitor $C_{fixed}$ (2205) connected in parallel with a plurality of stages. Each stage comprises a capacitor (2210, 2230, 2250) serially connected with one or more FETs (2215) and a control voltage (2220, 2240, 2260) applied to each of the FETs (2215). A gate resistor (2280) can be tied to each of the one or more FETs (2215), where the gate resistor (2280) can aid in biasing the FET (2215) to which the gate resistor is tied. For example, the gate resistor (2215) can aid in isolating an applied signal (e.g., RF signal) on source and drain of each FET from DC on/off control signal applied to the gate terminal, which in turn may aid in turning on/off all FETs in a stack and in realizing a desired voltage splitting between the FETs.

The capacitor of a present stage (2230) has capacitance twice that of the capacitor of a previous stage (2210). More specifically, a first stage (2225) has a capacitance $C_{tune}$ (2210), a second stage (2245) has a capacitance $2C_{tune}$ (2230), and a third stage (2265) has a capacitance $4C_{tune}$ (2250). These capacitances (2210, 2230, 2250) can be utilized, for instance, in adjusting capacitances and allowing a match between a previous pre-driver stage and a final stage of a power amplifier (such as shown in FIG. 21) or other electronic devices. It should be noted that additional stages may be added to the implementation of FIG. 22 and that although binary weighting is applied in this implementation, other weighting (such as exponential weighting) may also be used, as previously discussed. Similarly, although FETs are utilized in switching in and out capacitance of a particular stage, other switching devices may be utilized.

Whether the capacitance in each stage (2225, 2245, 2265) contributes to capacitance of the tunable capacitor in addition to the fixed capacitor $C_{fixed}$ (2205) depends on corresponding control signals $cntl_0$ (2220), $cntl_1$ (2240), and $cntl_2$ (2260) applied to the one or more switches (2215). By way of example and not of limitation, consider a case where: $cntl_0$ (2220), $cntl_1$ (2240), and $cntl_2$ (2260) can each take values of 0 V or 3.5 V; $C_{fixed}$ (2205) has a capacitance of 18 pF; and Clone (2210) has a capacitance of 2 pF. Furthermore, consider that at a given moment in time, $cntl_0$=3.5 V, $cntl_1$=0 V, and $cntl_2$=3.5 V. Consequently, in this example, $C_{tune}$ (2210) and $4C_{tune}$ (2250) are added to $C_{fixed}$ (2205) since corresponding switches are conducting whereas $2C_{tune}$ (2230) is not added to $C_{fixed}$ (2205) since corresponding switches are non-conducting. Total capacitance of the tunable capacitor is thus $C_{tot}=C_{fixed}+C_{tune}+C+4C_{tune}=28$ pF. With further consideration for this example, the tuned capacitor provides a range of capacitances from 18 pF to 32 pF in steps of 2 pF.

With reference to both FIG. 21 and FIG. 22, number of FETs placed in series with $C_{tune}$ (2210), $2C_{tune}$ (2230), and $4C_{tune}$ (2250) generally depends on the control signals (2210, 2230, 2250) as well as voltage of an input (2270) to the tunable capacitor of FIG. 22 seen by the switches. For instance, the tunable capacitor of FIG. 21 sees a voltage that is output from the first stage (2110 in FIG. 21) of the two-stage WCDMA lineup (2150 in FIG. 21).

Consequently, FETs (2215 in FIG. 22) should be stacked so as to be able to withstand peak voltage of the output from the first stage (2110 in FIG. 21). An exemplary value of withstand voltage of an individual FET is 3.5 V. Consequently, FIG. 22 shows a stack of two switches (2215), for an ideal withstand voltage of 7.0 V for the stack of switches (2215). Alternatively or in combination with adding additional FETs to a stack of switches, withstand voltage of each switch can be increased by increasing gate length of the FETs. Number of switches employed in a stack can also take into consideration possibility of mismatch between impedances and power levels.

In connection with FIGS. 21 and 22, it should be noted that the capacitors (2210, 2230, 2250) also provide DC blocking by preventing the applied signal (2270), which is connected to the output of the first stage (2110 in FIG. 21) of the two-stage WCDMA lineup (2150 in FIG. 21), from coupling with the FETs (2215), where such coupling can prevent the FETs from switching on and off. In this case, coupling between an output terminal (2275) and the FETs can be ignored because the output terminal (2275) is connected to an input of the second stage (2115 in FIG. 21), which is at a DC bias. Addition of DC blocking to prevent coupling between the output terminal (2275) to the FETs will lead to a physically larger tunable capacitor.

The tunable capacitor can be characterized by a target bank Q, which is an overall desired Q of the tunable capacitor. Resistance of the switches (2215) and capacitance of the capacitors (2210, 2230, 2250) determine Q of each stage (2225, 2245, 2265). Overall Q-factor in FIG. 22 is determined by a parallel combination of the individual stages (2225, 2245, 2265) and depends on which stages (2225, 2245, 2265) are switched on and which stages (2225, 2245, 2265) are switched off. As an example, each stage (2225, 2245, 2265) may have a unit Q-factor of 10 whereas the fixed capacitor $C_{fixed}$ (2205) generally has a higher unit Q-factor since no switch is connected with the fixed capacitor $C_{fixed}$ (2205). The target bank Q for the tunable capacitor may be, for instance, greater than 20.

Figure 23:
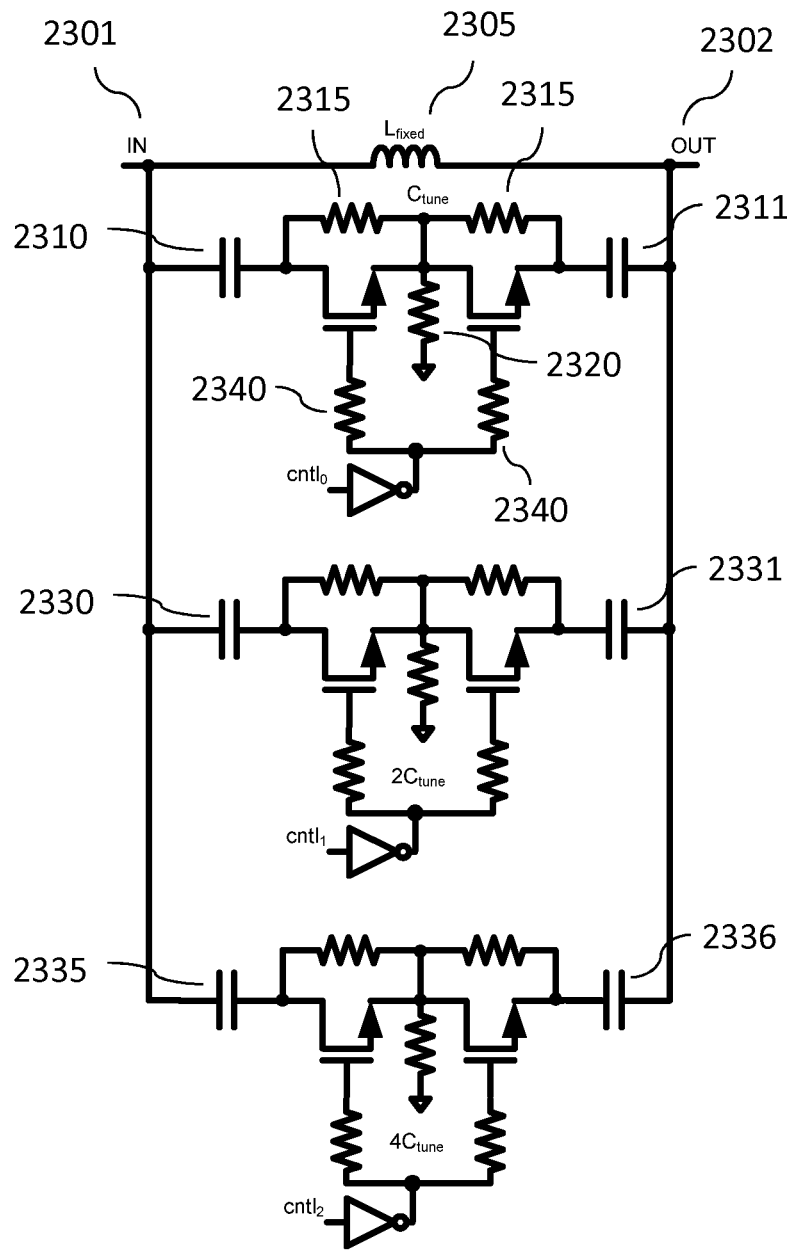
FIG. 23 shows an embodiment of a tunable inductor.

FIG. 23 shows an embodiment of a tunable inductor. The tunable inductor comprises a fixed inductor (2305) in parallel with a plurality of capacitors (2310, 2311, 2330, 2331, 2335, 2336). A gate resistor (2340) can be tied to each of one or more FETs in each stage of the tunable inductor. The result is a parallel LC circuit where the C is tunable (also known as programmable). Consequently, resonant frequency of the circuit of FIG. 23 can be adjusted.

Self resonant frequency of an inductor is frequency at which reactance of the parasitic capacitance of the inductor is equal to inherent inductive reactance of the inductor. Specifically, at higher frequencies, parasitic capacitances within the inductor begin to short out the inductor, thus reducing effective inductance of the inductor. At the self resonant frequency, the fixed inductor (2305) no longer acts like an inductor. Specifically, the impedance is inductive for $f<f_{SRF}$ and capacitive for $f>f_{SRF}$, where f is the operating frequency. To change the effective inductance of the fixed inductor (2305), capacitor value is changed by switching in or out capacitances. By moving the self resonant frequency, slope of the impedance curve at frequencies less than $f_{SRF}$ increases or decreases, and so the effective inductance at $f_o$ can be adjusted.

Equivalent capacitance of a first (2310, 2311), second (2330, 2331), and third (2335, 2336) pair of capacitors is given by $C_{tune}$, $2C_{tune}$, and $4C_{tune}$, respectively. The capacitors of each stage can be placed in a symmetric configuration, such as shown in FIG. 23, such that each capacitor takes half an applied voltage. The symmetry can also be utilized for issues such as second harmonics, which can be reduced through symmetric designs. By adjusting equivalent capacitance in the tunable inductor, inductance of the tunable inductor is changed and thus self resonant frequency of the tunable inductor may be altered. Such tuning of the tunable capacitor can be utilized to adjust the resonant frequency to a desired frequency.

Since one end of the fixed inductor (2305) is connected with a supply, the plurality of capacitors (2310, 2311, 2330, 2331, 2335, 2336) also provides DC blocking for the switching devices. The DC blocking prevents the switching devices from being coupled to signals (2301, 2302), where such coupling can prevent the switching devices from switching on and off. Specifically, the switching devices are generally switched on or off based primarily on control signals applied to the switching devices. Resistors (2315, 2320) pull drain and source of the FETs to DC ground so that the FETs can turn on (i.e., have $V_{gs}>V_{th}$) when control voltage applied at a gate of the FETs is in a high voltage state. Drain-to-source resistors (2315) for instance can be utilized in conjunction with gate resistors (2340) to aid in biasing the FET to which the resistors (2315, 2340) are connected.

As an example, consider that a minimum self resonant frequency of the tunable inductor is targeted at $2\times f_o$, where $f_o$ is operating frequency of the system. The factor 2 in $2\times f_o$ is arbitrary, and the factor is generally chosen such that the self resonant frequency is not insignificantly higher than the operating frequency. The minimum desired self resonant frequency affects range of inductance values designed for a tunable inductor. Peak effective inductance can be given at around half of the self resonant frequency of the inductor.

It should be noted that although binary weighting is used in both FIGS. 22 and 23, other weighting (such as non-base 2 exponential weighting or arbitrary weighting) may be used. Furthermore, although FIGS. 22 and 23 show a stack of two transistors (e.g., 2215), each stack of transistors can instead comprise only one transistor or can instead comprise more than two transistors. Number of transistors in the stacks depend on applied signals (e.g., 2270, 2301) and output signals (e.g., 2275, 2302) encountered by the stacks, which vary with application. In the case of FIG. 23, number of transistors in a stack is generally a function of voltages and currents generated at resonance.

It should be noted that tunable elements can also be utilized, for instance, in phase shifters. As is known by a person skilled in the art, a phase shift shows a difference in timing between an applied voltage and resulting current. Specifically, voltage leads current in an inductor by 90° whereas voltage lags current in a capacitor by 90°. Various devices such as filters, resonant tank circuits for oscillators, and matching networks may utilize such phase shifts.

Modulation schemes in digital communication systems can utilize I/Q modulation, where "I" refers to in-phase and "Q" refers to quadrature (90° phase). One such modulation scheme is quadrature-amplitude modulation (QAM). With both phase and amplitude information, higher data rates (than if only phase or only amplitude information is utilized) can be achieved for a given bandwidth. Systems such as digital subscriber lines (DSLs), code division multiple access (CDMA), and long term evolution (LTE) can also utilize such phase shifting.

In some cases, tunable reactances, including one or both of tunable capacitors and tunable inductors, may be utilized in devices such as filters and matching circuits in order to counteract process variations. To minimize attenuation, designs of the devices generally involve addition of numerous components, which increase complexity and insertion loss. Process variations, which lead to tolerance values, can exhibit themselves in each of capacitors, inductors, resistors, transistors, among other components, generally present in the tunable reactances. Process variations may also be present in any part of a system. For example, a cellular antenna or bandpass filter can be made in laminate boards and with components that have a specified accuracy tolerance. Accuracy tolerances vary from unit to unit, and such variations should generally be taken into consideration. Adjustments to the system can be made automatically under control of a tester.

"Unpredictability" refers to inability to predict exact value of a reactance for a first pass silicon. For example, although the process tolerance for an inductor may only be ±3% (so from wafer to wafer the inductor value will be $L_o \pm 0.03 L_o$), the $L_o$ value may be ±10-50% of a designed target value on the first pass silicon. Similarly, capacitors can have process tolerances of ±10% and have capacitance values significantly different from a designed target value on the first pass silicon. Tunable reactances provide a way to tune out both the process variation and unpredictability, thus improving chance of first pass success. For instance, a radio's performance may be affected by the process variation and unpredictability of any particular component, but such process variation and unpredictability can be tuned out through tunable components to realize a radio with its designed (nominal) performance.

The tunable reactances may comprise high power switches, which can be implemented as a plurality of stacked lower power switches, for switching in and out reactances. Tuning may be accomplished in an open loop based or close loop based implementation.

Figure 24A:
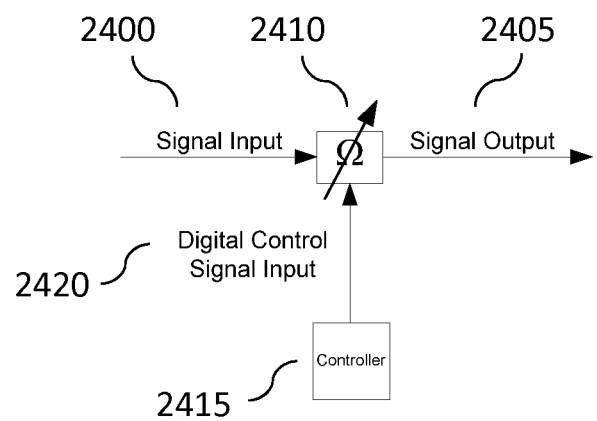
FIG. 24A shows an exemplary open loop implementation for tuning of devices.

An exemplary open loop implementation is shown in FIG. 24A. A signal input (2400) is provided to a tunable element (2410), which processes the signal input (2400) to acquire a signal output (2405). The tunable element (2410) can be adjusted in one or more of capacitance, inductance, and resistance values via a controller (2415). The tunable element (2410) can comprise any number of capacitors, inductors, and/or resistors. In the open loop implementation, a control signal (2420), also referred to as a tuning signal (2420), is based on a lookup table or previous calibration information. Specifically, the control signal (2420) is a function of frequency, power, and/or other parameters of the signal input (2400).

As a simple example, consider that the tunable element (2410) is low pass filter comprising a resistor of fixed resistance R and a tunable inductor of tunable inductance $L_{var}$ and that the signal input (2400) and signal output (2405) are voltages. A transfer function $T(j\omega)$ of the low pass filter is given by $T(j\omega) = (R/L_{var})/(j\omega + R/L_{var})$. Furthermore, consider that, in a particular application, it is desired that the transfer function remain constant regardless of operating frequency ω of the signal input (2400). In this example, as the frequency ω of the signal input (2400) changes from a frequency $\omega_1$ to a frequency $\omega_2$, the tunable inductance $L_{var}$ is adjusted accordingly such that $T(j\omega_1) = T(j\omega_2)$.

As another example, consider that the low pass filter needs to handle operating frequencies between 824 to 915 MHz. A third harmonic from 2472 to 2745 MHz (as well as higher harmonics) may affect operation of the low pass filter. Ability to place transmission zeros at one or more desired frequencies, even as the center frequency of the filter is changing, would improve performance. The tuning, therefore, should occur fast relative to rate (frequency) of incoming information from the signal input (2400) or rate of incoming packet frames associated with the signal input (2400). Specifically, with regards to the present example, if the tuning of the tunable element (2410) cannot follow the signal input (2400), the transmission zeros will not change sufficiently fast so as to remain at the same one or more desired frequencies.

Speed of the tuning is set by each system. For a radar system, the tuning may occur between radar pulses. In cellular phones, each system (including but not limited to GSM, CDMA, TD-SCDMA, and so forth) generally has a specification on startup, channel changing, pulse intervals, and so forth, and speed of the tuning is set based on the system specification.

Examples of placing transmission zeros are now provided. As one example, in radio system applications, a radio system is generally designed to pass or block certain frequencies, and performance at one frequency can affect performance at another frequency. With tunable elements, frequency response of the radio system can be better tuned to meet specifications, and placement of transmission zeros can aid in defining the blocking of certain frequencies. As another example, certain long term evolution (LTE) bands have a second harmonic sitting on a global positioning system (GPS) signal. When a system utilizes such LTE bands, consideration is made regarding how much power can be sent and will be sent to the frequencies associated with the GPS signal. The system is generally designed to minimize power that will leak into the GPS band. With tunable elements, a transmission zero can be placed at the frequency or frequencies associated with the GPS band (in addition to improving efficiency of actual pass band of the system).

As previously mentioned, another application of the tunable element (2410) is as a matching network. Specifically, signal input (2400) and signal output (2405) can refer to equivalent impedance of a first circuit and a second circuit or voltages from a first circuit and a second circuit. Since equivalent impedance of the first and second circuits is generally frequency dependent (i.e., not purely resistive), impedances of the tunable element (2410) may have to be adjusted according to changes in the operating frequency in order to perform impedance matching at a port connected with the first circuit and a port connected with the second circuit.

The open loop implementation can be used to remove process variation. Individual components such as inductors, capacitors, and integrated circuits are assembled to create an electronic end product. These individual components have variations from their nominal values, which can affect (generally adversely) performance of the end product. The end product itself can be designed to calibrate and store corrections to many of these process variations. This calibration and correction process typically takes place during final testing, where the end product is tested prior to shipment to customers.

Figure 24B:
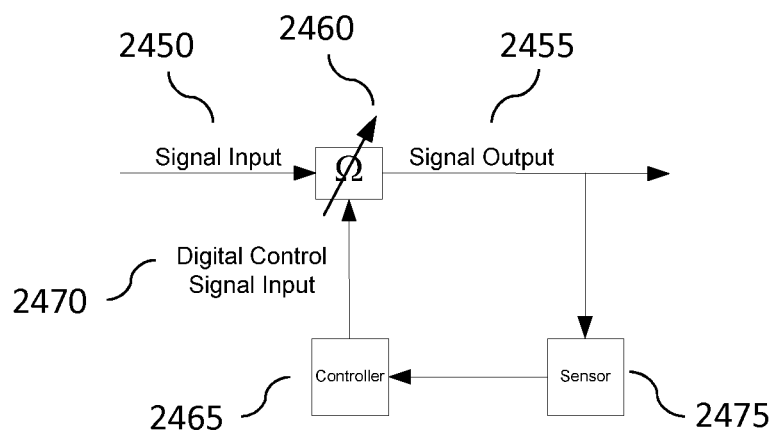
FIGS. 24B and 24C show exemplary closed loop implementations for tuning of devices.

FIG. 24B shows an exemplary closed loop implementation for tuning of devices. Signal input (2450) and signal output (2455) can refer to equivalent impedance of a first circuit and a second circuit or voltages from a first circuit and a second circuit. Impedances of a tunable element (2460) may be adjusted according to changes in the operating frequency as well as operating conditions (e.g., ambient temperature changes leading to changes in impedances of a device). A sensor (2475) can be utilized to analyze the signal output (2455) and generate information regarding adjustments to parameters needed to satisfy specifications. The sensor (2475) may also be utilized to, for instance, maximize power, signal attenuation (of a higher harmonic, for example), optimize efficiency, and minimize mismatch.

The information generated by the sensor (2475) can be provided to a controller (2465), which will generate a digital control signal input (2470) for adjustment of the tunable element (2460). The digital control signal input (2470) can be, for instance, the signals (615, 620, 625, 630, 635) shown in FIG. 6A, which are utilized to control which switches are on and which are off and, in turn, tune effective inductance. For the closed loop implementation, the end product will continuously calibrate and correct itself and will not need to be calibrated and the correction values stored as in the open loop implementation shown in FIG. 24A. It should be noted that the sensor (2475) and the controller (2465) need not be two distinct components and can instead be one component.

Figure 24C:
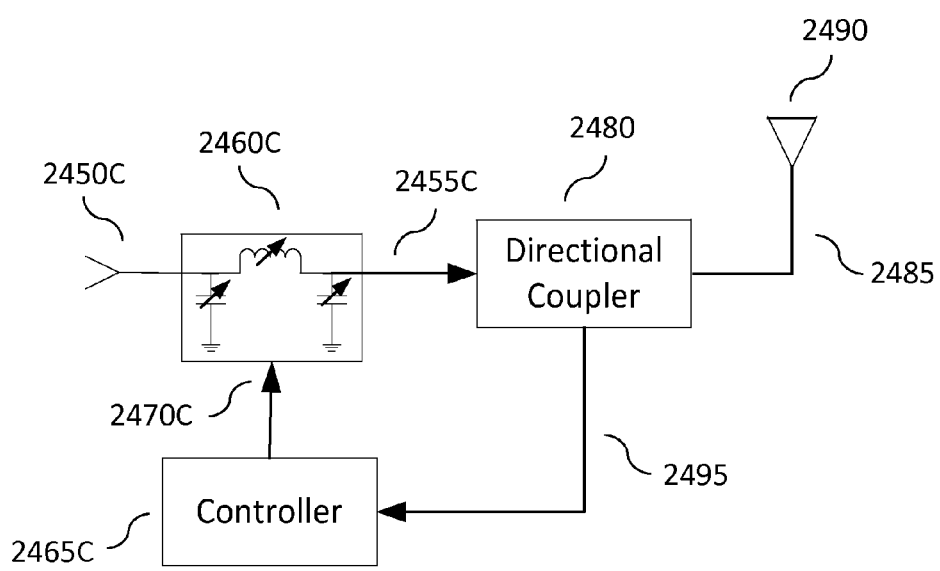

FIG. 24C shows a particular closed loop implementation for tuning of devices. Specifically, an input signal (2450C), such as that from a power amplifier, can be provided to a tunable element (2460C), which generates an output signal (2455C). The output signal (2455C) can be divided into a first component (2485) and second component (2495) by a directional coupler (2480). In general, the second component (2495) contains a smaller fraction of power of the output signal (2455C) than the first component (2485) and is utilized for monitoring response of the tunable element. Specifically, the second component (2495) can be monitored by a controller (2465C), which can adjust a digital control signal input (2470C) based on the analysis. Such adjustments of the digital control signal input (2470C) in turn adjust impedance of the tunable element (2460C). The first component (2485) can be, for instance, transmitted by an antenna (2490).

In both open and closed implementations, to control variation of passive components, tunable elements (such as tunable capacitors and tunable inductors) can be used to allow these passive component variations to be calibrated and corrected. Consider a cellular phone as a final product. Since the cellular phone utilizes dozens or hundreds of components, each component associated with its own manufacturing tolerance, all these tolerances can cause variation in the cellular phone's final performance. For example, a particular cellular phone may be designed to output 1 W of power, but a final test may yield that the cellular phone outputs 0.9 W of power. In such a case, the components in the cellular phone are adjusted so as to yield output power of 1 W. Consequently, use of tunable elements can allow the particular cellular phone to generate a desired output even in view of process variation and unpredictability.

Another example would be adjustment of the center frequency of a resonant circuit. For example, the final test on the cellular phone may show that a given channel exists at an incorrect frequency. A tunable element may be included in the cellular phone to adjust the cellular phone back to the correct frequency. Tunable capacitors and/or tunable inductors may be utilized in the cellular phone, where adjustments to the center frequency may be made via a microcontroller and information associated with these adjustments can be stored such that the cellular phone can return to the center frequency. Adjustments to other performance parameters of the final product can also be handled as well.

With reference to FIG. 23, for the tunable inductor, exemplary characteristics (with exemplary values) are programmable inductance range of 25% (i.e., minimum inductance of the tunable inductor is 25% lower than maximum inductance of the tunable inductor), inductor tolerance is around ±3%, and capacitor tolerance is around ±10%. This case can be referred to as "excess tunability" since programmable inductance range is 25% and summed tolerance of the fixed inductor (2305) and the fixed capacitors (2310, 2311, 2330, 2331, 2335, 2336) is 13%, yielding a net or "excess" tunability of 12%. The excess tunability can be used to improve performance of the interstage match, which in turn can yield improved frequency response, efficiency, and so forth.

As previously mentioned, field effect transistors (FETs) are utilized as switching devices in the previous discussions of various embodiments of tunable reactances. However, the present disclosure can also utilize other switching devices such as accumulated charge control field effect transistors, microelectromechanical system (MEMS) switches, diodes, diode connected bipolar junction transistors (BJTs), and other switching devices identifiable by a person skilled in the art.

Figure 25A:
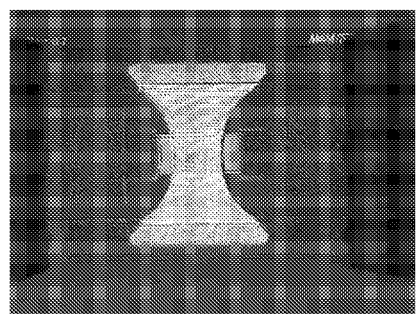
FIG. 25A shows a top view of an example microelectromechanical system (MEMS) switch that may be used in tunable reactances such as tunable inductors and tunable capacitors.
Figure 25B:
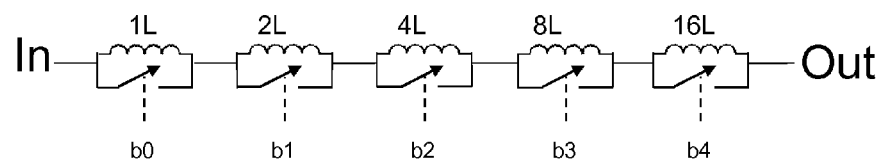
FIG. 25B shows an embodiment of a tunable inductor that utilizes MEMS switches.

A switch such as an MEMS switch shown in FIG. 25A may be utilized. For MEMS switches, $R_{on}$ and $C_{off}$ are generally low over the range of typical operating frequencies. A schematic of a MEMS switch-based tunable inductor is shown in FIG. 25B. MEMS switches are generally packaged in hermetic packages and involve higher voltages such as 30-50 V to activate. MEMS switches generally have high performance and may be utilized, for instance, in medical or instrumentation equipment.

As another example, in some embodiments, FETs can be implemented in accordance with improved process and integrated circuit design advancements developed by the assignee of the present application. One such advancement comprises the so-called "HaRP™" technology enhancements developed by the assignee of the present application. The HaRP enhancements provide for new RF architectures and improved linearity in RF front end solutions. FETs made in accordance with the HaRP enhancements are described in pending applications and patents owned by the assignee of the present application. For example, FETs made in accordance with the HaRP enhancements are described in U.S. Pat. No. 7,910,993, issued on Mar. 22, 2011, and U.S. Pat. No. 8,129,787, issued on Mar. 6, 2012, both of which are entitled "Method and Apparatus for use in Improving Linearity of MOSFETs Using an Accumulated Charge Sink"; and in pending U.S. patent application Ser. No. 13/277,108, filed on Oct. 19, 2011, and Ser. No. 13/412,529, filed on Mar. 5, 2012. Disclosures in each of U.S. Pat. Nos. 7,910,993 and 8,129,787 as well as pending U.S. patent application Ser. Nos. 13/277,108 and 13/412,529 are incorporated herein by reference in its entirety.

Figure 26:
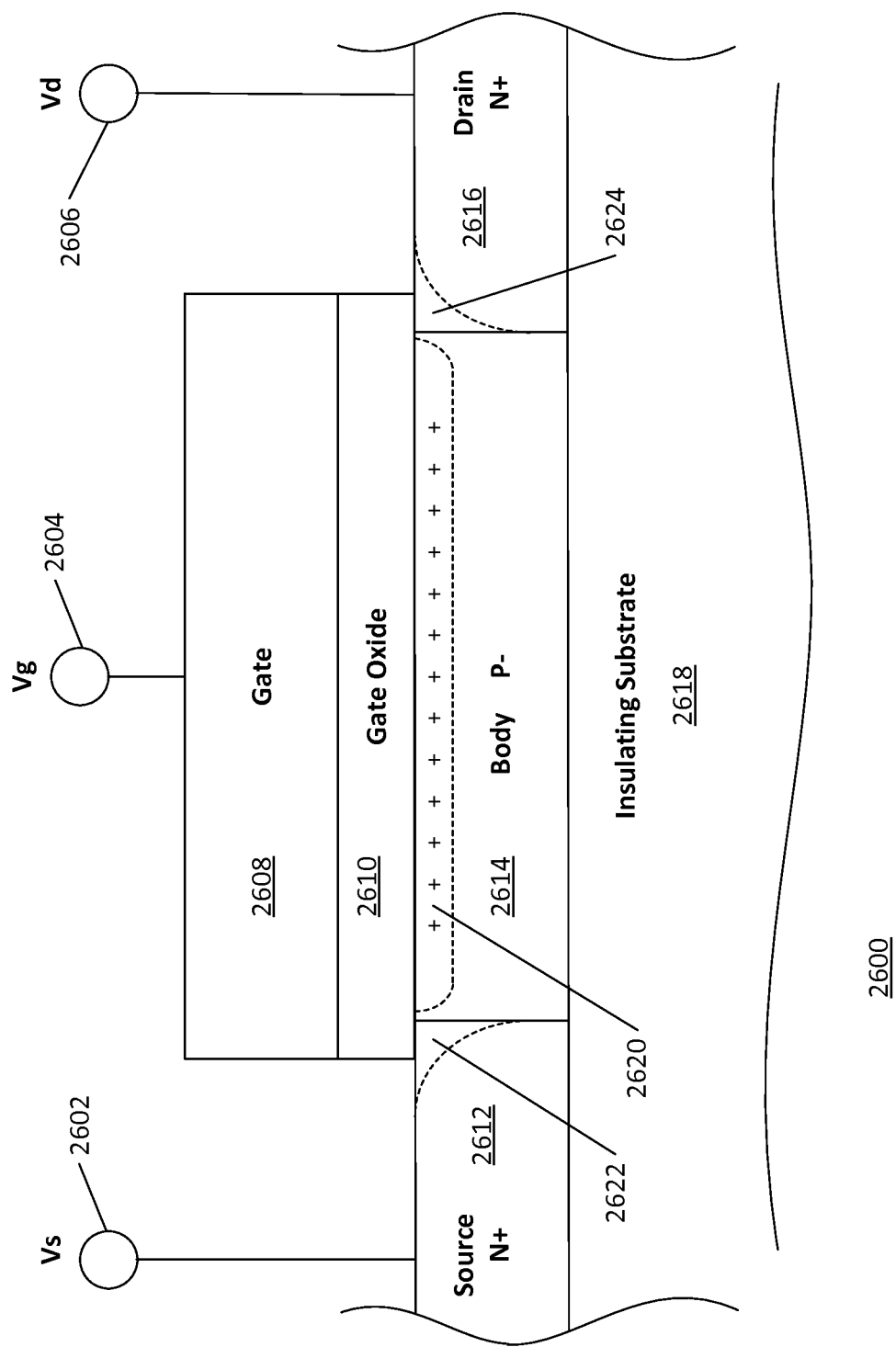
FIG. 26 is a cross-sectional view of an exemplary SOI NMOSFET.

As is well known, a MOSFET employs a gate-modulated conductive channel of n-type or p-type conductivity, and is accordingly referred to as an NMOSFET or PMOSFET, respectively. FIG. 26 shows a cross-sectional view of an exemplary SOI NMOSFET (2600). As shown in FIG. 26, the exemplary SOI NMOSFET (2600) includes an insulating substrate (2618) that may comprise a buried oxide layer, sapphire, or other insulating material. A source (2612) and drain (2616) of the NMOSFET (2600) comprise N+ regions (i.e., regions that are heavily doped with an "n-type" dopant material) produced by ion implantation into a silicon layer positioned above the insulating substrate (2618). (The source and drain of PMOSFETs comprise P+ regions (i.e., regions heavily doped with "p-type" dopant material)). The body (2614) comprises a P-region (i.e., a region that is lightly doped with a "p-type" dopant), produced by ion implantation, or by dopants already present in the silicon layer when it is formed on the insulating substrate (2618). As shown in FIG. 26, the NMOSFET (2600) also includes a gate oxide (2610) positioned over the body (2614). The gate oxide (2610) typically comprises a thin layer of an insulating dielectric material such as $SiO_2$. The gate oxide (2610) electrically insulates the body (2614) from a gate (2608)

positioned over the gate oxide (2610). The gate (2608) comprises a layer of metal or, more typically, polysilicon.

A source terminal (2602) is operatively coupled to the source (2612) so that a source bias voltage "Vs" may be applied to the source (2612). A drain terminal (2606) is operatively coupled to the drain (2616) so that a drain bias voltage "Vd" may be applied to the drain (2616). A gate terminal (2604) is operatively coupled to the gate (2608) so that a gate bias voltage "Vg" may be applied to the gate (2608).

As is well known, for an enhancement mode MOSFET, for example, the gate bias creates a so-called "inversion channel" in a channel region of the body (2614) under the gate oxide (2610). The inversion channel comprises carriers having the same polarity (e.g., "P" polarity (i.e., hole carriers), or "N" polarity (i.e., electron carriers) carriers) as the polarity of the source and drain carriers, and it thereby provides a conduit (i.e., channel) through which current passes between the source and the drain. For example, as shown in the SOI NMOSFET (2600) of FIG. 26, when a sufficiently positive voltage is applied between the gate (2608) and the source (2612) (i.e. a positive gate bias exceeding a threshold voltage Vth), an inversion channel is formed in the channel region of the body (2614). As noted above, the polarity of carriers in the inversion channel is identical to the polarity of carriers in the source and drain. In this example, because the source and drain comprise "n-type" dopant material and therefore have N polarity carriers, the carriers in the channel comprise N polarity carriers. Similarly, because the source and drain comprise "p-type" dopant material in PMOSFETs, the carriers in the channel of turned on (i.e., conducting) PMOSFETs comprise P polarity carriers.

As is well known, depletion mode MOSFETs operate similarly to enhancement mode MOSFETs; however, depletion mode MOSFETs are doped so that a conducting channel exists even without a voltage being applied to the gate. When a voltage of appropriate polarity is applied to the gate, the channel is depleted. This, in turn, reduces the current flow through the deletion mode device. Both enhancement and depletion mode MOSFETs have a gate voltage threshold, $V_{th}$, at which the MOSFET changes from an off-state (non-conducting) to an on-state (conducting).

As described in the disclosures of U.S. Pat. Nos. 7,910,993 and 8,129,787 as well as pending U.S. patent application Ser. Nos. 13/277,108 and 13/412,529, no matter what mode of operation an SOI MOSFET employs (i.e., whether enhancement or depletion mode), when the MOSFET is operated in an off-state (i.e., the gate voltage does not exceed $V_{th}$), and when a sufficient nonzero gate bias voltage is applied with respect to the source and drain, an "accumulated charge" may occur under the gate. The "accumulated charge", as defined in more detail below and in the disclosures of U.S. Pat. Nos. 7,910,993 and 8,129,787 as well as pending U.S. patent application Ser. Nos. 13/277,108 and 13/412,529, is similar to the "accumulation charge" described in the literature in reference to MOS capacitors. However, the literature describes "accumulation charge" as referring only to bias-induced charge existing under a MOS capacitor oxide, where the accumulation charge is of the same polarity as the majority carriers of the semiconductor material under the capacitor oxide. In contrast, and as described below in more detail, "accumulated charge" is used herein to refer to gate-bias induced carriers that may accumulate in the body of an off-state MOSFET, even if the majority carriers in the body do not have the same polarity as the accumulated charge. This situation may occur, for example, in an off-state depletion mode NMOSFET, where the accumulated charge may comprise holes (i.e., having P polarity) even though the body doping is N− rather than P−.

For example, as shown in FIG. 26, when the SOI NMOSFET (2600) is biased to operate in an off-state, and when a sufficient nonzero voltage is applied to the gate (2608), an accumulated charge (2620) may accumulate in the body (2614) underneath and proximate the gate oxide (2610). The operating state of the SOI NMOSFET (2600) shown in FIG. 26 is referred to herein as an "accumulated charge regime" of the MOSFET. The accumulated charge regime is defined in more detail below. The causes and effects of the accumulated charge in SOI MOSFETs are now described in more detail.

As is well known, electron-hole pair carriers may be generated in MOSFET bodies as a result of several mechanisms (e.g., thermal, optical, and band-to-band tunneling electron-hole pair generation processes). When electron-hole pair carriers are generated within an NMOSFET body, for example, and when the NMOSFET is biased in an off-state condition, electrons may be separated from their hole counterparts and pulled into both the source and drain. Over a period of time, assuming the NMOSFET continues to be biased in the off-state, the holes (resulting from the separated electron-hole pairs) may accumulate under the gate oxide (i.e., forming an "accumulated charge") underneath and proximate the gate oxide. A similar process (with the behavior of electrons and holes reversed) occurs in similarly biased PMOSFET devices. This phenomenon is now described with reference to the SOI NMOSFET (2600) of FIG. 26.

When the SOI NMOSFET (2600) is operated with gate, source, and drain bias voltages that deplete the channel carriers in the body (2614) (i.e., the NMOSFET (2600) is in the off-state), holes may accumulate underneath and proximate the gate oxide (2610). For example, if the source bias voltage Vs and the drain bias voltage Vd are both zero (e.g., connected to a ground contact, not shown), and the gate bias voltage Vg comprises a sufficiently negative voltage with respect to ground and with respect to $V_{th}$, holes present in the body (2614) become attracted to the channel region proximate the gate oxide (2610). Over a period of time, unless removed or otherwise controlled, the holes accumulate underneath the gate oxide (2610) and result in the accumulated charge (2620) shown in FIG. 26. The accumulated charge (2620) is therefore shown as positive "+" hole carriers in FIG. 26. In the example given, Vg is negative with respect to Vs and Vd, so electric field regions (2622) and (2624) may also be present.

An accumulated charge regime is defined as follows. The accumulated charge is opposite in polarity to the polarity of carriers in the channel. Because, as described above, the polarity of carriers in the channel is identical to the polarity of carriers in the source and drain, the polarity of the accumulated charge (2620) is also opposite to the polarity of carriers in the source and drain. For example, under the operating conditions described above, holes (having "P" polarity) accumulate in off-state NMOSFETs, and electrons (having "N" polarity) accumulate in off-state PMOSFETs. Therefore, a MOSFET device is defined herein as operating within the "accumulated charge regime" when the MOSFET is biased to operate in an off-state, and when carriers having opposite polarity to the channel carriers are present in the channel region. Stated in other terms, a MOSFET is defined as operating within the accumulated charge regime when the MOSFET is biased to operate in an off-state, and when carriers are present in the channel region having a polarity that is opposite the polarity of the source and drain carriers.

For example, and referring again to FIG. 26, the accumulated charge (2620) comprises hole carriers having P or "+" polarity. In contrast, the carriers in the source, drain, and channel (i.e., when the FET is in the on-state) comprise electron carriers having N or "−" polarity. The SOI NMOSFET (2600) is therefore shown in FIG. 26 as operating in the accumulated charge regime. It is biased to operate in an off-state, and an accumulated charge (2620) is present in the channel region. The accumulated charge (2620) is opposite in polarity (P) to the polarity of the channel, source, and drain carriers (N).

In another example, wherein the SOI NMOSFET (2600) comprises a depletion mode device, $V_{th}$ is negative by definition. According to this example, the body (2614) comprises an N− region (as contrasted with the P− region shown in FIG. 26). The source and drain comprise N+ regions similar to those shown in the enhancement mode MOSFET (2600) of FIG. 26. For Vs and Vd both at zero volts, when a gate bias Vg is applied that is sufficiently negative relative to $V_{th}$ (for example, a Vg that is more negative than approximately −1 V relative to $V_{th}$), the depletion mode NMOSFET is biased into an off-state. If biased in the off-state for a sufficiently long period of time, holes may accumulate under the gate oxide and thereby comprise the accumulated charge (2620) shown in FIG. 26.

In other examples, Vs and Vd may comprise nonzero bias voltages. In some embodiments, Vg must be sufficiently negative to both Vs and Vd (in order for Vg to be sufficiently negative to $V_{th}$, for example) in order to bias the NMOSFET in the off-state. Those skilled in the MOSFET device design arts shall recognize that a wide variety of bias voltages may be used to practice the present teachings. As described below in more detail, the present disclosed methods and apparatuses contemplate use in any SOI MOSFET device biased to operate in the accumulated charge regime.

Figure 30A:
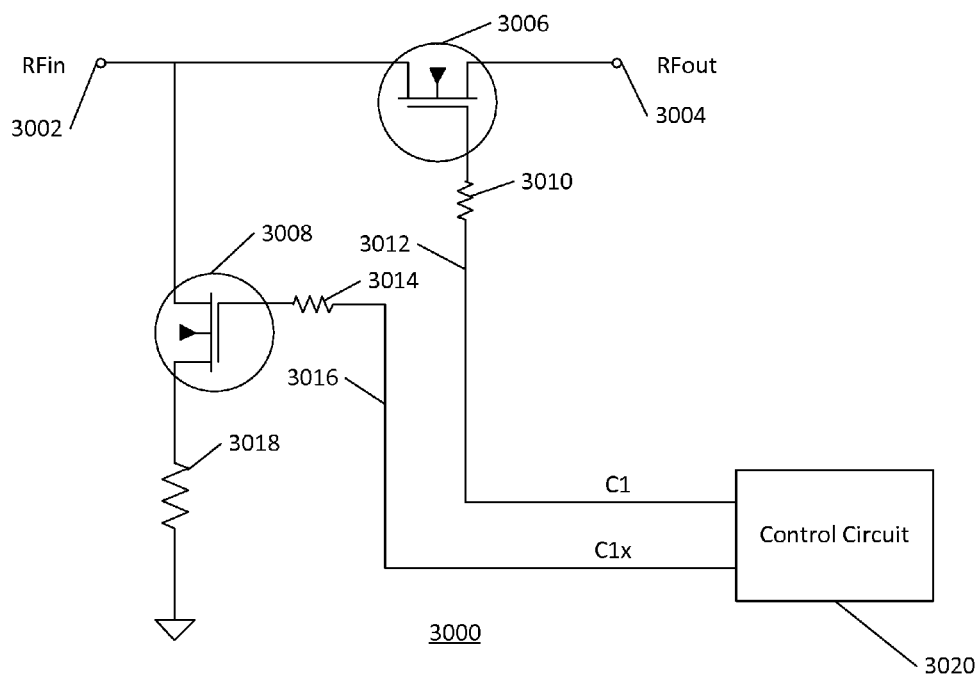
FIG. 30A is a schematic of an exemplary single pole, single throw (SPST) RF switch circuit.

SOI and SOS MOSFETs are often used in applications in which operation within the accumulated charge regime adversely affects MOSFET performance. As described below in more detail, unless the accumulated charge is removed or otherwise controlled, it detrimentally affects performance of SOI MOSFETs under certain operating conditions. One exemplary application, described below in more detail with reference to the circuits shown in FIGS. 27B and 30A, is the use of SOI MOSFETs in the implementation of radio frequency (RF) switching circuits. It has been discovered that unless the accumulated charge is removed or otherwise controlled, under some operating conditions, the accumulated charge adversely affects the linearity of the SOI MOSFET and thereby increases harmonic distortion and intermodulation distortion (IMD) caused by the MOSFET when used in the implementation of certain circuits. In addition, it has been discovered that removal or control of the accumulated charge improves the drain-to-source breakdown voltage (i.e., the "BVDSS") characteristics of the SOI MOSFETs.

Figure 27A:
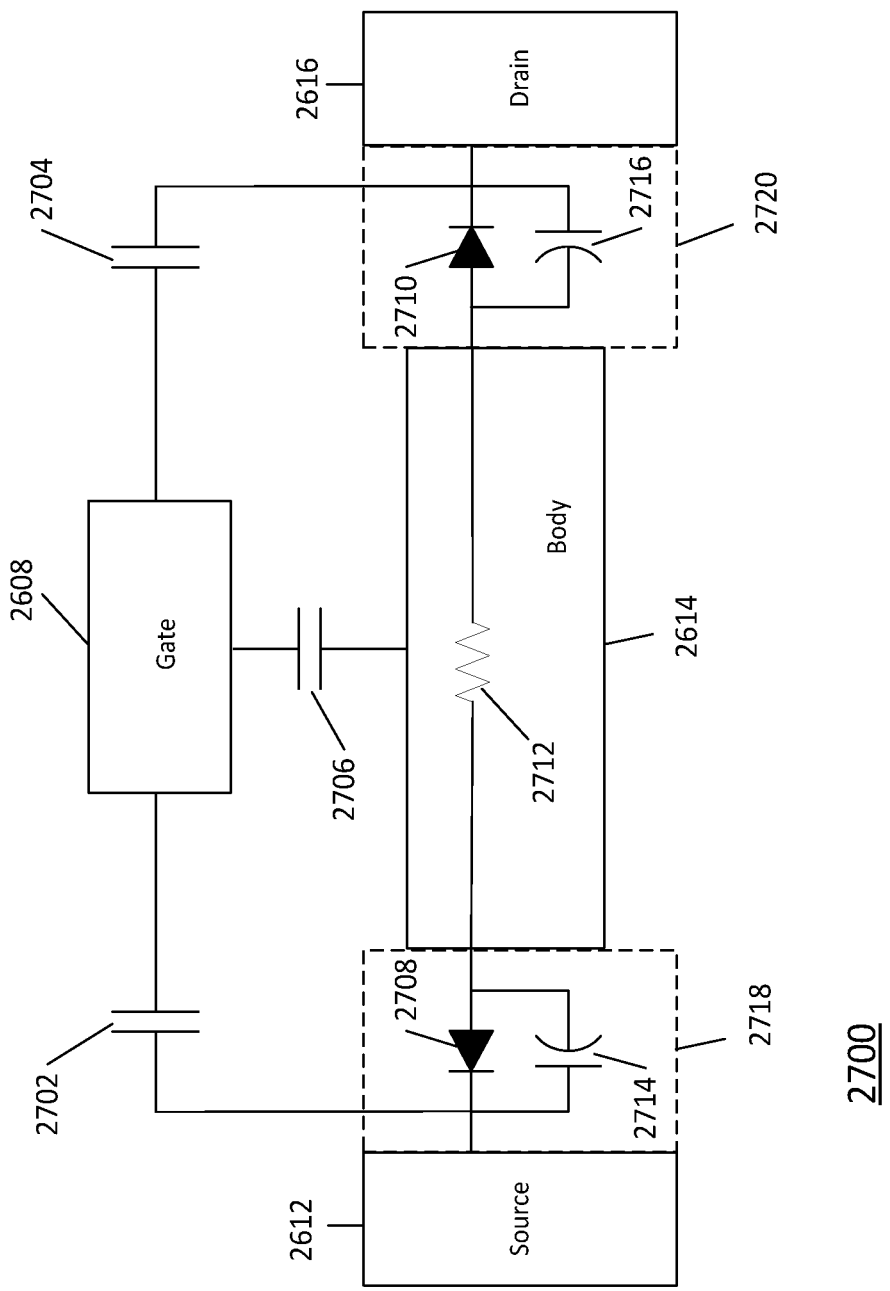
FIG. 27A is a simplified schematic of an electrical model showing the off-state impedance characteristics of the exemplary SOI NMOSFET of FIG. 26.
Figure 27B:
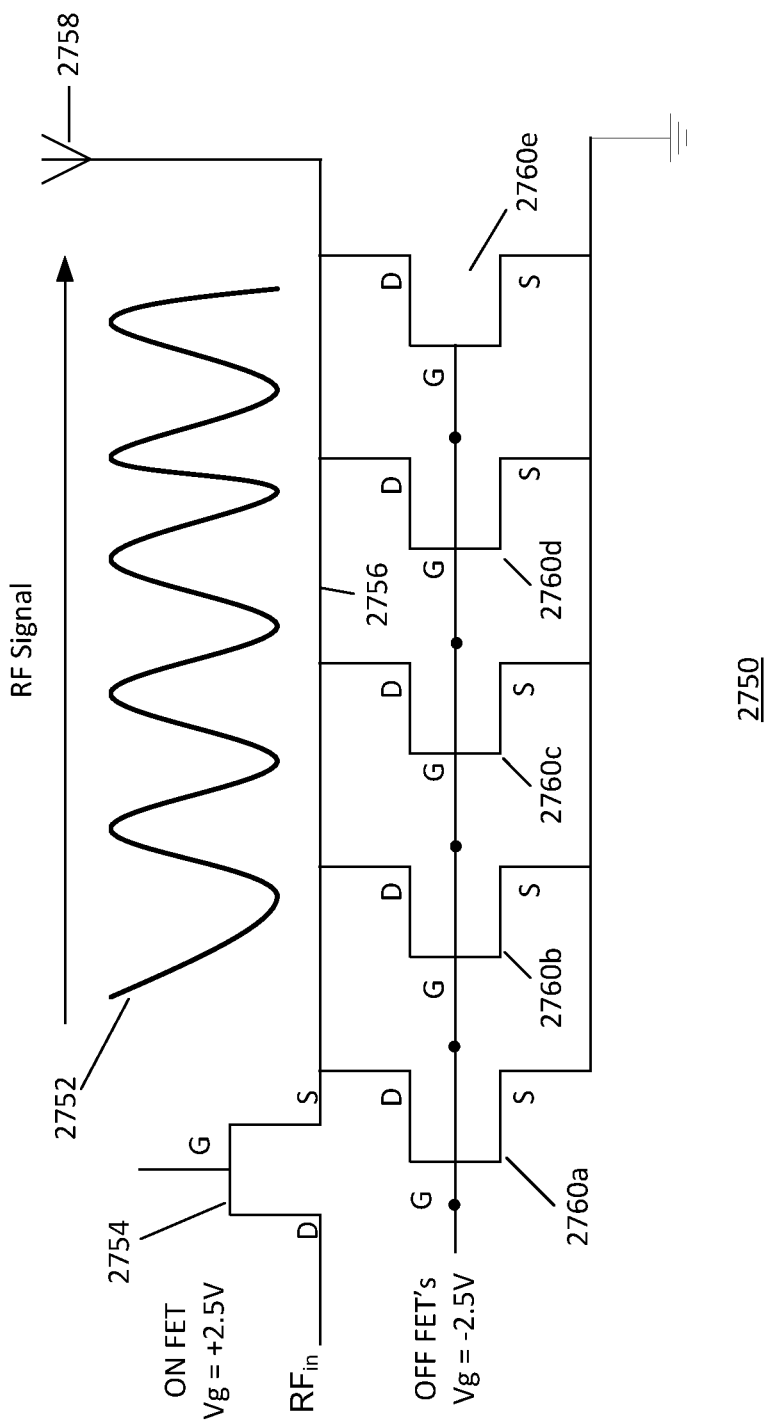
FIG. 27B is a schematic of an exemplary simplified radio frequency (RF) switching circuit implemented using SOI MOSFETs such as the SOI NMOSFET of FIG. 26.

FIG. 27A is a simplified schematic of an electrical model (2700) showing off-state impedance (or conversely, conductance) characteristics of the exemplary SOI NMOSFET (2600) of FIG. 26. More specifically, the model (2700) shows the impedance characteristics from the source (2612) to the drain (2616) when the NMOSFET (2600) is operated in the off-state. Because the drain-to-source off-state impedance characteristic of the NMOSFET (2600) is primarily capacitive in nature, it is referred to herein as the drain-to-source off-state capacitance $C_{off}$.

When the NMOSFET (2600) is in the off-state, and when the accumulated charge (2620) shown in FIG. 26 is not present in the body (2614) (i.e., the NMOSFET (2600) is not operating within the accumulated charge regime), the body (2614) is depleted of charge carriers. In this case the body impedance (2712) is analogous to the impedance of an insulator, and the electrical conductance through the body (2614) is very small (i.e., the NMOSFET (2600) is in the off-state). Consequently, the principal contributions to the drain-to-source off-state capacitance $C_{off}$ are provided by capacitors (2702) and (2704), where capacitor (2702) represents capacitance between the source (2612) and the gate (2608) and capacitance (2704) represents capacitance between the drain (2616) and the gate (2608).

However, when the NMOSFET (2600) operates within the accumulated charge regime, and the accumulated charge (2620) is therefore present in the body (2614), mobile holes comprising the accumulated charge produce p-type conductivity between source-body junction (2718) and drain-body junction (2720). In effect, the accumulated charge (2620) produces an impedance between the junctions in the absence of the accumulated charge. If a Vds voltage is applied between the drain (2616) and the source (2612), the mobile holes redistribute according to the electrical potentials that result within the body (2614). DC and low-frequency current flow through the SOI NMOSFET (2600) is prevented by the diode properties of the source-body junction (2718) and the drain-body junction (2720), as represented by junction diodes (2708) and (2710), respectively. That is, because the junction diodes (2708) and (2710) are anti-series (i.e., "back-to-back") in this case, no DC or low-frequency currents flow through the SOI NMOSFET (2600). However, high-frequency currents may flow through the SOI NMOSFET (2600) via the capacitances of the source-body junction (2718) and the drain-body junction (2720), as represented by junction capacitors (2714) and (2716), respectively.

Voltage dependencies of the junction capacitors (2714) and (2716), the gate-to-source (2702) and gate-to-drain capacitors (2704), and a direct capacitance (not shown) between the source (2612) and the drain (2616), cause nonlinear behavior in off-state capacitance $C_{off}$ of the MOSFET when AC voltages are applied to the NMOSFET (2600), thereby producing undesirable generation of harmonic distortions and intermodulation distortion (IMD). The relative contributions of these effects are complex, and depend on fabrication processes, biases, signal amplitudes, and other variables. However, those skilled in the electronic device design arts shall understand from the teachings below that reducing, removing, or otherwise controlling the accumulated charge provides an overall improvement in the nonlinear behavior of $C_{off}$. In addition, because the body impedance (2712) is significantly decreased in the presence of the accumulated charge (2620), the magnitude of $C_{off}$ may be increased when the FET operates in the accumulated charge regime. Reducing, removing, or otherwise controlling the accumulated charge also mitigates this effect.

A description of how non-linear behavior of the off-state capacitance $C_{off}$ of an exemplary MOSFET, such as shown in FIG. 26, adversely affects RF switch characteristics is described with reference to FIG. 27B. FIG. 27B illustrates an exemplary simplified RF switching circuit (2750) implemented using MOSFETS such as the SOI NMOSFET (2600) described above with reference to FIG. 26. A detailed description of the operation and implementation of RF switch circuits is provided in commonly assigned U.S. Pat. No. 6,804,502 which is hereby incorporated herein by reference in its entirety for its teachings of RF switch circuits. As shown in FIG. 27B, the RF switch (2750) includes a single "pass" or "switching" MOSFET (2754) operatively coupled to five shunting MOSFETS (2760a-2760e).

The MOSFET (2754) acts as a pass or switching transistor and is configured, when enabled, to selectively couple an RF input signal (applied to its drain, for example) to an RF antenna (2758) via a transmission path (2756). The shunting MOSFETs (2760a-2760e), when enabled, act to alternatively shunt the RF input signal to ground. As is well known, the switching MOSFET (2754) is selectively controlled by a first switch control signal (not shown) coupled to its gate, and the shunting MOSFETs (2760a-2760e) are similarly controlled by a second switch control signal (not shown) coupled to their gates. The switching MOSFET (2754) is thereby enabled by applying a gate bias voltage of +2.5 V (via the first switch control signal). The shunting MOSFETs (2760a-2760e) are disabled by applying a gate bias voltage of −2.5 V (via the second switch control signal).

When the switch (2750) is configured in this state, the RF signal (2752) propagates through the switching MOSFET (2754), through the transmission path (2756), and to the antenna (2758). As described above with reference to FIG. 27A, when the shunting MOSFETs (2760a-2760e) comprise SOI (or SOS) MOSFETs, such as the SOI NMOSFET (2600) of FIG. 26, an accumulated charge can form in the SOI MOSFET bodies (i.e., when the SOI MOSFETs operate in the accumulated charge regime as described above). The accumulated charge can produce nonlinear behavior in the off-state capacitance $C_{off}$ of the SOI MOSFETs when AC voltages are applied to the MOSFETs.

More specifically, when the accumulated charge is present in the channel regions of the off-state SOI MOSFETs (2760a-2760e), it responds to variations in the RF signals applied to their respective drains. As the time varying RF signal propagates along the transmission path (2756), the RF signal applies time varying source-to-drain bias voltages to the SOI MOSFETs (2760a-2760e). The time varying source-to-drain bias voltages creates movement of the accumulated charge within the channel regions of the SOI MOSFETs (2760a-2760e). The movement of the accumulated charge within the channel regions of the SOI MOSFETs causes variations in the drain-to-source off-state capacitance of the SOI MOSFETs (2760a-2760e). More specifically, the movement of the accumulated charge within the channel regions causes a voltage dependence of the drain-to-source off-state capacitance as described above with reference to FIG. 27A. The voltage dependent variations of the off-state capacitance of the SOI MOSFETs (2760a-2760e) is the dominant cause of harmonic distortion and IMD of the RF signal as it propagates through the RF switch (2750). In addition, as is well known, presence of an accumulated charge in the bodies of floating body (e.g., SOI) MOSFETs can also adversely affect the drain-to-source breakdown voltage (BVDSS) performance characteristics of the floating body MOSFETs.

No matter what mode of operation the MOSFET employs (i.e., enhancement mode or depletion mode), under some circumstances, when a MOSFET is operated in an off-state with a nonzero gate bias voltage applied with respect to the source and drain, an accumulated charge may occur under the gate. When the MOSFET is in an off-state, and when carriers are present in the channel region having a polarity that is opposite the polarity of the source and drain carriers, the MOSFET is defined herein as operating in the accumulated charge regime.

Note that the accumulated charge does not accumulate in the body in an instant as soon as the FET transitions from an on-state (conducting state) to an off-state (non-conducting state). Rather, when the FET transitions from the on-state to the off-state, it begins to accumulate charge in the body of the MOSFET, and the amount of accumulated charge increases over time. The accumulation of the accumulated charge therefore has an associated time constant (i.e., it does not instantly reach a steady-state level of accumulated charge). The accumulated charge accumulates slowly in the FET body. The depleted FET has a $C_{off}$ associated with it which is increased with an increasing amount of accumulated charge. In terms of FET performance, as the $C_{off}$ increases with an increasing amount of accumulated charge in the FET body, drift occurs in the FET insertion loss (i.e., the FET becomes more "lossy"), isolation (the FET becomes less isolating), and insertion phase (delay in the FET is increased). Reducing, removing, or otherwise controlling the accumulated charge also mitigates these undesirable drift effects.

Methods and apparatuses for improving semiconductor device linearity (e.g., reducing adverse harmonic distortion and IMD effects) in SOI MOSFETs are described below in more detail. In one exemplary embodiment, the method and apparatus improves the linearity and controls the harmonic distortion and IMD effects of the MOSFET devices by reducing the accumulated charge in the bodies of the MOSFET devices. The accumulated charge in the MOSFET bodies is controlled or removed using an accumulated charge sink (ACS) that is operatively coupled to the MOSFET body. In one embodiment, the present method and apparatus entirely removes all of the accumulated charge from the bodies of the MOSFET devices. In one described embodiment, the MOSFET is biased to operate in an accumulated charge regime, and the ACS is used to entirely remove, reduce, or otherwise control the accumulated charge and thereby reduce harmonic distortions and IMD that would otherwise result. Linearity is also improved in some embodiments by removing or otherwise controlling the accumulated charge thereby improving floating body MOSFET BVDSS characteristics.

It is noted that persons skilled in the electronic device design and manufacture arts shall appreciate that the teachings herein apply equally to MOSFETs fabricated on Semiconductor-On-Insulator ("SOI") and Semiconductor-On-Sapphire ("SOS") substrates. The present teachings can be used in the implementation of MOSFETs using any convenient semiconductor-on-insulator technology. For example, the MOSFETs described herein can be implemented using compound semiconductors fabricated on insulating substrates, such as GaAs MOSFETs. The present method and apparatus may also be applied to silicon-germanium (SiGe) SOI MOSFETs. For simplicity, many examples presented herein for illustrative purposes include only NMOSFETs, unless otherwise noted. By making well known changes to dopants, charge carriers, polarity of bias voltages, etc., persons skilled in the electronic device design arts will easily understand how these embodiments and examples may be adapted for use with PMOSFETs.

Figures 28A, 28B:
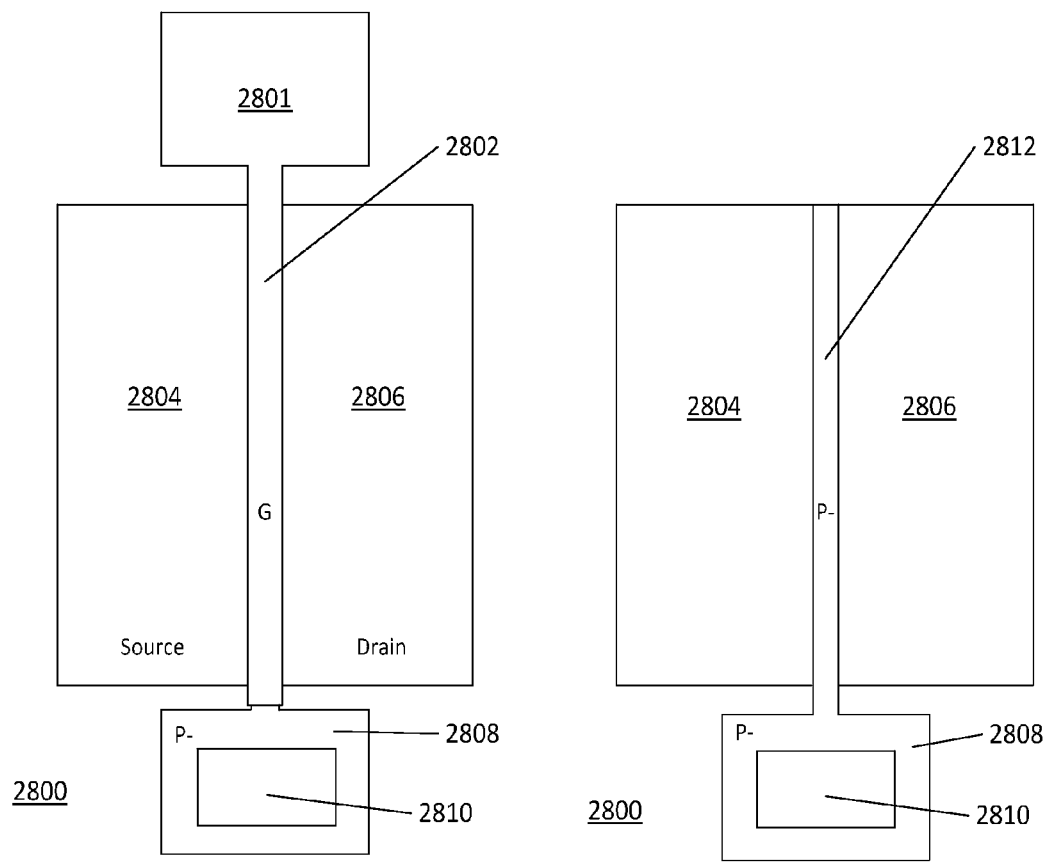
FIGS. 28A and 28B are simplified schematic diagrams of a top view of an SOI NMOSFET adapted to control accumulated charge.

FIGS. 28A and 28B are simplified schematic diagrams of a top view of an Accumulated Charge Control (ACC) SOI NMOSFET (2800) adapted to control accumulated charge (2620) of FIG. 26. In the exemplary embodiment, a gate contact (2801) is coupled to a first end of a gate (2802). A gate oxide (not shown in FIG. 28A but shown in FIG. 26) and a body (2812) (shown in FIG. 28B) are positioned under the gate (2802). In the exemplary NMOSFET (2800) shown, a source (2804) and a drain (2806) comprise N+ regions. In the exemplary embodiment, the ACC NMOSFET (2800) includes an accumulated charge sink (ACS) (2808) comprising a P− region. The ACS (2808) is coupled to and is in electrical communication with the body (2812) which also comprises a P− region. An electrical contact region (2810) provides electrical connection to the ACS (2808). In some embodiments, the electrical contact region (2810) comprises a P+ region. As shown in FIG. 28A, the electrical contact region (2810) is coupled to and is in electrical communication with the ACS (2808).

In one example, the ACS (2808) operates effectively to remove or otherwise control the accumulated charge from the SOI NMOSFET (2800) using a high impedance connection to and throughout the body (2812). High impedance ACSs may be used because the accumulated charge (2620) is primarily generated by phenomena (e.g., thermal generation) that take a relatively long period of time to produce significant accumulated charge. For example, a typical time period for producing non-negligible accumulated charge when the NMOSFET operates in the accumulated charge regime is approximately a few milliseconds or greater. Such relatively slow generation of accumulated charge corresponds to very low currents, typically less than 100 nA/mm of transistor width. Such low currents can be effectively conveyed even using very high impedance connections to the body. According to one example, the ACS (2808) is implemented with a connection having a resistance of greater than $10^6 \Omega$. Consequently, the ACS (2808) is capable of effectively removing or otherwise controlling the accumulated charge (2620) even when implemented with a relatively high impedance connection, relative to the low impedance body contacts.

Those skilled in the arts of electronic devices shall understand that the electrical contact region (2810) may be used to facilitate electrical coupling to the ACS (2808) because in some embodiments it may be difficult to make a direct contact to a lightly doped region. In addition, in some embodiments the ACS (2808) and the electrical contact region (2810) may be coextensive. In another embodiment, the electrical contact region (2810) comprises an N+ region. In this embodiment, the electrical contact region (2810) functions as a diode connection to the ACS (2808), which prevents positive current flow into the ACS (2808) (and also prevents positive current flow into the body (2812)) under particular bias conditions, as described below in more detail.

FIG. 28B is an alternative top view of the ACC SOI NMOSFET (2800) of FIG. 28A, illustrating the ACC NMOSFET (2800) without its gate contact (2801), gate (2802), and gate oxide being visible. This view allows the body (2812) to be visible. FIG. 28B shows the coupling of the ACS (2808) to one end of the body (2812). In one embodiment, the body (2812) and the ACS (2808) comprise a combined P− region that may be produced by a single ion-implantation step. In another embodiment, the body (2812) and ACS (2808) comprise separate P− regions that are coupled together.

As is well known to those skilled in the electronic device design arts, in other embodiments, the ACC NMOSFET (2800) of FIGS. 28A and 28B can be implemented as an ACC PMOSFET simply by reversing the dopant materials used to implement the various FET component regions (i.e., replace p-type dopant material with n-type dopant material, and vice versa). More specifically, in an ACC PMOSFET, the source and drain comprise P+ regions, and the body comprises an N− region. In this embodiment, the ACS (2808) also comprises an N− region. In some embodiments of the ACC PMOSFET, the electrical contact region (2810) may comprise an N+ region. In other embodiments of the ACC PMOSFETs, the region (2810) comprises a P+ region, which functions as a diode connection to the ACS (2808) and thereby prevents current flow into the ACS (2808) under particular bias conditions.

As previously mentioned, applications such as RF switch circuits may use SOI MOSFETs operated with off-state bias voltages, for which accumulated charge may result. The SOI MOSFETs are defined herein as operating within the accumulated charge regime when the MOSFETs are biased in the off-state, and when carriers having opposite polarity to the channel carriers are present in the channel regions of the MOSFETs. In some embodiments, the SOI MOSFETs may operate within the accumulated charge regime when the MOSFETs are partially depleted yet still biased to operate in the off-state. Significant benefits in improving nonlinear effects on source-drain capacitance can be realized by removing or otherwise controlling the accumulated charge according to the present teachings.

Figure 28C:
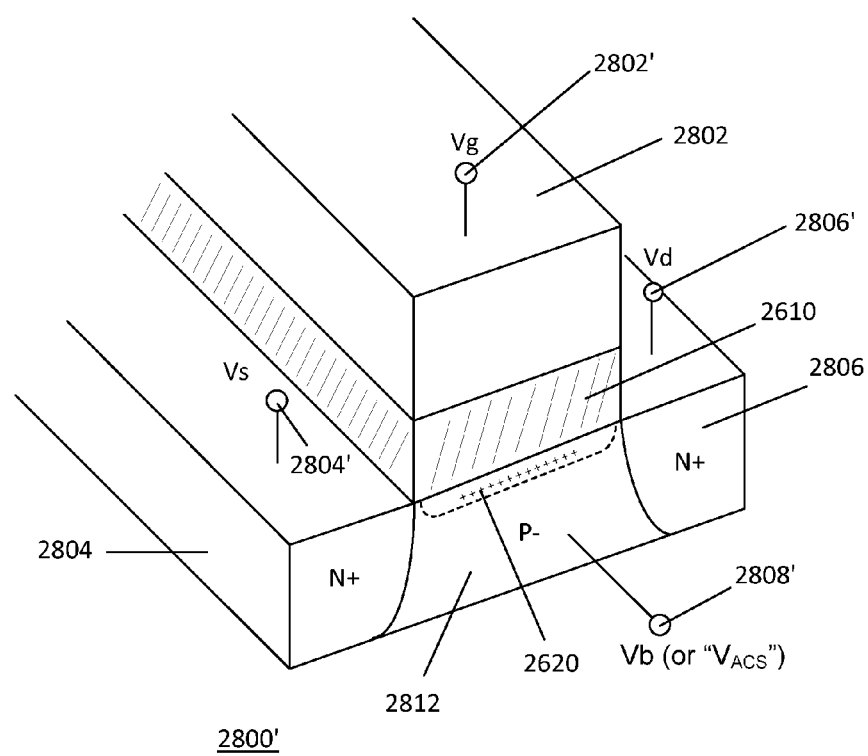
FIG. 28C is a cross-sectional perspective schematic of an SOI NMOSFET adapted to control accumulated charge showing gate, source, drain, and accumulated charge sink (ACS) terminals.

FIG. 28C is a cross-sectional perspective schematic of an ACC SOI NMOSFET (2800') adapted to control accumulated charge in accordance with the disclosed method and apparatus. In the example shown in FIG. 28C, the ACC NMOSFET (2800') includes four terminals that provide electrical connection to the various FET component regions. In one embodiment, the terminals provide means for connecting external integrated circuit (IC) elements (such as metal leads, not shown) to the various FET component regions. For example, as shown in FIG. 28C, the ACC NMOSFET (2800') includes a gate terminal (2802') that provides electrical connection to the gate (2802). Similarly, the ACC NMOSFET (2800') includes source and drain terminals (2804', 2806') that provide electrical connection to the source (2804) and drain (2806), respectively. As is well known in the electronic design arts, the terminals are coupled to their respective FET component regions (i.e., gate, drain, and source) via so-called "ohmic" (i.e., low resistance) contact regions. The manufacturing and structural details associated with the coupling of the various FET terminal to the FET component regions are well known in the art, and therefore are not described in more detail.

As described above with reference to FIGS. 28A and 28B, the ACC NMOSFET (2800') is adapted to control accumulated charge when the NMOSFET operates in the accumulated charge regime. To this end, in the exemplary implementation shown in FIG. 28C, the ACC NMOSFET (2800') includes a fourth terminal that provides electrical connection to the body (2812), and thereby facilitates reduction (or other control) of the accumulated charge when the FET (2800') operates in the accumulated charge regime. More specifically, and referring again to FIG. 28C, the ACC NMOSFET includes a "body" terminal, or Accumulated Charge Sink (ACS) terminal (2808'). The ACS terminal (2808') provides an electrical connection to the ACS (2808) (not shown in FIG. 28C, but shown in FIGS. 28A and 28B) and to the body (2812). Although the ACS terminal (2808') is shown in FIG. 28C as being physically coupled to the body (2812), those skilled in the electronic design arts shall understand that this depiction is for illustrative purposes only. The direct coupling of the ACS terminal (2808') to the body (2812) shown in FIG. 28C illustrates the electrical connectivity (i.e., not the physical coupling) of the terminal (2808') with the body (2812). Similarly, the other terminals (i.e., terminals (2802', 2804', and 2806')) are also shown in FIG. 28C as being physically coupled to their respective FET component regions. These depictions are also for illustrative purposes only.

In accordance with the disclosed method and apparatus, when the ACC NMOSFET (2800') is biased to operate in the accumulated charge regime (i.e., when the ACC NMOSFET (2800') is in the off-state, and there is an accumulated charge (2620) of P polarity (i.e., holes) present in the channel region of the body (2812)), the accumulated charge is removed or otherwise controlled via the ACS terminal (2808'). When accumulated charge (2620) is present in the body (2812), the charge (2620) can be removed or otherwise controlled by applying a bias voltage ($V_b$ (for "body") or $V_{ACS}$ (ACS bias voltage)) to the ACS terminal (2808'). In general, the ACS bias voltage $V_{ACS}$ applied to the ACS terminal (2808') may be selected to be equal to or more negative than the lesser of the source bias voltage Vs and drain bias voltage Vd. More specifically, in some embodiments, the ACS terminal (2808') can be coupled to various accumulated charge sinking mechanisms that remove (or "sink") the accumulated charge when the FET operates in the accumulated charge regime. Several exemplary accumulated charge sinking mechanisms and circuit configurations are possible.

Figure 29A:
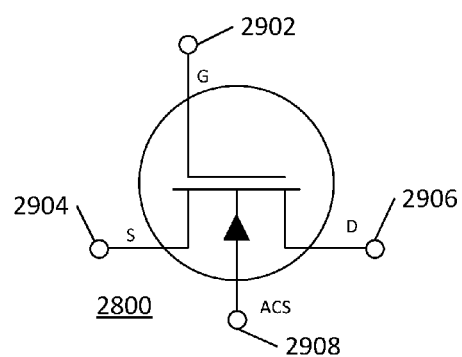
FIG. 29A is a simplified schematic of an SOI NMOSFET adapted to control accumulated charge embodied as a four terminal device.

The SOI NMOSFET (2800) of FIGS. 28A and 28B may be implemented as a four terminal device, as illustrated schematically in FIG. 29A. As shown in the ACC SOI NMOSFET (2800) of FIG. 29A, a gate terminal (2902) is electrically coupled to the gate contact (2801) (e.g., FIG. 28A) and is analogous to the gate terminal (2802') shown in FIG. 28C. The gate contact (2801) is electrically coupled to the gate (2802) (e.g., FIGS. 28A and 28C). Similarly, a source terminal (2904) is electrically coupled to the source (2804) (e.g., FIGS. 28A-28C) and is analogous to the source terminal (2804') of FIG. 28C. Similarly, a drain terminal (2906) is electrically coupled to the drain (2806) (e.g., FIGS. 28A-28C) and is analogous to the drain (2806') of FIG. 28C. Finally, the ACC NMOSFET (2800) includes an ACS terminal (2908) that is electrically coupled to the ACS (2808) (e.g., see FIGS. 28A-28B) via the region (2810). Those skilled in the electronic design and manufacturing arts shall understand that the region (2810) may be used in some embodiments to facilitate electrical coupling to the ACS (2808) because, in some embodiments, it may be difficult to make a direct contact to a lightly doped region (i.e., the ACS (2808)). The ACS terminal (2908) is analogous to the ACS terminal (2808') shown in FIG. 28C.

Figure 29B:
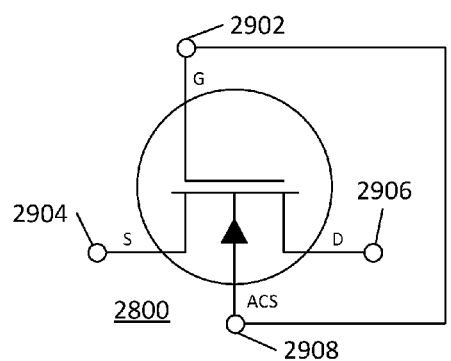
FIG. 29B is a simplified schematic of an SOI NMOSFET adapted to control accumulated charge, embodied as a four terminal device, where an accumulated charge sink (ACS) terminal is coupled to a gate terminal.

The ACC SOI NMOSFET (2800) of FIG. 29A may be operated using various techniques and implemented in various circuits in order to control accumulated charge present in the FET when it is operating in an accumulated charge regime. For example, in one exemplary embodiment as shown in FIG. 29B, the gate and ACS terminals (2902 and 2908, respectively) are electrically coupled together. In one embodiment of the simplified circuit shown in FIG. 29B, the source and drain bias voltages applied to the terminals (2904) and (2906), respectively, may be zero. If the gate bias voltage (Vg) applied to the gate terminal (2902) is sufficiently negative with respect to the source and drain bias voltages applied to the terminals (2904) and (2906), and with respect to the threshold voltage $V_{th}$, (e.g., if $V_{th}$ is approximately zero, and if Vg is more negative than approximately −1 V) the ACC NMOSFET (2800) operates in the accumulated charge regime. As described above with reference to FIG. 28C, for example, when the MOSFET operates in this regime, accumulated charge (holes) may accumulate in the body of the NMOSFET (2800).

The accumulated charge can be removed via the ACS terminal (2908) by connecting the ACS terminal (2908) to the gate terminal (2902) as shown. This configuration ensures that when the FET (2800) is in the off-state, it is held in the correct bias region to effectively remove or otherwise control the accumulated charge. As shown in FIG. 29B, connecting the ACS terminal (2908) to the gate ensures that the same bias voltages are applied to both the gate (Vg) and the body (shown in FIG. 28C as "Vb" or "$V_{ACS}$"). Because the bias voltage $V_{ACS}$ is the same as the gate voltage Vg in this embodiment, the accumulated charge is no longer trapped below the gate oxide (by attraction to the gate bias Vg) because it is conveyed to the gate terminal (2902) via the ACS terminal (2908). The accumulated charge is thereby removed from the body via the ACS terminal (2908).

Figure 29C:
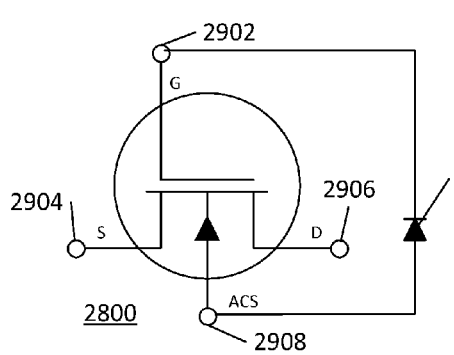
FIG. 29C is a simplified schematic of an SOI NMOSFET adapted to control accumulated charge, embodied as a four terminal device, where an accumulated charge sink (ACS) terminal is coupled to a gate terminal via a diode.

Another exemplary simplified circuit using the improved ACC SOI NMOSFET (2800) is shown in FIG. 29C. As shown in FIG. 29C, in this embodiment, the ACS terminal (2908) may be electrically coupled to a diode (2910), and the diode (2910) may, in turn, be coupled to the gate terminal (2902). This embodiment may be used to prevent a positive current flow into the MOSFET body (2812) caused by a positive Vg-to-Vs (or, equivalently, Vgs, where Vgs=Vg−Vs) bias voltage, as may occur, for example, when the SOI NMOSFET (2800) is biased into an on-state condition. With the exception of the diode (2910) used to prevent the flow of positive current into the ACS terminal (2908), exemplary operation of the simplified circuit shown in FIG. 29C is the same as the operation of the circuit as described above with reference to FIG. 29B.

In some exemplary embodiments, as described with reference to FIG. 28C, for example, Vs and Vd may comprise nonzero bias voltages. According to these examples, Vg must be sufficiently negative with respect to both Vs and Vd in order for Vg to be sufficiently negative to $V_{th}$ to turn the NMOSFET (2800) off (i.e., operate the NMOSFET (2800) in the off-state). When so biased, the NMOSFET (2800) may enter the accumulated charge regime and thereby have accumulated charge present in the body. For this example, the voltage $V_{ACS}$ may also be selected to be equal to Vg by connecting the ACS terminal (2908) to the gate terminal (2902), thereby conveying the accumulated charge from the body of the ACC NMOSFET.

In another embodiment, the ACC NMOSFET (2800) comprises a depletion mode device. In this embodiment, the threshold voltage $V_{th}$ is, by definition, less than zero. For Vs and Vd both at zero volts, when a gate bias Vg sufficiently negative to $V_{th}$ is applied to the gate terminal (2902) (for example, Vg more negative than approximately −1 V relative to $V_{th}$), holes may accumulate under the gate oxide and thereby comprise an accumulated charge. For this example, the voltage $V_{ACS}$ may also be selected to be equal to Vg by connecting the ACS terminal (2908) to the gate terminal (2902), thereby conveying the accumulated charge from the ACC NMOSFET as described above.

Figure 29D:
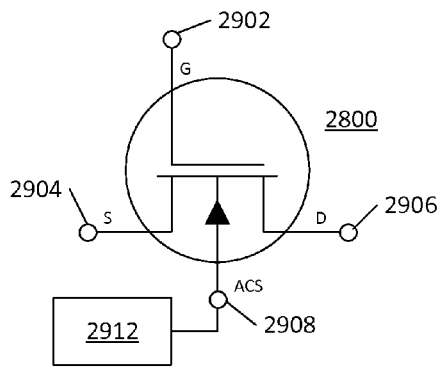
FIG. 29D is a simplified schematic of an SOI NMOSFET adapted to control accumulated charge, embodied as a four terminal device, where an accumulated charge sink (ACS) terminal is coupled to a control circuit.

In another embodiment, the ACS terminal (2908) may be coupled to a control circuit (2912) as illustrated in the simplified circuit of FIG. 29D. The control circuit (2912) may provide a selectable ACS bias voltage $V_{ACS}$ that selectively controls the accumulated charge (i.e., the accumulated charge (2620) described above with reference to FIG. 26). As shown in FIG. 29D, rather than having a local circuit provide the ACS bias voltage $V_{ACS}$ (e.g., as derived from the gate voltage Vg), in some implementations the ACS bias voltage $V_{ACS}$ is produced by a separate source that is independent of the ACC MOSFET device (2800). In the case of a switch, the ACS bias voltage $V_{ACS}$ should be driven from a source having a high output impedance. For example, such a high output impedance source can be obtained using a large series resistor in order to ensure that the RF voltage is divided across the MOSFET and that the ACS bias voltage $V_{ACS}$ has Vds/2 "riding" on it, similarly to the gate voltage.

It may be desirable to provide a negative ACS bias voltage $V_{ACS}$ to the ACS terminal (2908) when the SOI NMOSFET (2800) is biased into an accumulated charge regime. In this exemplary embodiment, a control circuit (2912) (as shown in FIG. 29D) may prevent positive current flow into the ACS terminal (2908) by selectively maintaining an ACS bias voltage $V_{ACS}$ that is consistently negative with respect to both the source and drain bias voltages. In particular, the control circuit (2912) may be used to apply an ACS bias voltage that is equal to or more negative than the lesser of Vs and Vd. By application of such an ACS bias voltage, the accumulated charge is thereby removed or otherwise controlled.

FIG. 30A shows a schematic diagram of an exemplary single pole, single throw (SPST) RF switch circuit (3000). The RF switch circuit (3000) is one example of a general class of well-known RF switch circuits. A switching SOI NMOSFET (3006) is adapted to receive an RF input signal "RFin" at an input terminal (3002). The switching SOI MOSFET (3006) is electrically coupled to selectively couple the RFin input signal to an output terminal (3004) (i.e., thereby convey an RF output signal RFout at the output terminal (3004)). In the exemplary embodiment, the switching SOI NMOSFET (3006) is controlled by a first control signal C1 that is conveyed by a control line (3012) through a gate resistor (3010) (optionally included for suppression of parasitic RF coupling). The control line (3012) is electrically coupled to a control circuit (3020), which generates the first control signal C1.

A shunting SOI NMOSFET (3008) is adapted to receive the RF input signal RFin at its drain terminal, and to selectively shunt the input signal RFin to ground via an optional load resistor (3018). The shunting SOI NMOSFET (3008) is controlled by a second control signal C1x which is conveyed by a control line (3016) through a gate resistor (3014) (optionally included for suppression of parasitic RF coupling and for purposes of voltage division). The control line (3016) is electrically coupled to the control circuit (3020), which generates the second control signal C1x.

Figure 30B:
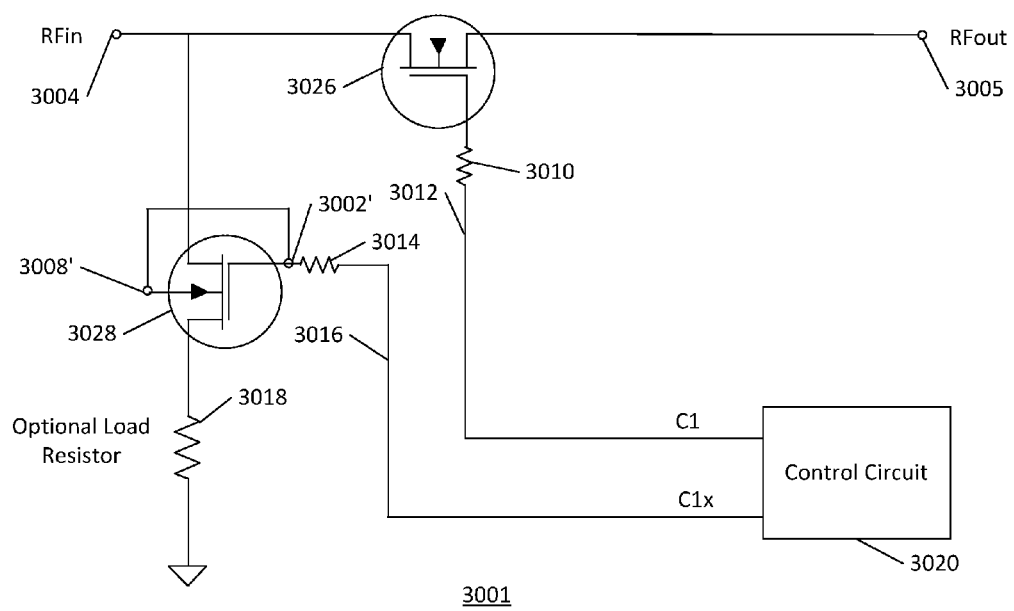
FIG. 30B is a schematic of an RF switch circuit adapted for improved performance using accumulated charge control, where the gate of a shunting SOI NMOSFET is coupled to an accumulated charge sink (ACS) terminal.

FIG. 30B is a schematic of an RF circuit (3001) adapted for higher performance using the accumulated charge reduction and control techniques. The switch circuit (3001) differs from the circuit (3000) of FIG. 30A in that the shunting NMOSFET (3008) is replaced by a shunting ACC NMOSFET described above with reference to FIGS. 29A and 29B. Similarly, the gate, source, drain, and ACC terminals of the shunting ACC NMOSFET (3028) are analogous to the respective terminals of the ACC NMOSFET (2800). With the exception of the improved switch performance afforded by the shunting ACC NMOSFET (3028), the operation of the RF switch circuit (3001) is very similar to the operation of the RF switch circuit (3000) of FIG. 30A.

Exemplary bias voltages for the switching NMOSFET (3026) and the shunting ACC NMOSFET (3028) may include: with $V_{th}$ approximately zero, Vg, for the on-state, of +2.5 V, and Vg, for the off-state, of −2.5 V. For these bias voltages, the SOI NMOSFETs may operate in an accumulated charge regime when placed into the off-state. However, when the switching NMOSFET (3026) is in the on-state and the shunting ACC NMOSFET (3028) is in the off-state, the output signal RFout at the output terminal (3005) will not be distorted by nonlinear behavior of the off-state capacitance $C_{off}$ of the improved shunting ACC NMOSFET (3028) due to the accumulated charge. When the shunting ACC NMOSFET (3028) operates in the accumulated charge regime, the accumulated charge is removed via the ACS terminal (3008'). More specifically, because the gate terminal (3002') of the shunting ACC NMOSFET (3028) is connected to the ACS terminal (3008'), the accumulated charge is removed or otherwise controlled as described above in reference to the simplified circuit of FIG. 29B. The control of the accumulated charge improves performance of the switch (3001) by improving the linearity of the off transistor, shunting ACC NMOSFET (3028), and thereby reducing the harmonic and intermodulation distortion of the RF output signal RFout generated at the output terminal (3005).

More details and examples of Accumulated Charge Control (ACC) SOI MOSFETs as well as circuits employing such ACC SOI MOSFETs are provided in the disclosures of U.S. Pat. Nos. 7,910,993 and 8,129,787 as well as pending U.S. patent application Ser. Nos. 13/277,108 and 13/412,529, each of which is incorporated herein by reference in its entirety. In many implementations, each ACC SOI MOSFET includes an Accumulated Charge Sink (ACS) coupled thereto which is used to remove accumulated charge from the ACC FET body when the FET operates in an accumulated charge regime. The ACS facilitates removal or otherwise controls the accumulated charge only when the ACC SOI MOSFET operates in the accumulated charge regime. Thus, a method and apparatus for use in improving linearity characteristics of MOSFET devices using the accumulated charge sink (ACS) is provided. Via the ACS terminal, the ACC SOI MOSFETs are adapted to remove, reduce, or otherwise control accumulated charge in SOI MOSFETs, thereby yielding improvements in FET performance characteristics. In one exemplary embodiment, a circuit having at least one SOI MOSFET is configured to operate in an accumulated charge regime. The ACS is operatively coupled to the body of the SOI MOSFET, and eliminates, removes, or otherwise controls accumulated charge when the FET is operated in the accumulated charge regime, thereby reducing the nonlinearity of the parasitic off-state source-to-drain capacitance of the SOI MOSFET. In RF switch circuits implemented with the improved SOI MOSFET devices, harmonic and intermodulation distortion is reduced by removing or otherwise controlling the accumulated charge when the SOI MOSFET operates in an accumulated charge regime.

According to several embodiments of the present disclosure, electronic circuits can comprise any combination of fixed elements and tunable elements, including, by way of example and not of limitation, fixed/tunable resistors, capacitors, and inductors. For example, tunable inductors comprising inductors that are switched in or out depending on a control signal or signals can be in series or in parallel with other elements (e.g., fixed and/or tunable inductors, capacitors, or resistors). As another example, a series circuit can comprise a tunable capacitor connected in series with a fixed inductor, where this series circuit is in turn connected in parallel with a fixed and/or tunable capacitor. Other combinations of elements are possible and can be made based on application. According to several embodiments of the present disclosure, switching devices such as accumulated charge control field effect transistors, microelectromechanical system (MEMS) switches, diodes, diode connected bipolar junction transistors (BJTs), and other switching devices identifiable by a person skilled in the art can be employed.

It should be noted that the various elements depicted in each of the drawings can be lumped or distributed elements. The various elements can also be on-chip or off-chip. For example, a tunable inductor, such as that shown in FIG. 6A, can have on-chip switches (615, 620, 625, 630, 635) that are connected in parallel to on-chip inductors (640, 645, 650, 655, 660). However, some or all of the inductors (640, 645, 650, 655, 660) can be off-chip inductors. For instance, smaller inductors can be placed on-chip while larger inductors can be placed off-chip or vice versa. In the case that all inductors are off-chip, the chip comprises a switch array. Other elements such as resistors and capacitors can also be on-chip or off-chip. The various embodiments can be used with flip chip die. For instance, passive elements (e.g., capacitors and inductors) can be off-chip while only switches are on-chip, where the term "chip" refers to the chip that is flipped over.

The examples set forth above are provided to give those of ordinary skill in the art a complete disclosure and description of how to make and use the embodiments of the methods and apparatuses for use in tuning reactance in a circuit device of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A tunable inductor, comprising:
 a first RF terminal;
 a second RF terminal;
 a plurality of inductive elements connected therebetween, wherein each inductive element is an inductor or a portion thereof;
 a plurality of switches coupled with the plurality of inductive elements, wherein each switch of the plurality of switches is configured to receive a control signal, and wherein the control signal controls inductance applied between the first RF terminal and the second RF terminal by turning on or off switches in the plurality of switches; and
 at least one bypass switch comprising a plurality of series connected switches, wherein the at least one bypass switch is connected to a bypass node within the tunable inductor via a first terminal of the at least one bypass switch and to the second RF terminal via a second terminal of the at least one bypass switch, the at least one bypass switch being configured to selectively exclude, via a first mode of operation of the at least one bypass switch, and to include, via a second mode of operation of the at least one bypass switch, at least two inductive elements of the plurality of inductive elements and corresponding connected switches of the plurality of the series connected switches in a conduction path between the first RF terminal and the second RF terminal,
 wherein at least one inductive element in the plurality of inductive elements is coupled with at least two switches from among the plurality of switches, the at least two switches being serially connected therebetween.

2. The tunable inductor of claim 1, wherein:
 each inductive element of the plurality of inductive elements is connected with at least one switch of the plurality of switches, and each switch of the at least one switch is configured, during operation, to receive the same control signal.

3. The tunable inductor according to claim 2, wherein the at least one switch comprise a plurality of serially connected switches.

4. The tunable inductor according to claim 1, wherein at least one inductive element in the plurality of inductive elements is connected in parallel with at least one switch in the plurality of switches.

5. The tunable inductor according to claim 1, wherein the plurality of inductive elements are serially connected therebetween.

6. The tunable inductor according to claim 1, wherein at least one inductive element in the plurality of inductive elements is serially connected with at least one switch in the plurality of switches.

7. The tunable inductor according to claim 1, wherein at least one inductive element in the plurality of inductive elements is connected in parallel with another inductive element in the plurality of inductive elements.

8. The tunable inductor according to claim 1, wherein each inductive element in the plurality of inductive elements is connected with at least two switches from among the plurality of switches, the at least two switches being serially connected therebetween.

9. The tunable inductor according to claim 1, wherein the plurality of inductive elements are connected in parallel or in series with each other.

10. The tunable inductor according to claim 1, the plurality of inductive elements comprising at least a first inductive element, a second inductive element, and a third inductive element, wherein inductance values of the first inductive element and the second inductive element differ by a first scaling factor and inductance values of the second inductive element and the third inductive element differ by a second scaling factor.

11. The tunable inductor according to claim 10, wherein the first scaling factor is equal to the second scaling factor.

12. The tunable inductor according to claim 1, wherein at least one switch in the plurality of switches is selected from the group consisting of a field effect transistor, an accumulated charge control field effect transistor, a microelectromechanical system (MEMS) switch, a diode, and a bipolar junction transistor.

13. The tunable inductor according to claim 1, wherein each inductive element in the plurality of inductive elements is either a lumped element or a distributed element.

14. The tunable inductor according to claim 1, wherein the plurality of switches is integrated onto a chip and each inductive element in the plurality of inductive elements is either integrated onto the chip or off-chip.

15. The tunable inductor according to claim 14, wherein the plurality of switches and each inductive element in the plurality of inductive elements is integrated onto the chip.

16. The tunable inductor according to claim 14, wherein the chip is a silicon-on-insulator chip.

17. The tunable inductor according to claim 14, wherein the chip is a silicon-on-sapphire chip.

18. A system for tuning reactance to generate a target signal, the system comprising:
the circuital arrangement according to claim 1, wherein the circuital arrangement is configured, during operation, to receive a first signal and generate a second signal; and
a controller configured, during operation, to provide a plurality of control signals to the circuital arrangement, wherein the plurality of control signals is a function of the second signal and the target signal.

19. A method for tuning reactance of a circuital arrangement to generate a target signal, the method comprising:
providing the circuital arrangement according to claim 1;
applying a first signal and a plurality of control signals to the circuital arrangement, wherein reactance of the circuital arrangement is a function of the plurality of control signals;
generating a second signal based on the applying; and
adjusting the plurality of control signals based on the second signal and the target signal.

20. The tunable inductor of claim 1, wherein the plurality of switches are field effect transistor (FET) switches.

21. A circuital arrangement with a tunable impedance, the circuital arrangement comprising:
a first RF terminal;
a second RF terminal;
a fixed reactance, wherein the fixed reactance comprises a fixed inductor or a portion thereof and/or a fixed capacitor;
a plurality of switches connected in parallel or series with the fixed reactance, wherein each switch in the plurality of switches is configured, during operation, to receive a control signal;
a plurality of individual reactances connected with the plurality of switches,
wherein at least one individual reactance is connected with at least two switches from among the plurality of switches, the at least two switches being serially connected therebetween; and
at least one bypass switch comprising a plurality of series connected switches, wherein the at least one bypass switch is connected to a first individual reactance of the plurality of individual reactances via a first terminal of the bypass switch and to a second individual reactance of the plurality of reactances via a second terminal of the bypass switch, the bypass switch being configured to selectively exclude and include, via a bypass control signal, a conduction path comprising the first and the second individual reactances in the circuital arrangement,
wherein:
whether impedance of a particular individual reactance among the plurality of individual reactances contributes to impedance of the circuital arrangement is based on a control signal received, during operation, by a particular switch in the plurality of switches that is connected with the particular individual reactance, the control signal associated with the particular switch turns on or off the particular switch.

22. The circuital arrangement according to claim 21, wherein:
each individual reactance in the plurality of individual reactances is connected with at least one switch in the plurality of switches, and
each switch in the at least one switch is configured, during operation, to receive the same control signal.

23. The circuital arrangement according to claim 22, wherein the at least one switch comprise a plurality of serially connected switches.

24. The circuital arrangement according to claim 21, wherein, when a switch connected with a particular individual reactance is turned on, impedance of the particular individual reactance contributes to impedance of the circuital arrangement.

25. The circuital arrangement according to claim 21, wherein, when a switch connected with a particular individual reactance is turned off, impedance of the particular individual reactance contributes to impedance of the circuital arrangement.

26. The circuital arrangement according to claim 21, further comprising a plurality of resistors connected with the plurality of switches.

27. The circuital arrangement according to claim 21, wherein each individual reactance in the plurality of individual reactances is connected with at least two switches from among the plurality of switches, the at least two switches being serially connected therebetween.

28. The circuital arrangement according to claim 21, wherein at least one switch in the plurality of switches is selected from the group consisting of a field effect transistor, an accumulated charge control field effect transistor, a microelectromechanical system (MEMS) switch, a diode, and a bipolar junction transistor.

29. The circuital arrangement according to claim 21, wherein the fixed reactance and each individual reactance in the plurality of individual reactances is either a lumped element or a distributed element.

30. The circuital arrangement according to claim 21, wherein:
the plurality of switches is integrated onto a chip, and
the fixed reactance and each individual reactance in the plurality of individual reactances is either integrated onto the chip or off-chip.

31. The circuital arrangement according to claim 30, wherein the plurality of switches, the fixed reactance, and each inductive reactance in the plurality of individual reactances are integrated onto the chip.

32. The circuital arrangement according to claim 30, wherein the chip is a silicon-on-insulator chip.

33. The circuital arrangement according to claim 30, wherein the chip is a silicon-on-sapphire chip.

34. A system for tuning impedance to generate a target signal, the system comprising:
the circuital arrangement according to claim 21, wherein the circuital arrangement is configured, during operation, to receive a first signal and generate a second signal; and
a controller configured, during operation, to provide a plurality of control signals to the circuital arrangement, wherein the plurality of control signals is a function of the second signal and the target signal.

35. A method for tuning impedance of a circuital arrangement to generate a target signal, the method comprising:

providing the circuital arrangement according to claim 21;

applying a first signal and a plurality of control signals to the circuital arrangement, wherein impedance of the circuital arrangement is a function of the plurality of control signals;

generating a second signal based on the applying; and adjusting the plurality of control signals based on the second signal and the target signal.

36. The circuital arrangement of claim 21, wherein the plurality of switches are field effect transistor (FET) switches.

37. A method for tuning inductance of a device, comprising:

providing a plurality of inductive elements connected therebetween, wherein each inductive element is an inductor or a portion thereof;

providing a plurality of switches connected with the plurality of inductive elements;

providing a bypass switch comprising a plurality of series connected switches, wherein the bypass switch is connected to a first inductive element of the plurality of inductive elements via a first terminal of the bypass switch and to a second inductive element of the plurality of inductive elements via a second terminal of the bypass switch, the bypass switch being configured to selectively exclude and include, via a bypass control signal, a conduction path comprising the first and the second inductive elements;

applying a plurality of control signals to the plurality of switches, wherein each control signal turns on or off one or more switches in the plurality of switches, thus tuning the inductance of the device, and based on the applying the plurality of control signals to the plurality of switches, applying the bypass control signal to the bypass switch;

wherein:

whether a particular inductive element in the plurality of inductive elements contributes to inductance of the device is based on a control signal received by a particular switch in the plurality of switches that is connected with the particular inductive element, and at least one inductive element in the plurality of inductive elements is connected with at least two switches from among the plurality of switches, the at least two switches being serially connected therebetween.

38. The method according to claim 37, wherein an inductive element in the plurality of inductive elements is connected with at least one switch in the plurality of switches, and wherein the applying comprises:

applying the same control signal to each switch in the at least one switch.

39. The method according to claim 38, wherein the at least one switch comprise a plurality of serially connected switches.

40. The method according to claim 37, wherein an inductive element contributes to inductance of the device when a switch connected with the inductive element is turned on.

41. The method according to claim 37, wherein an inductive element contributes to inductance of the device when a switch connected with the inductive element is turned off.

42. The method of claim 37, wherein the plurality of switches are field effect transistor (FET) switches.

43. A method for tuning impedance of a device, comprising:

providing a fixed reactance, wherein the fixed reactance comprises a fixed inductor or a portion thereof and/or a fixed capacitor;

providing a plurality of switches connected in parallel or series with the fixed reactance;

providing a plurality of individual reactances connected with the plurality of switches;

providing a bypass switch comprising a plurality of series connected switches, wherein the bypass switch is connected to a first individual reactance of the plurality of individual reactances via a first terminal of the bypass switch and to a second individual reactance of the plurality of individual reactances via a second terminal of the bypass switch, the bypass switch being configured to selectively exclude and include, via a bypass control signal, a conduction path comprising the first and the second individual reactances; and applying a plurality of control signals to the plurality of switches, wherein each control signal turns on or off one or more switches in the plurality of switches, thus tuning the impedance of the device, based on the applying the plurality of control signals to the plurality of switches, applying the bypass control signal to the bypass switch;

wherein:

whether impedance of a particular individual reactance among the plurality of individual reactances contributes to impedance of the device is based on a control signal received by a particular switch in the plurality of switches that is connected with the particular individual reactance, and at least one individual reactance is connected with at least two switches from among the plurality of switches, the at least two switches being serially connected therebetween.

44. The method according to claim 43, wherein an individual reactance in the plurality of individual reactances is connected with at least one switch in the plurality of switches, and wherein the applying comprises:

applying the same control signal to each switch in the at least one switch.

45. The method according to claim 43, wherein each switch in the at least one switch is serially connected therebetween.

46. The method of claim 43, wherein the plurality of switches are field effect transistor (FET) switches.

* * * * *